(12) United States Patent
Bertin et al.

(10) Patent No.: US 8,008,745 B2
(45) Date of Patent: *Aug. 30, 2011

(54) LATCH CIRCUITS AND OPERATION CIRCUITS HAVING SCALABLE NONVOLATILE NANOTUBE SWITCHES AS ELECTRONIC FUSE REPLACEMENT ELEMENTS

(75) Inventors: Claude L. Bertin, Venice, FL (US); Thomas Rueckes, Rockport, MA (US); Jonathan W. Ward, Fairfax, VA (US); Frank Guo, Danville, CA (US); Steven L. Konsek, Boston, MA (US); Mitchell Meinhold, Arlington, MA (US)

(73) Assignee: Nantero, Inc., Woburn, MA (US)

( * ) Notice: Subject to any disclaimer, the term of this patent is extended or adjusted under 35 U.S.C. 154(b) by 618 days.
This patent is subject to a terminal disclaimer.

(21) Appl. No.: 11/835,583

(22) Filed: Aug. 8, 2007

(65) Prior Publication Data

US 2008/0159042 A1 Jul. 3, 2008

Related U.S. Application Data

(63) Continuation-in-part of application No. 11/280,786, filed on Nov. 15, 2005, now Pat. No. 7,781,862, and a continuation-in-part of application No. 11/280,599, filed on Nov. 15, 2005, now Pat. No. 7,394,687, and a continuation-in-part of application No. 11/274,967, filed on Nov. 15, 2005, now Pat. No. 7,479,654.

(60) Provisional application No. 60/679,029, filed on May 9, 2005, provisional application No. 60/692,765, filed on Jun. 22, 2005, provisional application No. 60/692,918, filed on Jun. 22, 2005, provisional application No. 60/692,891, filed on Jun. 22, 2005, provisional application No. 60/836,437, filed on Aug. 8, 2006, provisional application No. 60/836,343, filed on Aug. 8, 2006, provisional application No. 60/840,586, filed on Aug. 28, 2006, provisional application No. 60/855,109, filed on Oct. 27, 2006, provisional application No. 60/918,388, filed on Mar. 16, 2007.

(51) Int. Cl.
*H01L 23/52* (2006.01)

(52) U.S. Cl. ............... 257/529; 257/209; 257/E23.147; 257/E23.149; 365/148; 977/943

(58) Field of Classification Search .............. 257/50, 257/209, 529–530, E23.147–E23.15, E21.592; 365/148, 154, 151; 977/724, 732–733, 943
See application file for complete search history.

(56) References Cited

U.S. PATENT DOCUMENTS 3,922,648 A 11/1975 Buckley
(Continued)

FOREIGN PATENT DOCUMENTS

GB 2 364 933 A 2/2002
(Continued)

OTHER PUBLICATIONS

Cui, J.B., et al. "Carbon Nanotube Memory Devices of High Charge Storage Stability." Appl. Phys. Lett., vol. 81, No. 17 (Oct. 21, 2002): pp. 3260-3262.*
(Continued)

*Primary Examiner* — Matthew W Such
(74) *Attorney, Agent, or Firm* — Wilmer Cutler Pickering Hale and Dorr LLP

(57) ABSTRACT

A non-volatile latch circuit is provided. The non-volatile latch circuit includes a nanotube switching element capable of switching between resistance states and non-volatilely retaining the resistance state. The non-volatile latch circuit includes a volatile latch circuit is capable of receiving and volatilely storing a logic state. When the nanotube switching element is a resistance state, the volatile latch circuit retains a corresponding logic state and outputs that corresponding logic state at an output terminal. A non-volatile register file configuration circuit for use with a plurality of non-volatile register files is also provided. The non-volatile register file configuration circuit includes a selection circuitry and a plurality of nanotube fuse elements, each in electrical communication with one of a plurality of non-volatile register files. The selection circuitry is capable of applying electrical stimulus to each of the selected nanotube fuse elements to selectively bypass the corresponding register file.

22 Claims, 45 Drawing Sheets

U.S. PATENT DOCUMENTS

| | | | |
|---|---|---|---|
| 5,005,158 | A | 4/1991 | McClure et al. |
| 5,345,110 | A | 9/1994 | Renfro et al. |
| 5,416,737 | A | 5/1995 | Lingstaedt et al. |
| 5,491,655 | A | 2/1996 | Hirose et al. |
| 5,768,196 | A | 6/1998 | Bloker et al. |
| 5,912,937 | A | 6/1999 | Goetting et al. |
| 5,956,282 | A | 9/1999 | Casper |
| 6,008,523 | A | 12/1999 | Narayan et al. |
| 6,128,214 | A | 10/2000 | Kuekes et al. |
| 6,256,767 | B1 | 7/2001 | Kuekes et al. |
| 6,259,644 | B1 | 7/2001 | Tran et al. |
| 6,314,019 | B1 | 11/2001 | Kuekes et al. |
| 6,385,075 | B1 | 5/2002 | Taussig et al. |
| 6,422,450 | B1 | 7/2002 | Zhou et al. |
| 6,423,583 | B1 | 7/2002 | Avouris et al. |
| 6,445,006 | B1 | 9/2002 | Brandes et al. |
| 6,493,272 | B1 | 12/2002 | Fujii et al. |
| 6,528,020 | B1 | 3/2003 | Dai et al. |
| 6,548,841 | B2 | 4/2003 | Frazier et al. |
| 6,570,802 | B2 | 5/2003 | Ohtsuka et al. |
| 6,570,806 | B2 | 5/2003 | Bertin et al. |
| 6,624,499 | B2 | 9/2003 | Kothandaraman et al. |
| 6,707,098 | B2 | 3/2004 | Hofmann et al. |
| 6,750,802 | B1 | 6/2004 | Olen |
| 6,759,693 | B2 | 7/2004 | Vogeli et al. |
| 6,803,840 | B2 | 10/2004 | Hunt et al. |
| 6,808,746 | B1 | 10/2004 | Dai et al. |
| 6,809,465 | B2 | 10/2004 | Jin |
| 6,831,856 | B2 | 12/2004 | Pashmakov |
| 6,888,773 | B2 | 5/2005 | Morimoto |
| 6,890,780 | B2 | 5/2005 | Lee |
| 6,899,945 | B2 | 5/2005 | Smalley et al. |
| 6,905,892 | B2 | 6/2005 | Esmark et al. |
| 6,918,284 | B2 * | 7/2005 | Snow et al. ............ 73/31.05 |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,990,009 | B2 | 1/2006 | Bertin et al. |
| 7,015,500 | B2 | 3/2006 | Choi et al. |
| 7,115,901 | B2 | 10/2006 | Bertin et al. |
| 7,115,960 | B2 | 10/2006 | Bertin |
| 7,161,403 | B2 | 1/2007 | Bertin |
| 7,781,862 | B2 * | 8/2010 | Bertin et al. .............. 257/529 |
| 2001/0010656 | A1 * | 8/2001 | Mattison ............... 365/240 |
| 2001/0023986 | A1 | 9/2001 | Mancevski |
| 2002/0027819 | A1 * | 3/2002 | Tomanek et al. ........ 365/215 |
| 2002/0175390 | A1 | 11/2002 | Goldstein et al. |
| 2003/0200521 | A1 | 10/2003 | DeHon et al. |
| 2004/0022085 | A1 | 2/2004 | Parkinson et al. |
| 2004/0031975 | A1 | 2/2004 | Kern et al. |
| 2004/0066669 | A1 * | 4/2004 | Ooishi ................... 365/173 |
| 2004/0132070 | A1 | 7/2004 | Star et al. |
| 2004/0266106 | A1 | 12/2004 | Lee |
| 2005/0056877 | A1 | 3/2005 | Rueckes et al. |
| 2005/0212014 | A1 | 9/2005 | Horibe et al. |
| 2006/0044878 | A1 | 3/2006 | Perner |
| 2006/0128071 | A1 * | 6/2006 | Rankin et al. ............ 438/131 |
| 2006/0215439 | A1 * | 9/2006 | Bill et al. ............... 365/148 |
| 2006/0237537 | A1 | 10/2006 | Empedocles et al. |
| 2006/0250843 | A1 | 11/2006 | Bertin et al. |
| 2006/0250856 | A1 | 11/2006 | Bertin et al. |
| 2006/0258122 | A1 | 11/2006 | Whitefield et al. |
| 2006/0264053 | A1 | 11/2006 | Yates |
| 2006/0281256 | A1 | 12/2006 | Carter et al. |
| 2006/0281287 | A1 | 12/2006 | Yates et al. |
| 2006/0292716 | A1 | 12/2006 | Gu et al. |
| 2008/0012047 | A1 | 1/2008 | Bertin |
| 2008/0142850 | A1 | 6/2008 | Bertin |
| 2008/0157126 | A1 | 7/2008 | Bertin |
| 2008/0159042 | A1 | 7/2008 | Bertin |

FOREIGN PATENT DOCUMENTS

| | | |
|---|---|---|
| WO | WO-00/48195 | 8/2000 |
| WO | WO-01/03208 A1 | 1/2001 |
| WO | WO-2005/041204 | 5/2005 |
| WO | WO-2006/122111 | 11/2006 |
| WO | WO-2007/001642 | 1/2007 |
| WO | WO-2008/021912 | 2/2008 |

OTHER PUBLICATIONS

Avouris, "Carbon nanotube electronics", *Chemical Physics*, vol. 281, pp. 429-445, 2002.

Bachtold, A. et al., "Logic Circuits with Carbon Nanotube Transistors", *Science*, Nov. 9, 2001, vol. 294, pp. 1317-1320.

Chen, J. et al., "Self-aligned carbon nanotube transistors with charge transfer doping", *Applied Physics Letters*, vol. 86, pp. 123108-1-123108-3, 2005.

Chen, J. et al., "Self-aligned Carbon Nanotube Transistors with Novel Chemical Doping", *IEDM*, pp. 29.4.1-29.4.4, 2004.

Collins, P. G. et al., "Engineering Carbon Nanotubes and Nanotube Circuits Using Electrical Breakdown", *Science*, vol. 292, pp. 706-709, Apr. 27, 2001.

Derycke, V. et al., "Controlling doping and carrier injection in carbon nanotube transistors", *Applied Physics Letters*, vol. 80, No. 15, pp. 2773-2775, Apr. 15, 2002.

Derycke, V., et al., "Carbon Nanotube Inter- and Intramolecular Logic Gates," *Nano Letters*, Sep. 2001, vol. 1, No. 9, pp. 453-456.

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistsors", *Physical Review Letters*, vol. 89, No. 10, pp. 16801-1-106801-4, 2002.

Hone, J., "Phonons and Thermal Properties of Carbon Nanotubes", *Carbon Nanotubes, Topics Appl. Phys.*, vol. 80, pp. 273-286, 2001.

Huang, Y., et al,, "Logic Gates and Computation from Assembled Nanowire Building Blocks," *Science*, Nov. 9, 2001, vol. 294, pp. 1313-1316.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", *Nature Materials*, vol. 1, pp. 241-246, Dec. 2002.

Javey, A., et al., "Carbon Nanotube Transistor Arrays for Multistage Complementary Logic and Ring Oscillators," *Nano Letters*, 2002, vol. 2 , No. 9, pp. 929-932.

Johnson, R. Colin, "IBM fellow unrolls blueprint for nano", *EETimes*, Mar. 6, 2006, 3 pages, http://www.eetimes.com/showArticle.jhtml?articleID=181500304.

Kong, J. et al., "Quantum Interference and Ballistic Transmission in Nanotube Electron Waveguides", *The American Physical Society*, vol. 87, No. 10, pp. 106801-1-106801-4, Sep. 3, 2001.

Lin, Y.M. et al., "Novel Carbon Nanotube FET Design with Tunable Polarity", *IEDM*, pp. 29.2.1-29.2.4, 2004.

Martel, R., et al, "Carbon Nanotube Field-Effect Transistors and Logic Circuits," *DAC 2002*, Jun. 10-12, 2002, vol. 7.4, pp. 94-98.

Onoa, G.B. et al., "Bulk production of singly dispersed carbon nanotubes with prescribed lengths," Nanotechnology, vol. 16, pp. 2799-2803, 2005.

Radosavljevic, M. et al., "Nonvolatile Molecular Memory Elements Based on Ambipolar Nanotube Field Effect Transistors", *Nano Letters*, vol. 2, No. 7, pp. 761-764, 2002.

Rueckes, T., et al., "Carbon Nantotube-Based Nonvolatile Random Access Memory for Molecular Computing," *Science*, Jul. 7, 2000, vol. 289, pp. 94-97.

Wind, S. J. et al., "Fabrication and Electrical Characterization of Top Gate Single-Wall Carbon Nanotube Field-Effect Transistors", Nov. 2002, 14 pages.

Wind, S. J. et al., "Vertical scaling of carbon nanotube field-effect transistors using top gate electrodes", *Applied Physics Letters*, vol. 80, No. 20, pp. 3817-3819, May 20, 2002.

Langer, L., et al., "Electrical Resistance of a Carbon Nanotube Bundle," J. Mater. Res., vol. 9, No. 4, Apr. 1994, 6 pages.

Pradhan, B. et al., "Electrial Bistability and Memory Phenomenon in Carbon Nanotube-Conjugated Polymer Matrixes," J. Phys. Chem. B., 2006, 110, 8274-8277.

Supplementary European Search Report for corresponding European Patent Application No. EP 07840800 mailed Jul. 1, 2009.

European Search Report for corresponding European Patent Application No. EP 09159276 mailed Jul. 17, 2009.

European Search Report for corresponding European Patent Application No. EP 09159271 mailed Jul. 3, 2009.

Fuhrer, M.S. et al., "High-Mobility Nanotube Transistor Memory," Nano Letters, 2002, vol. 2, No. 7, pp. 755-759.

Novak, J.P. et al., "Nerve agent detection using networks of single-walled carbon nanotubes," Applied Physics Letters, vol. 83, No. 19, Nov. 10, 2003, pp. 4026-4028.

Snow, E.S. et al., "Random networks of carbon nanotubes as an electronic material," Applied Physics Letters, vol. 82, No. 13, Mar. 31, 2003, pp. 2145-2147.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

Awano, Y., "Graphene for VLSI: FET and Interconnect Applications" IEDM 2009 Technical Digest, pp. 10.1.1-10.1.4.

Brown, K.M. "System in package "The Rebirth of SIP"," 2004 IEEE Custom Integrated Circuits Conference, May 2004.

Crowley, M. et al., "512 Mb PROM with 8 layers of antifuse/Diode cells," IEEE International Solid-State Circuits Conference, vol. XLVI, pp. 284-285, Feb. 2003.

Huai, Y. "Spin-Transfet Torque MRAM (STT-MTAM): Challenges and Prospects". AAPS Bulletin Dec. 2008, vol. 18, No. 6, pp. 33-40.

Jiang, Y. et al., "Performance Breakthrough in 8nm Gate-All-Around Length Gate-All-Around Nanowire Transistors using Metallic Nanowire Contacts" 2008 Symposium on VLSI Technology Digest of Technical Papers, pp. 34-35.

Kianian, S. et al., "A 3D Stackable Carbon Nanotube-based Nonvolatile Memory (NRAM)," ESSDERC, Jun. 14, 2010, Nantero, Inc.

Servalli, G. "A 45nm Generation Phase Change Memory Technology," IEDM 2009 Technical Digest, pp. 5.7.1-5.7.4.

Baker, R.J., CMOS: Circuit Design, Layout, and Silulation, IEEE Press, Series in Microelectronic Systems, 1998, pp. 226, 2 pages.

Baker, R.J., CMOS: Circuit Design, Layout, and Silulation, IEEE Press, Series in Microelectronic Systems, 1998, pp. 427-433, 8 pages.

Baker, R.J., CMOS: Circuit Design, Layout, and Silulation, IEEE Press, Series in Microelectronic Systems, 1998, pp. 579-595, 18 pages.

Baker, R.J., CMOS: Circuit Design, Layout, and Silulation, IEEE Press, Series in Microelectronic Systems, 1998, pp. 579-591, 14 pages.

Baker, R.J., CMOS: Circuit Design, Layout, and Silulation, IEEE Press, Series in Microelectronic Systems, 1998, pp. 607-608, 3 pages.

Bakoglu, H.B., "Circuits, Interconnections, and Packaging for VLSI," Addison-Wesley Publishing Company, Inc., 1990, pp. 152, 2 pages.

Bakoglu, H.B., "Circuits, Interconnections, and Packaging for VLSI," Addison-Wesley Publishing Company, Inc., 1990, pp. 338-349, 13 pages.

Bakoglu, H.B., "Circuits, Interconnections, and Packaging for VLSI," Addison-Wesley Publishing Company, Inc., 1990, pp. 171-178, 9 pages.

Itoh, K., "VLSI Memory Chip Design," Springer Series in Advanced Microelectronics, Springer-Verlag Berlin Heidelberg 2001, pp. 178-183, 7 pages.

Itoh, K., "VLSI Memory Chip Design," Springer Series in Advanced Microelectronics, Springer-Verlag Berlin Heidelberg 2001, pp. 358-3637 pages.

Itoh, K., "VLSI Memory Chip Design," Springer Series in Advanced Microelectronics, Springer-Verlag Berlin Heidelberg 2001, pp. 41-44, 5 pages.

International Search Report and Written Opinion of the International Searching Authority, The United States Patent and Trademark Office, for International Application No. PCT/US2007/075521, dated Apr. 1, 2008, 8 pages.

\* cited by examiner

| SK | TR1 | TR2 | C |
|---|---|---|---|
| HIGH VOLTAGE | ON | OFF | C = A |
| LOW VOLTAGE | OFF | ON | C = B |

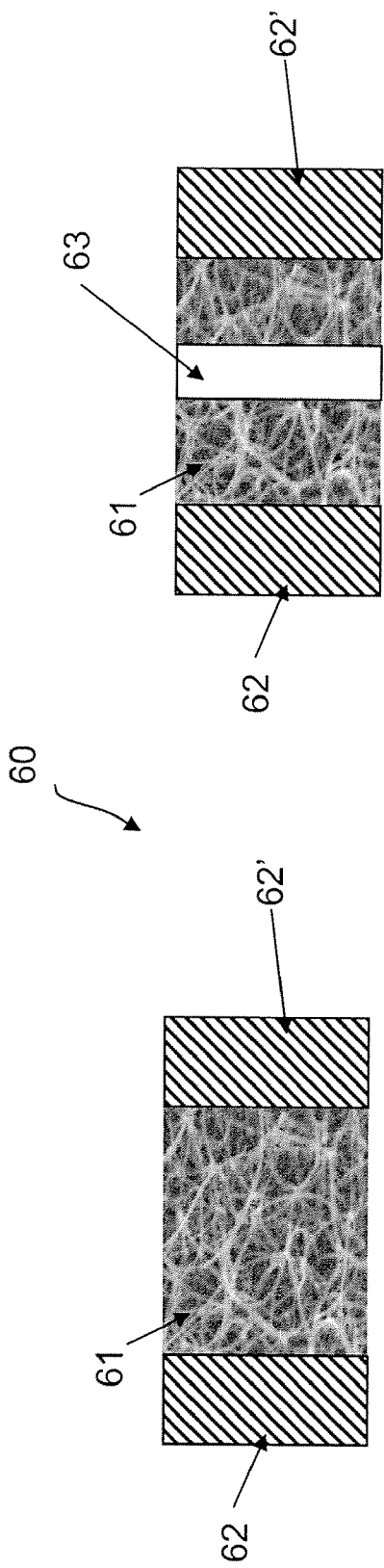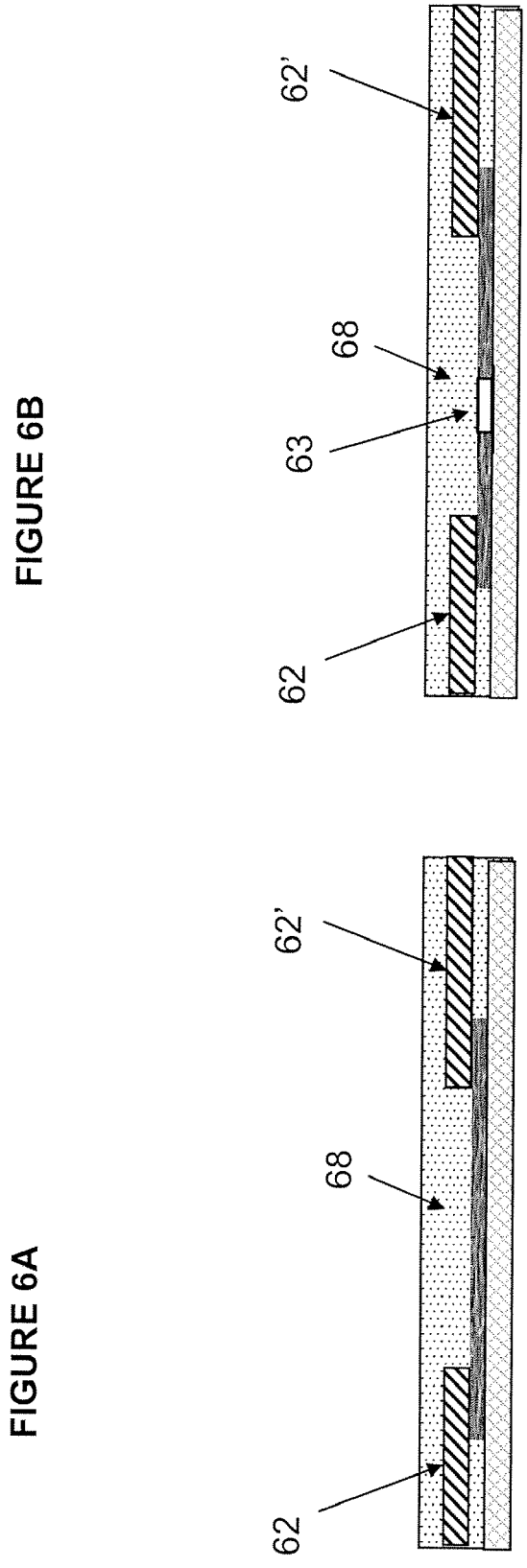

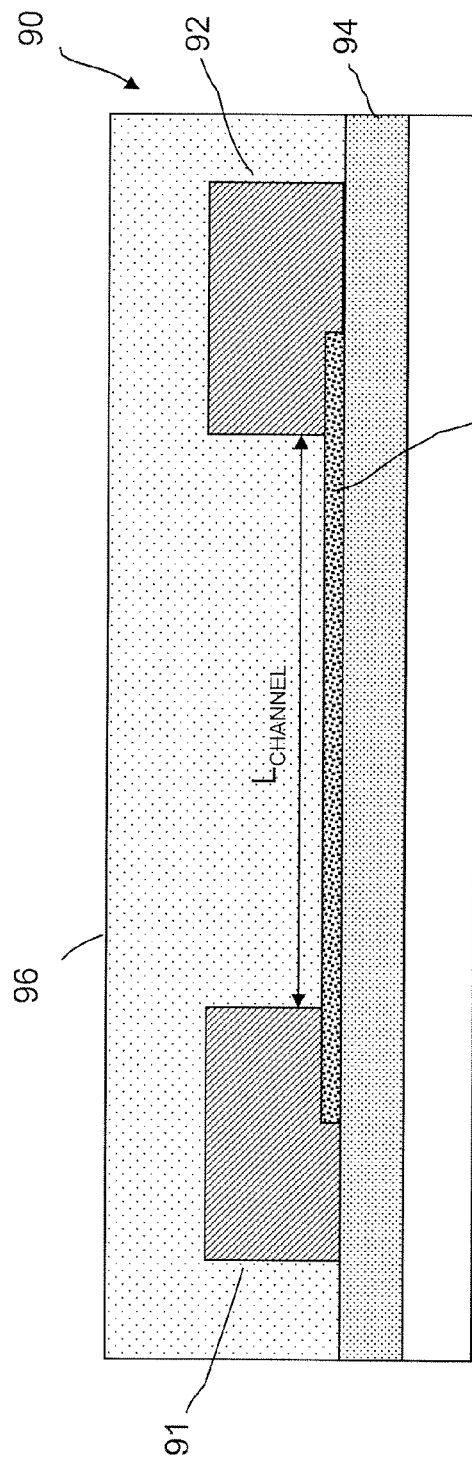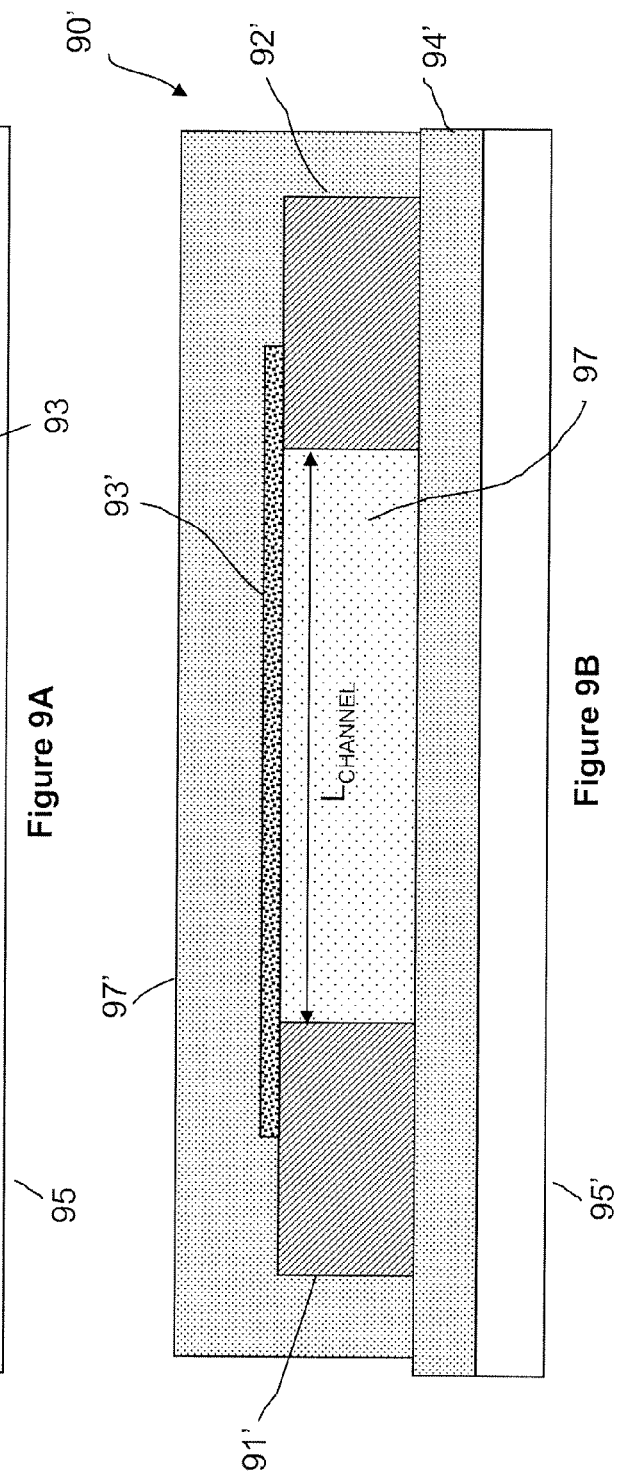
Figure 9A
Figure 9B

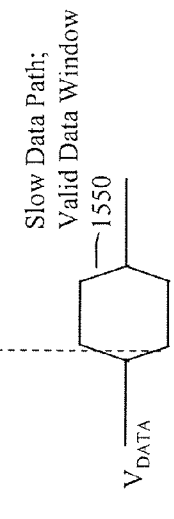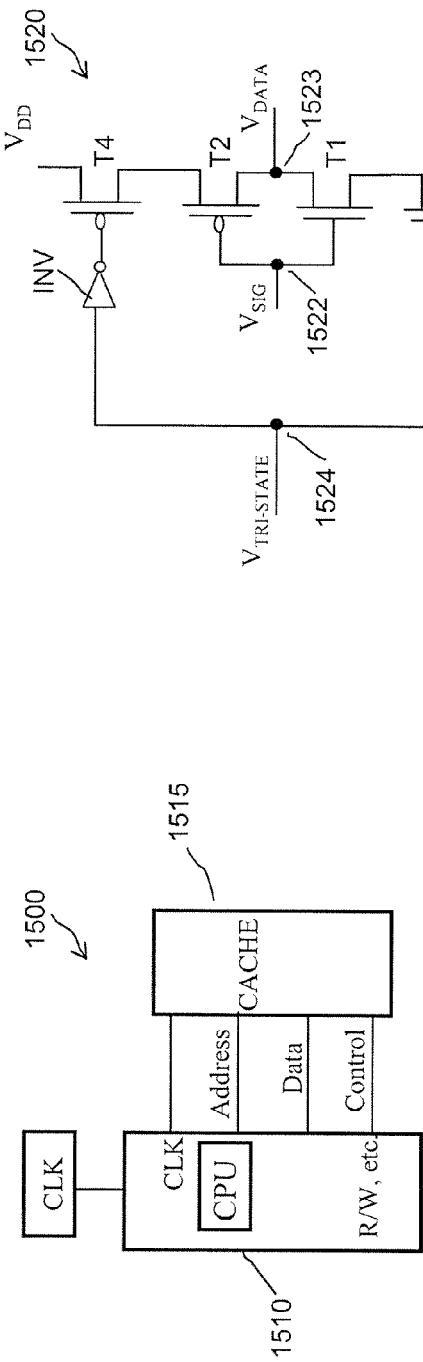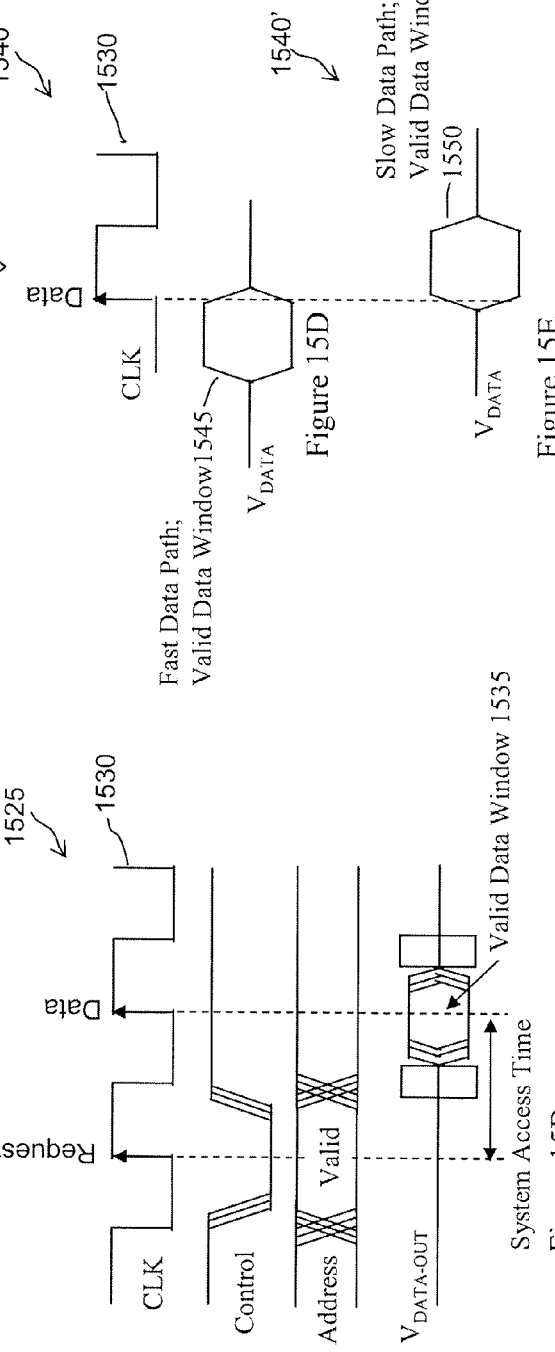
Figure 15C
Figure 15D
Figure 15E
Figure 15A
Figure 15B

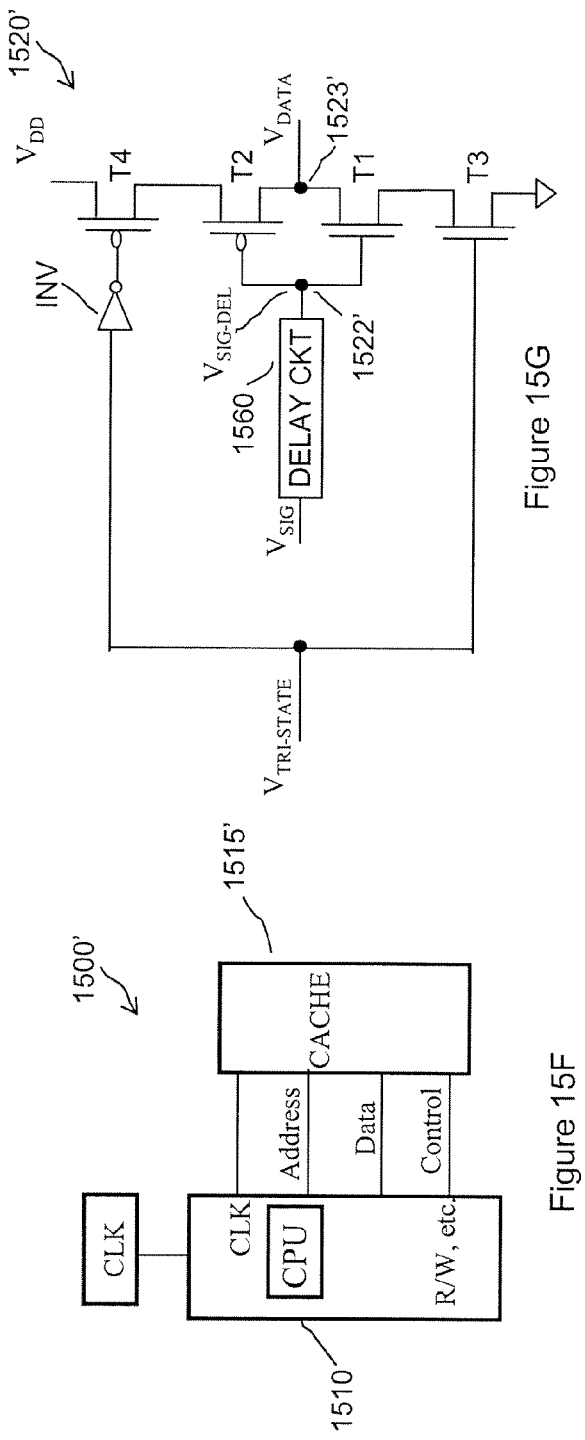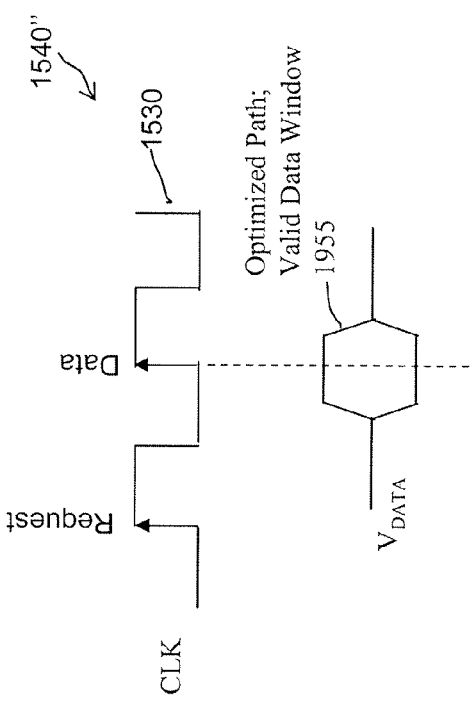
Figure 15G
Figure 15H
Figure 15F

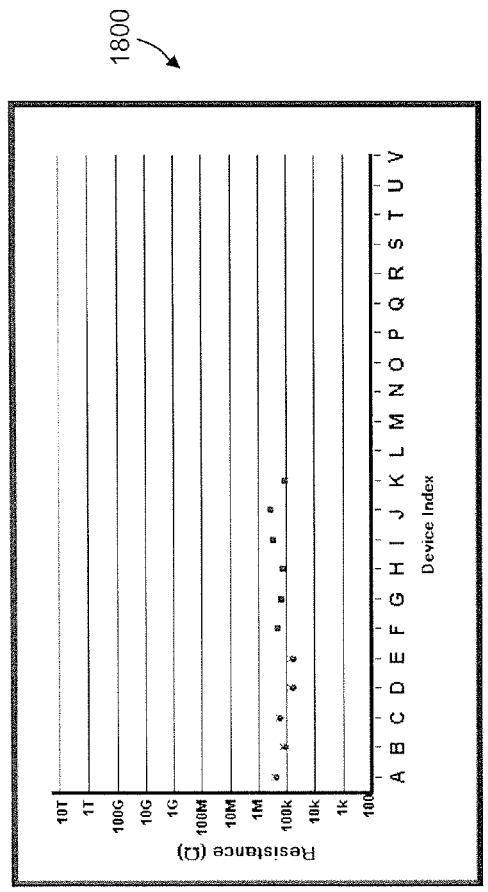
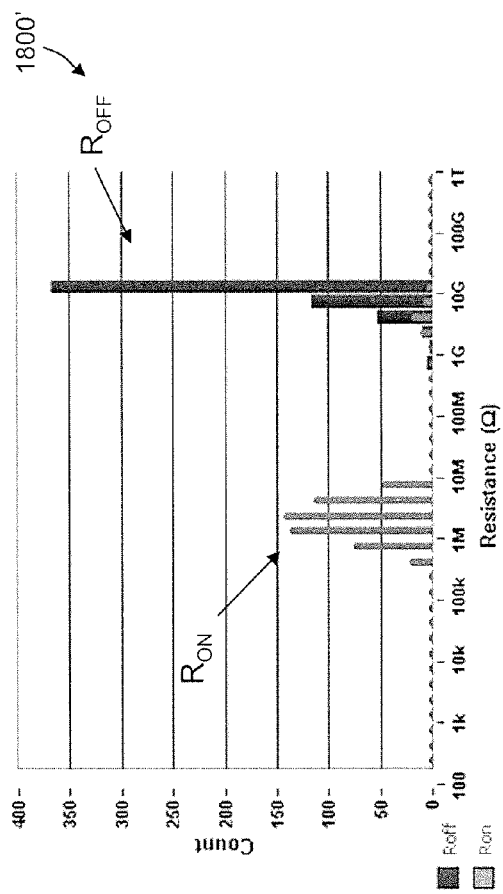
Figure 18A
Figure 18B

| $V_{WL0}$ (V) | Median $I_{READ}$ @ 1 Volt (uA) | Median Corresponding $I_{SAT}$ (uA) |
|---|---|---|
| 0.9 | 0.52 | 3.48 |
| 0.96 | 0.6 | 4.02 |
| 1.02 | 0.7 | 4.69 |
| 1.08 | 0.8 | 5.36 |
| 1.16 | 0.9 | 6.03 |
| 1.22 | 1.0 | 6.7 |
| 1.28 | 1.1 | 7.37 |
| 1.4 | 1.2 | 8.04 |

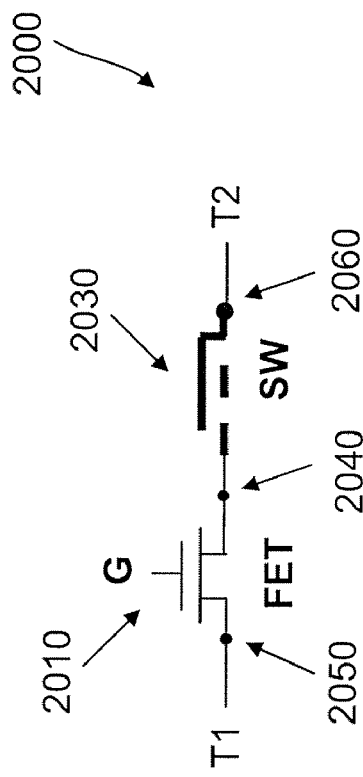
Figure 20
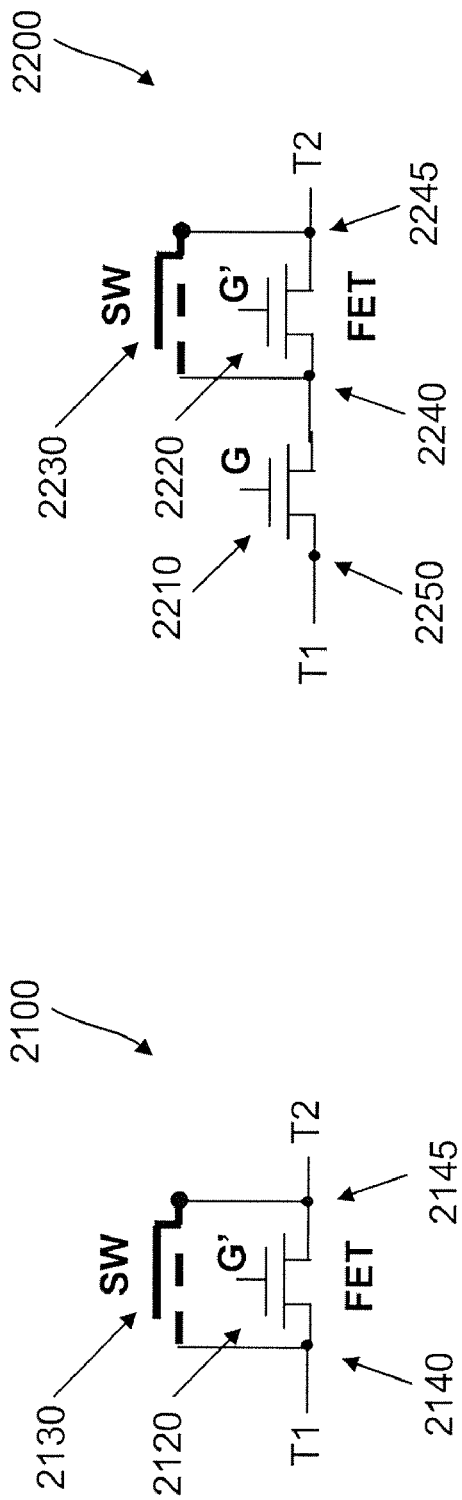
Figure 22
Figure 21

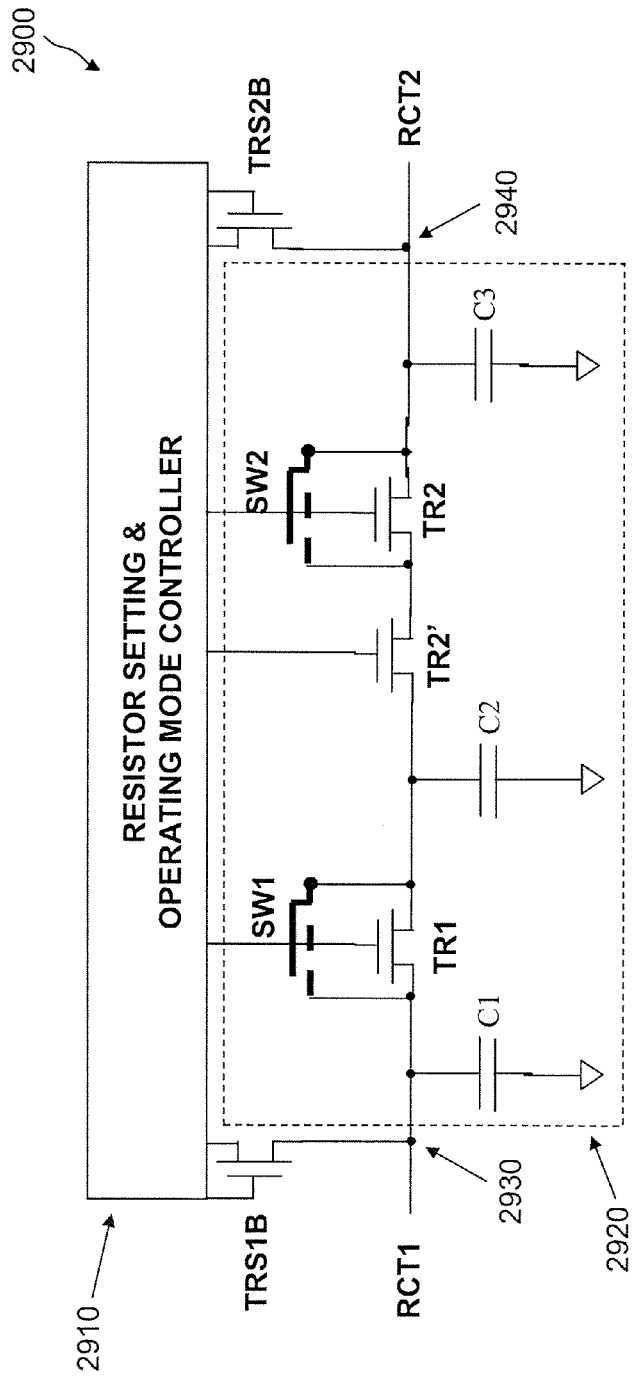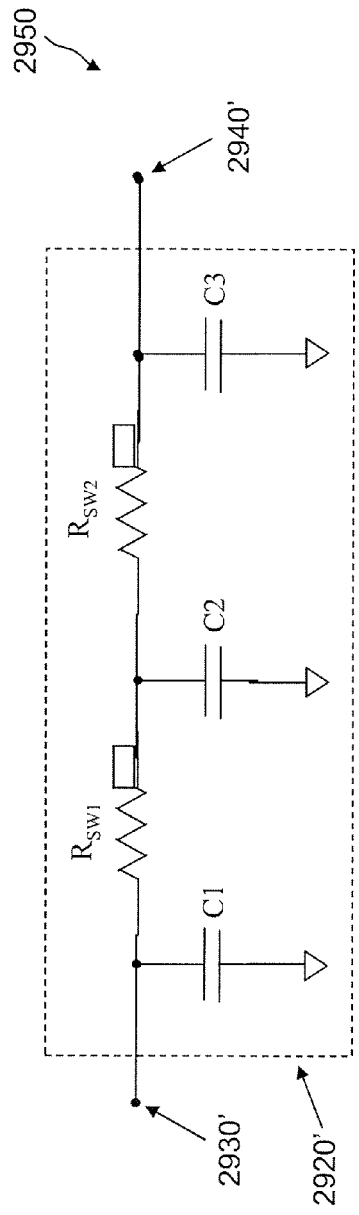
Figure 29A
Figure 29B

LATCH CIRCUITS AND OPERATION CIRCUITS HAVING SCALABLE NONVOLATILE NANOTUBE SWITCHES AS ELECTRONIC FUSE REPLACEMENT ELEMENTS

CROSS-REFERENCE TO RELATED APPLICATIONS

This application claims the benefit under 35 U.S.C. §119(e) of the following applications, the entire contents of which are incorporated herein by reference:

U.S. Provisional Patent Application No. 60/836,343, entitled "Scalable Nonvolatile Nanotube Switches as Electronic Fuse Replacement Elements," filed on Aug. 8, 2006;

U.S. Provisional Patent Application No. 60/836,437 entitled "Nonvolatile Nanotube Diode," filed on Aug. 8, 2006;

U.S. Provisional Patent Application No. 60/840,586 entitled "Nonvolatile Nanotube Diode," filed on Aug. 28, 2006;

U.S. Provisional Patent Application No. 60/855,109 entitled "Nonvolatile Nanotube Cubes," filed on Oct. 27, 2006; and U.S. Provisional Patent Application No. 60/918,388, entitled "Memory Elements and Cross Point Switches and Arrays of Same Using Nonvolatile Nanotube Blocks," filed on Mar. 16, 2007.

This application is a continuation-in-part of and claims priority under 35 U.S.C. §120 to the following applications, the entire contents of which are incorporated by reference:

U.S. patent application Ser. No. 11/280,786, entitled "Two-Terminal Nanotube Devices And Systems And Methods Of Making Same," filed Nov. 15, 2005;

U.S. patent application Ser. No. 11/274,967, entitled "Memory Arrays Using Nanotube Articles With Reprogrammable Resistance," filed Nov. 15, 2005; and U.S. patent application Ser. No. 11/280,599, entitled "Non-Volatile Shadow Latch Using A Nanotube Switch," filed Nov. 15, 2005.

This application is related to the following applications, the entire contents of which are incorporated by reference:

U.S. patent application Ser. No. 11/835,612, entitled "Nonvolatile Resistive Memories Having Scalable Two-terminal Nanotube Switches," filed concurrently herewith;

U.S. patent application Ser. No. 11/835,613, entitled "Memory Elements and Cross Point Switches and Arrays of Same Using Nonvolatile Nanotube Blocks," filed concurrently herewith;

U.S. patent application Ser. No. 11/835,651, entitled "Nonvolatile Nanotube Diodes and Nonvolatile Nanotube Blocks and Systems Using Same and Methods of Making Same," filed concurrently herewith;

U.S. patent application Ser. No. 11/835,759, entitled "Nonvolatile Nanotube Diodes and Nonvolatile Nanotube Blocks and Systems Using Same and Methods of Making Same," filed concurrently herewith;

U.S. patent application Ser. No. 11/835,845, entitled "Nonvolatile Nanotube Diodes and Nonvolatile Nanotube Blocks and Systems Using Same and Methods of Making Same," filed concurrently herewith;

U.S. patent application Ser. No. 11/835,852, entitled "Nonvolatile Nanotube Diodes and Nonvolatile Nanotube Blocks and Systems Using Same and Methods of Making Same," filed concurrently herewith;

U.S. patent application Ser. No. 11/835,856, entitled "Nonvolatile Nanotube Diodes and Nonvolatile Nanotube Blocks and Systems Using Same and Methods of Making Same," filed concurrently herewith; and U.S. patent application Ser. No. 11/835,865, entitled "Nonvolatile Nanotube Diodes and Nonvolatile Nanotube Blocks and Systems Using Same and Methods of Making Same," filed concurrently herewith.

BACKGROUND

Technical Field

The present application is generally related to the field of nanotube switching elements.

Scalable Nonvolatile Latch Circuits

The semiconductor industry uses fuses or antifuses for nonvolatile storage of a logic state. The nonvolatile resistive state of a fuse (or antifuse) in a conducting state or non-conducting state is used to indicate a first or second logical state. The latch circuit converts the fuse (or antifuse) nonvolatile resistive state into a corresponding electrical voltage level indicative of a logical 1 or 0.

In one type of fuse, sometimes referred to as a laser fuse, a fuse element is formed of metallic or polysilicon material. The fuse is programmed (blown, or made nonconducting) by laser ablation and a corresponding latch circuit reads the nonvolatile state of the fuse as described, for example, in U.S. Pat. No. 5,345,110, the entire contents of which are incorporated herein by reference.

The semiconductor industry has been replacing laser fuses with more flexible and denser electrically programmable fuse (e-fuse) elements, however, e-fuses typically require programming currents in the milli-Ampere range and are difficult to scale to smaller physical dimensions and lower programming current levels for new denser technology nodes such as 90 nm, 65 nm, 45 nm, and denser.

The semiconductor industry has also replaced laser fuses with more flexible and denser electrically programmable antifuse (a-fuse) elements. Antifuses reduce programming currents to the low micro-Ampere range such as 1-10 uA, for example, however, programming voltages are typically in the 8 to 12 volt range. Antifuses are difficult to scale to smaller physical dimensions and lower programming voltage levels for new denser technology nodes. Latches using fuses and antifuses are illustrated in Bertin et al., U.S. Pat. No. 6,570,806, the entire contents of which are incorporated herein by reference.

It would be desirable to provide a scalable element that may be used as a fuse, or as an antifuse, or as both fuse and antifuse, or an element able to toggle between fuse and antifuse multiple times, or more generally between ON and OFF states multiple times, and corresponding latch circuits that integrates easily with silicon technology, is scalable to smaller physical dimensions, programs using low current values in nano-Ampere or low micro-Ampere range, and is scalable to lower programming voltage of 5 volts and below.

In certain applications, it would be desirable to provide a scalable element that may be used to switch between ON and OFF states to select or deselect (bypass) register file stages in a series of register files. If such a scalable element is used as a fuse, a corresponding register file stage may be delected (bypassed) to eliminate a defective register file stage from a series.

In certain applications, it would also be desirable to provide a scalable element that may be used to switch between ON and OFF states to provide informational states in a memory cell. Further, in other applications, a scalable element that may be used to switch among multiple conductivity states to provide multiple informational states in a memory cell may be desirable. Integrating such elements with existing memory technology would be further desirable. Existing commercially available technologies are generally either nonvolatile, but not randomly accessible and have a low density, high production cost and a limited ability to allow multiple writes with high reliability of the circuit's function; or are volatile, and have complicated system design or have a low density. An ideal non-volatile memory, for at least some purposes, is one that enables the nonvolatile storage of multiple informational states where memory cells can be selectively activated and accurately programmed to an informational state.

SUMMARY OF THE INVENTION

The present invention provides scalable latch circuits, non-volatile memories and operation circuits based on nanofabric materials and scalable nonvolatile nanotube switches.

According to one aspect of the invention, a non-volatile latch circuit is provided. The non-volatile latch circuit includes an input terminal capable of inputting a logic state, an output terminal capable of outputting a logic state and a nanotube switching element having a nanotube fabric article disposed between and in electrical communication with two conductive contacts. The nanotube switching element is capable of switching between a relatively low resistance state and a relatively high resistance state and is capable of non-volatilely retaining the relatively low or the relatively high resistance state. The non-volatile latch circuit includes a volatile latch circuit having at least one semiconductive element electrically disposed between the input terminal and the nanotube switching element and is capable of receiving and volatilely storing a logic state inputted to the input terminal. When the nanotube switching element is in the relatively low resistance state, the volatile latch circuit retains a first logic state and outputs the first logic state at the output terminal. When the nanotube switching element is in the relatively high resistance state, the volatile latch circuit retains a second logic state outputted at the output terminal.

In one embodiment of the invention, the electronic latch circuit includes an inverter circuit comprising a plurality of field effect transistors.

In another embodiment of the invention, the nanotube switching element is capable of switching between the relatively low resistance state and the relatively high resistance state multiple times.

In another embodiment of the invention, the electronic latch circuit converts the relatively low resistance state of the nanotube switching element to a relatively high voltage level corresponding to the first logic state outputted at the output terminal. The electronic latch circuit converts the relatively high resistance state of the nanotube switching element to a relatively low voltage level corresponding to the second logic state outputted at the output terminal.

In another embodiment of the invention, the non-volatile latch circuit is in electrical communication with a memory cell. When the non-volatile latch circuit outputs the first logic state, the memory cell is active and when the non-volatile latch circuit outputs the second logic state, the memory cell is inactive.

In another embodiment of the invention, the non-volatile latch circuit comprises a redundancy circuit for the memory cell and is capable of bypassing the memory cell when the memory cell is inoperable.

In another embodiment of the invention, the non-volatile latch circuit is in electrical communication with a memory cell and is capable of storing first and second memory states. The first memory state is inputted to the input terminal as a first logic state and is non-volatilely retained and outputted by the non-volatile latch circuit as the first logic state. The second memory state is inputted to the input terminal as a second logic state and is non-volatilely retained and outputted by the non-volatile latch circuit as a second logic state.

In another embodiment of the invention, the non-volatile latch circuit comprises a redundancy circuit for the memory cell and is capable of non-volatilely retaining the first and the second logic state corresponding, respectively, to the first and the second memory state.

In another embodiment of the invention, the memory cell comprises a cell in an NRAM array.

In another embodiment of the invention, the non-volatile latch circuit retains one of the first and the second logic states to correct for an error in the memory cell.

In another embodiment of the invention, the non-volatile latch circuit is in electrical communication with a memory circuit. The electrical stimulus inputted at the input terminal includes a time-varying electrical stimulus. The electrical stimulus outputted at the output terminal includes a time-varying electrical stimulus. The non-volatile latch circuit controls operation of the memory circuit by creating a controllable delay between the time-varying electrical stimulus at the input terminal and at the output terminal.

In another embodiment of the invention, the non-volatile latch circuit creates a controllable delay that includes a substantially bi-modal signal with a substantially selected rise time and a substantially selected fall time.

In another embodiment of the invention, the nanotube switching element comprises a one-time programmable fuse capable of switching from only the relatively low resistance state to the relatively high resistance state.

According to another aspect of the invention, a non-volatile register file configuration circuit for use with a plurality of non-volatile register files is provided. The non-volatile register file configuration circuit includes an input voltage terminal, a selection circuitry and a plurality of nanotube fuse elements in electrical communication with the input voltage terminal. Each nanotube fuse element is in electrical communication with one of the plurality of non-volatile register files and with the selection circuitry. Each of the nanotube fuse elements includes a nanotube fabric article and two conductive contacts, the nanotube fabric article disposed between and in electrical communication with the two conductive contacts. The nanotube fuse element is capable of switching from an on state to an off state, the on state corresponding to a relatively low resistance between the first and second terminals and the off state corresponding to a relatively low resistance between the two conductive contacts in response to electrical stimulus. When the nanotube fuse element is in the on state, the corresponding non-volatile register file is active and responsive to electrical stimulus at the input voltage terminal. When the nanotube fuse element is in the off state, the corresponding non-volatile register file is inactive and not responsive to electrical stimulus at the input voltage terminal. The selection circuitry is capable of applying electrical stimulus to each of the selected nanotube fuse elements to selectively bypass the corresponding register file.

In another embodiment of the invention, the selection circuit selectively bypasses one of the plurality of register files in response to the register file being defective.

In another embodiment of the invention, when one of the plurality of nanotube fuse elements is in the on state, the corresponding non-volatile register file is capable of operating with a plurality of informational states in response to electrical stimuli at the input voltage terminal.

In another embodiment of the invention, the nanotube fuse element is one-time programmable.

According to another aspect of the invention, a non-volatile memory includes a bit line, a word line, and at least one non-volatile memory cell. Each memory cell has a two-terminal nanotube switching device comprising first and second conductive terminals and a nanotube fabric article disposed between and in electrical communication with the first and second conductive terminals. Each memory cell also has a cell selection circuit in electrical communication with the bit line and the word line to select the two-terminal nanotube switching device for read and write operations in response to activation of at least one of the bit line and the word line. The non-volatile memory includes write control circuitry, responsive to a control signal, for supplying write signals to a selected memory cell to induce a change in the resistance of the nanotube fabric article so that the value of the resistance of the nanotube fabric article corresponds to an informational state of the memory cell. The non-volatile memory includes resistance sensing circuitry in communication with a selected nonvolatile memory cell, for sensing the resistance of the nanotube fabric article and providing the control signal to the write control circuitry. And, the non-volatile memory includes read circuitry in communication with a selected nonvolatile memory cell for reading the corresponding informational state of the memory cell.

In another embodiment of the invention, the first conductive terminal of the nanotube switching device is in electrical communication with the cell selection circuit and the second conductive terminal of the nanotube switching device is in electrical communication with a reference voltage line.

In another embodiment of the invention, the write control circuitry is in electrical communication with the bit line and the word line.

In another embodiment of the invention, the first conductive terminal of the nanotube switching device receives the write signals supplied by the write control circuitry and the second conductive terminal of the nanotube switching device is in electrical communication with at least one of the word line and the bit line.

In another embodiment of the invention, supplying write signals comprises supplying an electrical stimulus having a selected voltage.

In another embodiment of the invention, supplying write signals comprises supplying an electrical stimulus having a selected current.

In another embodiment of the invention, the nanotube switching element further comprises first and second insulator regions disposed on substantially opposite sides of the nanotube fabric article.

In another embodiment of the invention, at least one of the first and second insulator regions includes a dielectric material.

In another embodiment of the invention, at least a portion of the nanotube fabric article is separated from at least a portion of one of the first and second insulator regions by a gap.

In another embodiment of the invention, the informational state of the memory cell is capable of being programmed and erased multiple times.

In another embodiment of the invention, write control circuitry includes circuitry for writing at least three write signals, each of the at least three write signals being a signal capable of inducing a corresponding resistance value in the nanotube fabric article that is different than the resistance values corresponding to the other write signals.

In another embodiment of the invention, the corresponding resistance values induced by the at least three write signals include multiple low resistance values and one high resistance value.

In another embodiment of the invention, the multiple low resistance values each are in the range of approximately one kilo-Ohm to approximately one mega-Ohm and wherein the high resistance value is at least one-hundred mega-Ohms.

In another embodiment of the invention, the write control circuitry includes circuitry for writing four write signals so that the memory cell is capable of storing one of a first informational state, a second informational state, a third informational state, and a fourth informational state.

In another embodiment of the invention, the resistance sensing circuitry comprises feedback circuitry in electrical communication with the selected non-volatile memory cell and with a reference resistance value, the feedback circuitry capable of comparing the resistance of the nanotube fabric article of the selected non-volatile memory cell to the reference resistance value and selectively blocking write signals to the selected non-volatile memory cell.

In another embodiment of the invention, the value of the resistance of the nanotube fabric article is selected from one of a relatively low resistance value and a relatively high resistance value.

In another embodiment of the invention, the relatively low resistance value corresponds to a first informational state and the relatively high resistance value corresponds to a second informational state.

In another embodiment of the invention, supplying write signals comprises supplying a plurality of sequential, incrementally varying voltage pulses at selected intervals.

In another embodiment of the invention, the feedback circuitry senses the resistance of the nanotube fabric article and compares the resistance of the nanotube fabric article to the reference resistance value after each voltage pulse is supplied by the write control circuitry.

In another embodiment of the invention, the non-volatile memory is capable of a first write operation in which the voltage pulses are applied until the feedback circuitry senses a relatively low resistance value as the resistance of the nanotube fabric article and selectively blocks write signals.

In another embodiment of the invention, the non-volatile memory is capable of a second write operation in which the voltage pulses are applied until the feedback circuitry senses a relatively high resistance value as the resistance of the nanotube fabric article and selectively blocks write signals.

In another embodiment of the invention, the nanotube switching element comprises a one-time programmable nanotube fuse, the nanotube fabric article capable of only switching from the relatively low resistance value to the relatively high resistance value.

In another embodiment of the invention, the write control circuitry selects the reference resistance value from a range of resistance values.

In another embodiment of the invention, the feedback circuitry selectively blocks write signals on the bit line to the nanotube switching device of the selected nonvolatile memory cell when the resistance value of the nanotube switching article is approximately equal to the reference resistance value.

In another embodiment of the invention, the read circuitry includes a sense amplifier circuit and the resistance sensing circuitry is in electrical communication with the sense amplifier circuit and the resistance sensing circuitry is responsive to the sense amplifier circuit to provide the control signal to the write control circuitry to selectively stop the write control circuitry from supplying write signals to the selected nonvolatile memory cell.

In another embodiment of the invention, the control signal provided by the sense amplifier circuitry to the resistance sensing circuitry selectively stops the write control circuitry from inducing a change in the resistance of the nanotube fabric article.

In another embodiment of the invention, the value of the resistance of the nanotube fabric article is selected from one of a plurality of resistance values including multiple low resistance values and a relatively high resistance value.

In another embodiment of the invention, supplying write signals includes supplying a plurality of sequential, incrementally varying voltage pulses at selected intervals.

In another embodiment of the invention, the sense amplifier circuit detects the resistance value of the nanotube fabric article after each voltage pulse is supplied by the write control circuitry.

In another embodiment of the invention, the non-volatile memory is capable of a first write operation wherein the voltage pulses are supplied to the selected non-volatile memory cell until at least one of the multiple low resistance values is detected by the sense amplifier circuit.

In another embodiment of the invention, when the sense amplifier circuit detects at least one of the multiple low resistance values in the selected memory cell, the resistance sensing circuitry is responsive to the sense amplifier circuit to selectively stop the write control circuitry from writing the informational state of the selected memory cell.

In another embodiment of the invention, the non-volatile memory is capable of a second write operation wherein the voltage pulses are supplied to the selected non-volatile memory cell until the relatively high resistance value is detected.

In another embodiment of the invention, when the sense amplifier circuit detects the relatively high resistance value in the selected non-volatile memory cell, the resistance sensing circuitry is responsive to the sense amplifier circuit to selectively stop the write control circuitry from writing the informational state of the selected memory cell.

In another embodiment of the invention, the nanotube switching element comprises a one-time programmable nanotube fuse having a nanotube fabric article capable of only switching from a first resistance value to a second resistance value.

BRIEF DESCRIPTION OF THE DRAWINGS

In the drawings:

FIGS. 6A-6D are illustrations of patterned nanofabric resistors, according to other embodiments of the invention.

FIGS. 9A-D are illustrations of cross sections and a SEM planar view of a nonvolatile nanotube switch, according to other embodiments of the invention.

FIGS. 15A-E illustrate a example of critical synchronized timing between a CPU and cache, according to other embodiments of the invention.

FIGS. 15F-H illustrate optimized timing between a CPU and cache using a controllable delay circuit, according to other embodiments of the invention.

FIG. 18A illustrates ON resistance values of as-fabricated nonvolatile nanotube switches, according to another embodiment of the invention.

FIG. 18B illustrates ON and OFF resistance values of nonvolatile nanotube switches after fifty cycles, according to another embodiment of the invention;

FIG. 19D illustrates an example of median current levels and corresponding saturation current levels at selected voltage levels, according to the present embodiment of the invention.

FIG. 20 illustrates a series circuit, according to an embodiment of the invention.

FIG. 21 illustrates a parallel circuit, according to another embodiment of the invention.

FIG. 22 illustrates a combined series/parallel circuit, according to another embodiment of the invention.

FIG. 29A illustrates an electronically formed and tuned resistance/capacitor network, according to another embodiment of the invention.

FIG. 29B illustrates a combined series/parallel resistor/capacitor equivalent circuit, according to another embodiment of the invention.

DETAILED DESCRIPTION

Nonvolatile Register File

The present invention provides scalable latch circuits and memory cells based on nanofablic material and scalable nonvolatile nanotube switches.

The present invention also provides nonvolatile register files, and more specifically nonvolatile register files formed by selecting a smaller subset of individual nonvolatile register file stages from a larger set that includes redundant stages for yield enhancement purposes.

The present invention also provides high speed asynchronous logic and synchronous logic and memory circuits in which clock timing and signal timing is improved using new scalable latch circuits based on nanofabric material and scalable nonvolatile nanotube switches for higher performance at higher yield.

It is often desirable for fuse latch circuits to be able to store a logic state indicative of the logical state of a corresponding fuse (or antifuse) so that when the latch is connected to other circuits, it may provide programming information for other electronic circuits such as address relocation for redundant memory elements, operating mode configuration, to store a tracking code pertaining to manufacture date or other conditions, for example. One such latch application is in the field of yield enhancement for nonvolatile register files.

Figure 1A:
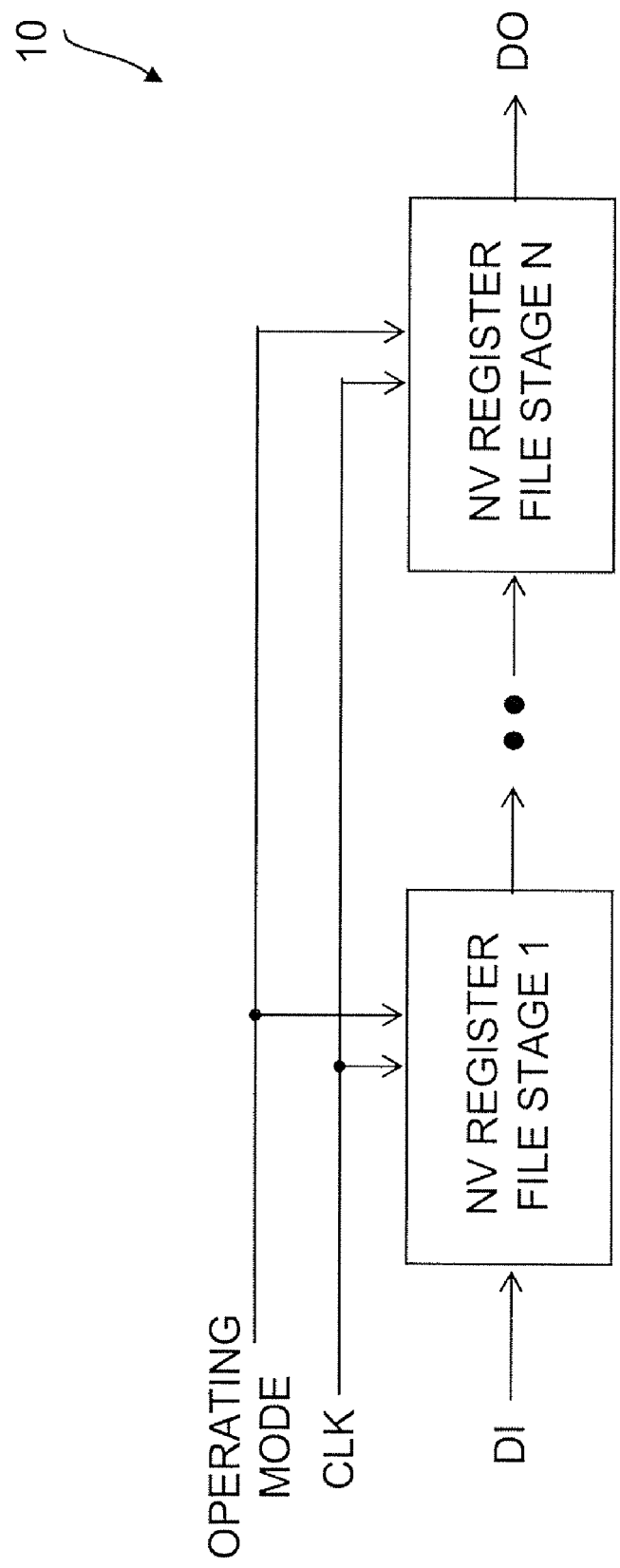
FIG. 1A is an illustration of an embodiment of a nonvolatile register file schematic.

FIG. 1A illustrates a serial nonvolatile register file 10 of N stages, having N repeated and essentially the same individual nonvolatile stages beginning with stage 1 and ending with stage N. Nonvolatile register files are described in more detail in U.S. patent application Ser. No. 11/280,599.

Data inputs DI is supplied to the input of NV register file stage 1. The data output of stage 1 drives the data input of NV register file stage 2, and so on, until the output of NV register file stage N−1 drives the input of NV register file stage N. The output of NV register file stage N provides data output DO.

Nonvolatile register file 10 operates in a synchronous mode with clock CLK supplied to each stage of the register file 10. Each stage of nonvolatile register file 10 includes a volatile master latch that drives a nonvolatile slave latch, in which the nonvolatile slave latch includes a volatile latch and a corresponding coupled nonvolatile nanotube switch for storing the latch logic state in a nonvolatile mode when power is removed or lost. The logical state at the time power is removed or lost is restored prior to resuming register file 10 operation. Register file 10 operates in a normal volatile mode at full speed and at voltage levels $V_{DD}$ corresponding to the selected technology node. $V_{DD}$ may be 1.5 to 2.5 volts, for example. Clock frequencies may be in 1 to 10 GHz range or more, for example.

If a portion of the chip including nonvolatile register file 10 is to be de-powered (power supply is removed or lost), then data (the logic state) from the volatile portion of each stage of nonvolatile register file 10 may be transferred to a nonvolatile nanotube switch as described in U.S. patent application Ser. No. 11/280,599. Clock CLK is stopped, then operating mode pulses are used to save the state of each latch in a corresponding nonvolatile nanotube switch just prior to power shutdown. Next, power may be removed from nonvolatile register file 10 and associated logic and memory circuits.

If normal register file 10 operation is to be restored, then the portion of the chip that has been de-powered, or the entire chip if all power is removed or lost, is then re-powered. Next, operating mode pulses may be used to transfer data (logic state) of each nonvolatile nanotube switch to its corresponding nonvolatile register file stage of nonvolatile register file 10 as described in U.S. patent application Ser. No. 11/280,599. Next, clock CLK is started and high speed operation begins. Program modes such as erase, program, and read are described in patent application Ser. No. 11/280,599. Nonvolatile nanotube switch fabrication, integration into semiconductor processes, electrical characteristics, and operating modes and operating conditions are described in U.S. patent application Ser. No. 11/280,786.

Nonvolatile Register File Stage Circuit

Figure 1B:
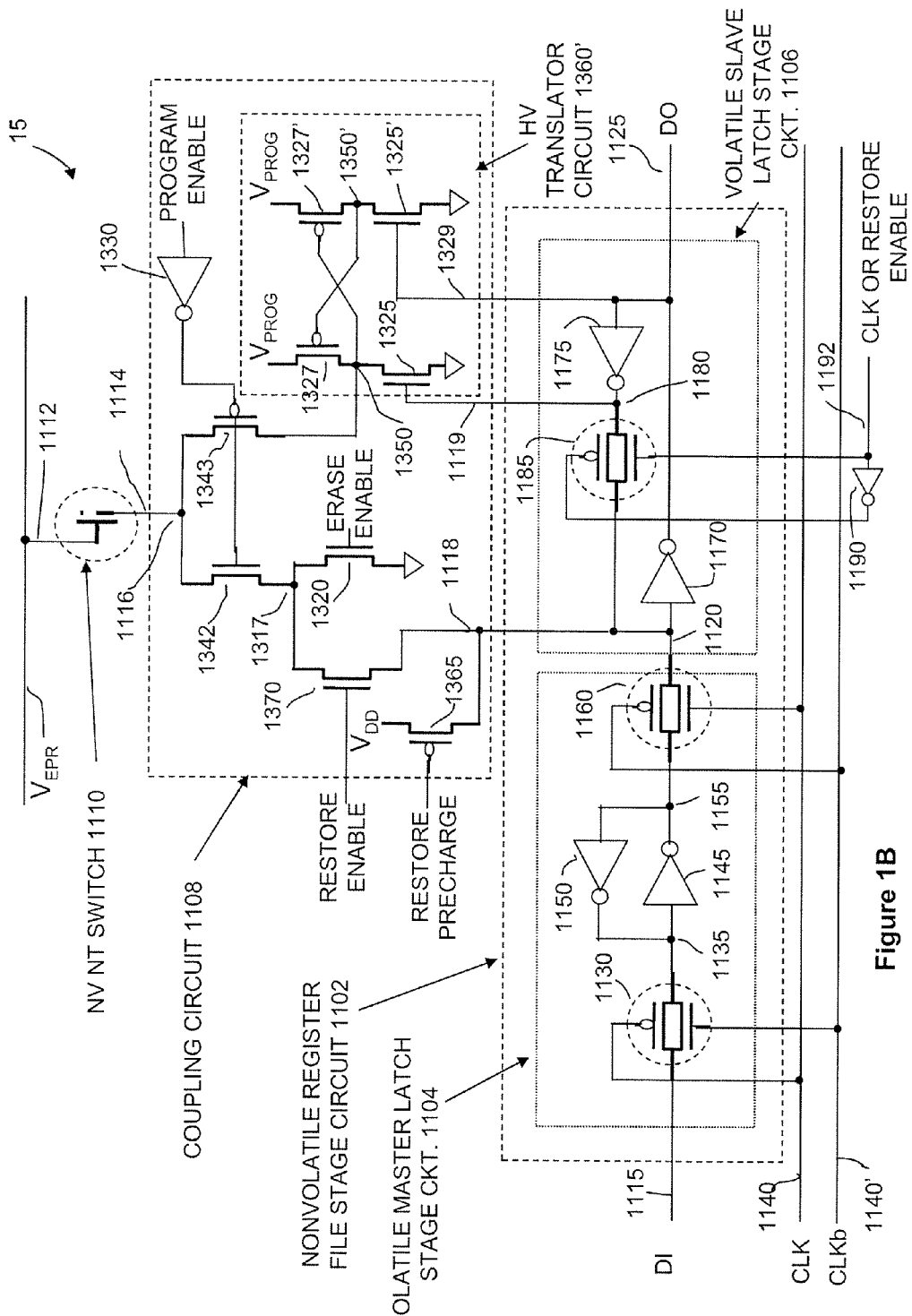
FIG. 1B is an illustration of an embodiment of a nonvolatile register file stage circuit.

FIG. 1B illustrates an embodiment of a nonvolatile register file stage circuit 15 described in U.S. patent application Ser. No. 11/280,599, that corresponds to any one of nonvolatile register file stages 1 ... N in FIG. 1A. U.S. patent application Ser. No. 11/280,599 describes various nonvolatile register file stage circuits, some with register file stage circuits coupled to a nonvolatile nanotube switch by a coupling circuit, and others with register file stage circuits directly coupled to a nonvolatile nanotube switch. In this example, register file stage circuit 1102 is coupled to nonvolatile nanotube switch 1110 by circuit 1108.

Nonvolatile register file stage 15 has two modes of operation, a normal run mode and a zero power logic state (or data state) nonvolatile retention mode in which power may be disconnected. Volatile master latch stage circuit 1104 and volatile slave latch stage circuit 1106 form one stage of a register file stage circuit 1102 that may also be referred to as an LSSD register stage.

As illustrated in FIG. 1B, input node 1115 of volatile master latch stage circuit 1104 receives data input signal DI and drives CMOS transfer gate 1130, which is connected to and drives storage node 1135 formed by cross coupled CMOS inverters 1145 and 1150. CMOS transfer gate 1130 uses both NMOS and PMOS devices instead of an NMOS-only transfer gate, for example, to ensure that both logic "1" and logic "0" states transition between full power supply and ground voltage levels by eliminating device threshold voltage drops. Clock CLK 1140, and complementary clock CLKb 1140' are used to enable or block input signal DI on input node 1115 from driving storage node 1135; by turning CMOS transfer gate 11300N and OFF, thereby determining the logic storage state of cross coupled CMOS inverters 1145 and 1150. Note that the inverters in the present illustration are CMOS inverters unless otherwise specified. CMOS inverters include a PMOS pull-up device connected to a power supply, and a NMOS pull-down device connected to ground and operates as discussed in the reference by H. B. Bakoglu, "Circuits, Interconnections, and Packaging for VLSI", Addison-Wesley Publishing Company, Inc, 1990, pp. 152, the entire contents of which are incorporated herein by reference. Cross coupled inverters 1145 and 1150 drive storage node 1155 which is connected to CMOS transfer gate 1160. Clock CLK and complementary clock CLKb are used to enable or block stored logic state node 1155 from driving slave latch stage circuit 1106 input node 1120 by turning CMOS transfer gate 11600N and OFF.

As illustrated in FIG. 1B, input node 1120 of volatile slave latch stage circuit 1106, which is also the output node of master latch stage circuit 1104, drives inverter 1170. The output of inverter 1170 is data output signal DO on output node 1125, and also drives the input of inverter 1175. The output 1180 of inverter 1175 is connected to CMOS transfer gate 1185. Clock CLK, and complementary clock CLKb are used to enable or block the presence of a feedback loop that cross couples inverters 1170 and 1175 when enabled. During normal high speed operation, clock CLK switches at high speed, 3 GHz clock rate, for example, for the 130 nm CMOS technology node. Inverter 1190 produces the complement CLKb or the complement of RESTORE ENABLE. When storing data, CMOS transfer gate 1185 is ON and inverters 1170 and 1175 form a cross coupled storage device with node 1120 acting as a storage node. When CMOS transfer gate 1185 is OFF, then inverters 1170 and 1175 are not cross coupled and do not form a storage device. Slave latch stage circuit 1106 is coupled to nonvolatile nanotube switch 1110 by coupling circuit 1108.

As illustrated in FIG. 1B, nonvolatile nanotube switch 1110 is connected to power supply voltage $V_{EPR}$, which supplies erase voltage pulse (or pulses) corresponding to the operating mode selected using coupling circuit 1108. Nonvolatile nanotube switch 1110 is also connected to node 1116 of coupling circuit 1108 using electrical connection 1114. Coupling circuit 1108 is connected to volatile slave latch stage circuit 1106, where electrical connections 1119 and 1329 connected to nodes 1180 and 1125, respectively, are used in program mode, and electrical connection 1118 is used in restore mode.

As illustrated in FIG. 1B, coupling circuit 1108 includes an erase function. The erase circuit includes NMOS transistor 1320 with drain connected to common node 1317, source connected to ground, and input gate connected to an erase enabling pulse. During an erase operation, transistor 1342 is activated by a program enable pulse at zero volts, and common node 1317 is connected to common node 1116, which is connected to nonvolatile nanotube switch 1110 in order to enable an erase operation As illustrated in FIG. 1B, coupling circuit 1108 also includes a programming function including PMOS transistor 1343 with drain connected to common node 1116, source connected to common node 1350, and gate connected to output of inverter 1330, with the input of inverter 1330 connected to a program enable input. Common node 1350 is connected to cross coupled NMOS transistors 1325 and 1325' and PMOS transistors 1327 and 1327' forming high voltage translation circuit 1360'. The sources of NMOS transistors 1325 and 1325' are connected to ground, and the sources of PMOS transistors 1327 and 1327' are connected to program voltage $V_{PROG}$. Complementary inputs 1119 and 1329 are connected to high voltage translator circuit 1360' input NMOS transistor 1325 and NMOS 1325', respectively, such that the logic state of high voltage translator circuit 1360' corresponds to the state of volatile slave latch stage 1106. $V_{PROG}$ voltage may be much higher than volatile slave latch stage voltage circuit 1106. Programming voltage is applied to common node 1350 through PMOS transistor 1327, which is in turn applied to common node 1116 and nonvolatile nanotube switch 1110 through PMOS transistor 1343. If common node 1350 is held at ground by NMOS transistor 1325, then no programming voltage is applied to common node 1350, and nonvolatile nanotube switch 1110 is not programmed.

As illustrated in FIG. 1B, coupling circuit 1108 also includes a restore function including PMOS transistor 1365 with source connected to $V_{DD}$, and drain connected to volatile slave latch stage circuit 1106 input 1120 by connector 1118. During a restore operation, PMOS transistor 1365 is used to pre-charge input node 1120 to $V_{DD}$, and then is turned OFF. NMOS transistor 1370 has source connected to input 1120 by connector 1118, drain connected to common node 1317, and gate connected to a restore enable input. NMOS transistor 1342 which is in the ON state during a restore operation, and provides a discharge path between input node common node 1317 and $V_{EPR}$, through nonvolatile nanotube switch 1110. $V_{EPR}$ is at zero volts during a restore operation. When transistor 1370 is activated by a restore enable input, if nonvolatile nanotube switch 1110 is ON, then input node 1120 is discharged; if nonvolatile switch 1110 is OFF, then input node remains at $V_{DD}$. The state of volatile slave latch stage circuit 1106 is restored to a state corresponding to the nonvolatile state of nonvolatile nanotube switch 1110.

While in normal run mode, coupling circuit 1108 is inactive, and nonvolatile nanotube switch 1110 is not powered by $V_{EPR}$ and is also decoupled from volatile slave latch stage circuit 1106. Hence, volatile master latch stage circuit 1104 and volatile slave latch stage circuit 1106 operate in a normal (conventional) synchronized logic master/slave register run mode of operation at high speed clock rates, typically 3 GHz, with $V_{DD}$=1.3 volts, for logic products fabricated using the 130 nm technology node.

In normal run mode, at the beginning of a clock cycle, clock CLK 1140 transitions from high to low voltage and remains at low voltage for the first half the clock cycle, and complementary clock CLKb 1140' transitions from low to high voltage and remains at high voltage for the first half of the clock cycle. CMOS transfer device 1130 turns ON coupling input node 1115 voltage $V_{IN}$ to storage node 1135. CMOS transfer device 1160 turns OFF and isolates the output of volatile master latch stage circuit 1104 from the input node 1120 of volatile slave latch stage circuit 1106. In normal run mode, clock CLK is connected to mode input 1192 of volatile slave latch stage circuit 1106, clock CLK is connected to CMOS transfer device 1185, and complementary clock CLKb output of inverter 1190 is also connected to CMOS transfer device 1185, such that CMOS transfer device also turns OFF breaking the feedback path between the output 1180 of inverter 1175 and the input 1120 of inverter 1170 such that node 1120 does not act as a storage node. DI signal may transition to a voltage value corresponding to the correct logic state any time prior to the end of the first half of the clock cycle, providing sufficient time remains for cross coupled inverters 1145 and 1150 to store the corresponding logic state on storage node 1155 prior to clock transition at the beginning of the second half of the clock cycle.

In normal run mode, clock CLK 1140 transitions from low to high voltage and remains at high voltage at the beginning of the second half of the clock cycle, and complementary clock CLKb 1140' transitions from high to low voltage and remains at low voltage for the second half of the clock cycle. CMOS transfer device 1130 turns OFF decoupling input node 1115 input signal DI from storage node 1135, which remains in a state corresponding to input signal DI at the end of the first half of the clock cycle, and storage node 1155 remains in a complementary state to storage node 1135. CMOS transfer device 1160 turns ON and transfers the state of storage node 1155 to input 1120 of inverter 1170 that drives output node 1125 to data output signal DO, and also drives the input of inverter 1175. In normal run mode, clock CLK is connected to mode input 1192 of volatile slave latch stage circuit 1106, clock CLK is connected to CMOS transfer device 1185, and complementary clock CLKb output of inverter 1190 is also connected to CMOS transfer device 1185, such that CMOS transfer device also turns ON forming the feedback path between the output 1180 of inverter 1175 and the input 1120 of inverter 1170 such that node 1120 acts as a storage node. With CMOS transfer device 1185 turned ON, output 1180 of inverter 1175 drives the input of inverter 1170 and stores the state of slave latch stage circuit until the end of the second stage of the clock cycle.

While in zero power logic state (or data) nonvolatile retention mode, coupling circuit 1108 is inactive, nonvolatile nanotube switch 1110 is not powered by $V_{EPR}$, and is also decoupled from volatile slave latch stage circuit 1106. Volatile master latch stage circuit 1104 and volatile slave latch stage circuit 1106 power supplies are at zero volts.

In operation, when transitioning from normal run mode to zero power nonvolatile retention mode, coupling circuit 1108 transfers the logic state from volatile slave latch stage circuit 1106 to nonvolatile nanotube switch 1110 before power is turned OFF. While power remains ON, clock CLK is stopped in a low voltage state, with complementary clock CLKb in a high voltage state, where a high voltage state is at $V_{DD}$ (1.3 to 2.5 volts, for example) and a low voltage state is at zero volts. If nonvolatile nanotube switch 1110 has not been erased, and is therefore storing a previous logic state, then coupling circuit 1108 is directed to perform an erase operation, followed by a program operation. If nonvolatile nanotube switch 1110 is in an erased state, then program mode is initiated using coupling circuit 1108.

During an erase operation, program enable input voltage is at zero volts, and transistor 1342 is held in an ON state by the output of inverter 1330. An erase enable pulse transitions from zero volts to $V_{DD}$ (1.3 to 2.5 volts, for example) turning transistor 13200N and providing a conducting path between node 1116 and ground, through ON transistors 1342 and 1320 as illustrated in FIG. 1B. With program enable voltage at zero volts, transistor 1343 is held in the OFF state by the output of inverter 1330. Restore enable voltage is at zero volts and transistor 1370 is OFF, and restore pre-charge voltage is at $V_{DD}$ and transistor 1365 is OFF input 1120 is isolated so that the state of volatile slave latch stage circuit 1106 at node 1120 is not disturbed. A $V_{EPR}$ erase voltage pulse of amplitude $V_E$ is applied to nonvolatile nanotube switch 1110 terminal, where $V_E$ may be in the range of 5 to 10 volts, for example. The resistance of transistors 1342 and 1320 in series is much less than the resistance of nonvolatile nanotube switch 1110, even if switch 1110 is in the ON state. If switch 1110 is in the ON state, then current flows between node 1112, through switch 1110 and electrical connection 1114 and the channels of ON transistors 1342 and 1320 to ground, and nonvolatile nanotube switch 1110 is switched to the OFF (erased) state. If switch 1110 is in the OFF state, it remains in the OFF (erased) state. Note that nonvolatile nanotube switch 1110 may be erased at any time prior to programming. If switch 1110 is known to be in the erased state, then programming can begin immediately. Erase stimuli according to certain embodiments of the invention are described in greater detail in U.S. patent application Ser. No. 11/280,786.

Note that during the erase operation, transistors 1370, 1365, and 1343 are all OFF, isolating nonvolatile nanotube switch 1110 from volatile slave latch stage circuit 1106. Therefore, the erase operation may be performed any time during the normal run mode without impacting the performance of volatile slave latch stage circuit 1106, and can therefore be made transparent to the logic operation of the device.

Laboratory testing of individual nonvolatile nanotube switches illustrate that nonvolatile nanotube switches such as switch 1110 illustrated schematically in FIG. 1B and also further below with respect to FIG. 9, a nonvolatile nanotube switch, has been cycled more than 50 million times as illustrated by graph 16 in FIG. 1C. The conducting state resistance is typically in the range of 10 kOhms to 50 kOhms, while the nonconducting state resistance typically exceeds 1 GOhm, for a greater than five orders of magnitude separation of resistance values between conducting and nonconducting states.

The yield of nonvolatile nanotube switches depends on the number of required ON/OFF cycles. For a ½ cycle (conducting to nonconducting) the yield approaches 100%. Achieving thousands or millions of cycles depends on the quality of the nanofabric, the overall processing, passivation, and other factors. In the early stages of a technology, it is advantageous to use redundancy to ensure sufficient nonvolatile register file yield.

Limitations of Nonvolatile Register Files

As the semiconductor industry pushes for ever higher performance while managing power dissipation as described in U.S. patent application Ser. No. 11/280,599, new devices such as nonvolatile nanotube switches may be introduced for greater flexibility. Such new devices may require yield enhancement in the early years of manufacturing by adding additional redundant function and means of bypassing defective nonvolatile register file 10 individual stages, until the yield learning is sufficient to reduce or eliminate a need for such redundant function.

For nonvolatile register file 10 shown in FIG. 1A, the number of desired good stages is N, 256 bits, for example. An additional M stages may be added, M=116 bits for example, such that the total number of available stages N+M is 372. Selection means may be used to bypass defective registers such that 256 register stages of the 372 total available stages may be used to form a nonvolatile register file functionally equivalent to nonvolatile register file 10.

Selection means may include traditional fuse latch devices such as laser fuses, for example U.S. Pat. No. 5,345,110, the entire contents of which are incorporated herein by reference. Selection means may include fuse latches with multiple fuse (and anti-fuse) types such as described in Bertin et al. U.S. Pat. No. 6,570,802, the entire contents of which are incorporated herein by reference. Other selection means may include fuse latches with substantially higher resistance trip points in the range of 100 KΩ as described in U.S. Pat. No. 6,750,802. Such latches accommodate fuses with an ON resistance range of 10 KΩ (or lower) to 50 KΩ for example, and OFF (programmed or blown) resistance ranges in excess of 1 MΩ, and are well suited for replacing traditional fuse types using metal or polysilicon material with new nonvolatile fuse types such as nonvolatile nanotube switches whose electrical characteristics are described in U.S. patent application Ser. No. 11/280,786. Traditional fuse latches are typically OTP (one-time-programmable). New latches using nonvolatile nanotube switches may be operated in an OTP mode, or may be programmed and erased thousands of times, for example.

Still other selection means may include a nonvolatile redundant register file, a modified version of nonvolatile register file 10 in shown in FIG. 1, which may be used to identify good nonvolatile register file stages.

A steering circuit that is used to include or bypass individual nonvolatile register file stages, controlled by the state of traditional or new fuse latches or by nonvolatile redundant register file stages, is included with every latch stage of the modified nonvolatile register file 10 described further below.

Optimizing Performance of Volatile Master and Slave Latch Stages

Nonvolatile register files described further above include high speed volatile registers, typically comprising a master and slave latch per stage, and a nonvolatile nanotube switch (NV NT Switch) coupled to each slave latch, for example. The NV NT Switch may be directly coupled to the slave latch, or may be coupled using a coupling circuit. In addition to optimizing the yield of nonvolatile operation of nonvolatile register file latches as described further above, there is a need to optimize the high speed performance of volatile registers as well. Also, not all register files need to be nonvolatile. However, register files require high speed (high clock speed) synchronous operation.

At high clock speeds, in excess of 1 GHz for example, the yield of register latches may be reduced due to device parameter variations that cause logic delay variation or cache delay variation. Such parameter variations may occur from lot-to-lot during fabrication and also change under field use caused by device parameter change (drift). For example, a synchronous CPU and on-board cache may require a cache access time of 170 ps, for example, to ensure that the data read from the cache is ready at the CPU terminals one clock cycle after a CPU data request is initiated.

It would be desirable to provide a nonvolatile scalable element that may be used as a fuse, or as an antifuse, or as both fuse and antifuse, or more generally able to toggle between nonvolatile ON and OFF states multiple times, and a corresponding latch circuit. Integrating such a latch circuit with delay control circuits may be used to optimize timing (adjust critical timing paths) at time of fabrication and in the field to optimize performance at higher yield with enhanced reliability.

Nonvolatile Register File with Redundant Stages

Figure 1C:
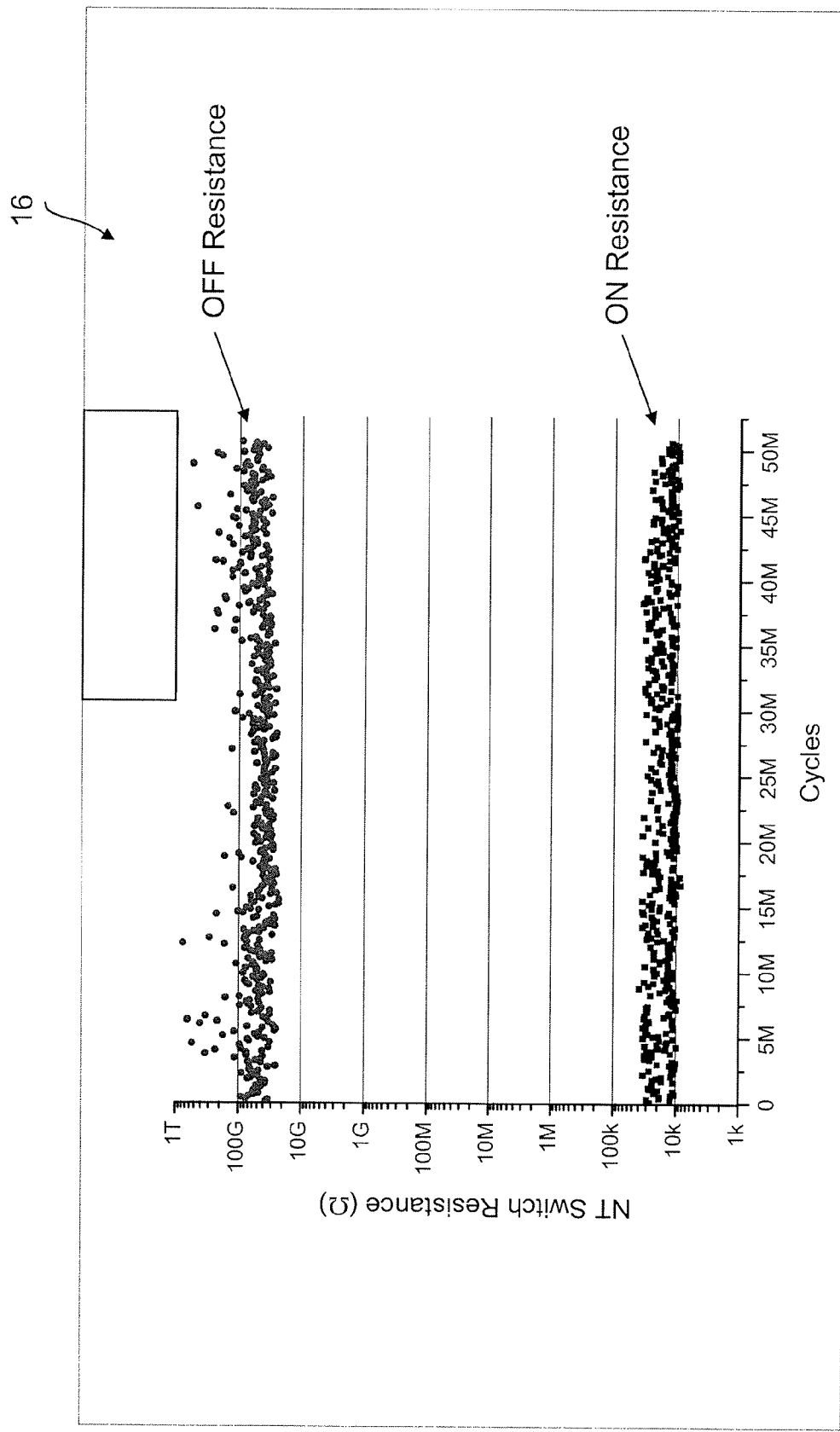
FIG. 1C is an illustration of the results of cycling data for a nonvolatile nanotube switch, according to one embodiment of the invention.
Figure 2:
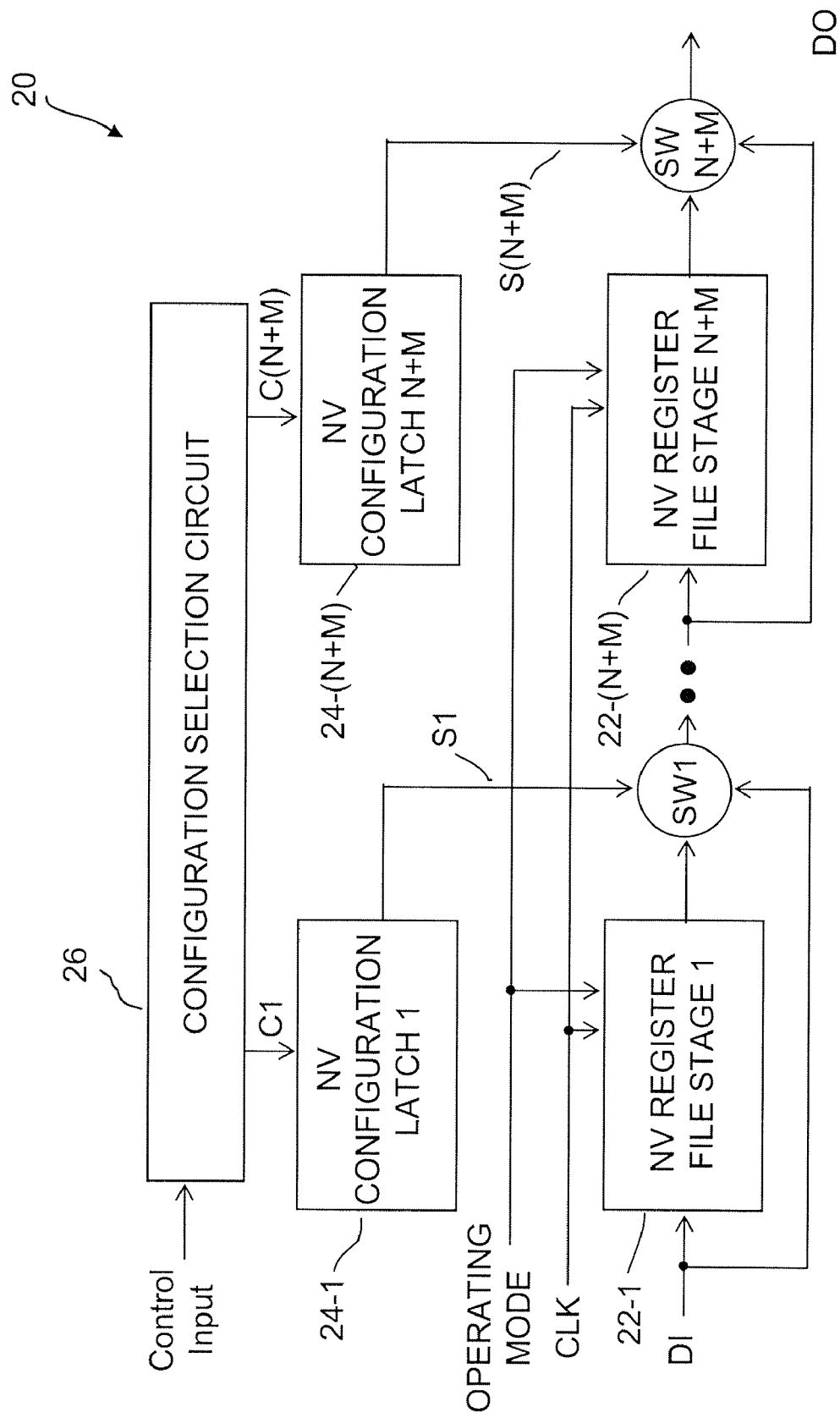
FIG. 2 is a schematic representation of the nonvolatile register file of FIG. 1A with additional redundant nonvolatile register file stages and corresponding selection circuitry, according to another embodiment of the invention.

FIG. 2 illustrates a nonvolatile register file 20 of N+M stages, having N+M repeated individual nonvolatile stages beginning with stage 22-1 (nonvolatile register file stage 1) and ending with stage 22-(N+M) (nonvolatile register file stage N+M). Each of the stages 22-1 to 22-(N+M) are substantially the same, and are also substantially the same as each NV register file stage 1 to NV register file stage N in nonvolatile register file 10 (FIG. 1). Any subset of N stages of stages 1 to N+M may be used to form nonvolatile register file 20 having N stages.

Switches SW1 to SW(N+M) are used as two-input, one-output multiplexers (mux's) to select (include) or de-select (bypass) any stage 22-1 to 22-(N+M) when forming the N stages of nonvolatile register file 20. Each nonvolatile register file stage has a corresponding switch. For example, the output of stage 22-1 goes to corresponding first input to switch SW1, and the input DI to stage 22-1 also bypasses stage 22-1 and goes directly to a second input to switch SW1. The output of switch SW1 may be the output of stage 22-1, or the input DI to stage 22-1 if stage 22-1 is to be bypassed. Select signal S1 determines whether stage 22-1 is selected or bypassed when forming nonvolatile register file 20.

For any stage 22-K between stage 22-1 and 22-(N+M), the output of stage 22-K goes to corresponding first input to switch SWK; the input to stage 22-K, which is the output of switch SW(K−1) also bypasses stage 22-K and goes directly to a second input to switch SWK. The output of switch SWK may be the output of stage 22-K, or the input to stage 22-K thereby bypassing stage 22-K. Select signal SK determines whether stage 22-K is selected or bypassed when forming nonvolatile register file 20. The input to stage 22-K may be the output of stage 22-(K−1) or may be output of stage 22-(K−2), for example, if stage 22-(K−1) has been bypassed. Multiple stages may be bypassed. For example, if all stages preceding stage K have been bypassed, then the input to stage 22-K may be DI, the input to stage 1.

The output of the last stage 22-(N+M) goes to corresponding first input to switch SW(N+M), and the input to stage 22-(N+M) also bypasses stage 22-(N+M) and goes directly to second input to switch SW(N+M). The output of switch SW(N+M) is data out DO. Nonvolatile register file 20 data out DO may be the output of stage 22-(N+M) or stage 22-(N+M) may be bypassed. The data out DO signal may be from any previous stage such as stage K, for example. Select signal S(N+M) determines whether stage 22-(N+M) is selected or bypassed when forming nonvolatile file 20.

Control signals S1 . . . S(N+M) are provided by corresponding nonvolatile configuration latch 1 (24-1) . . . nonvolatile configuration latch N+M (24-(N+M)). Each nonvolatile configuration latch K (24-K) provides an output signal SK that selects or deselects (bypasses) nonvolatile register file state K as described further below. A configuration selection circuit 26 may be used to select which of the nonvolatile configuration latches are programmed and which are left as-is.

Figures 3A, 3B, 3C:
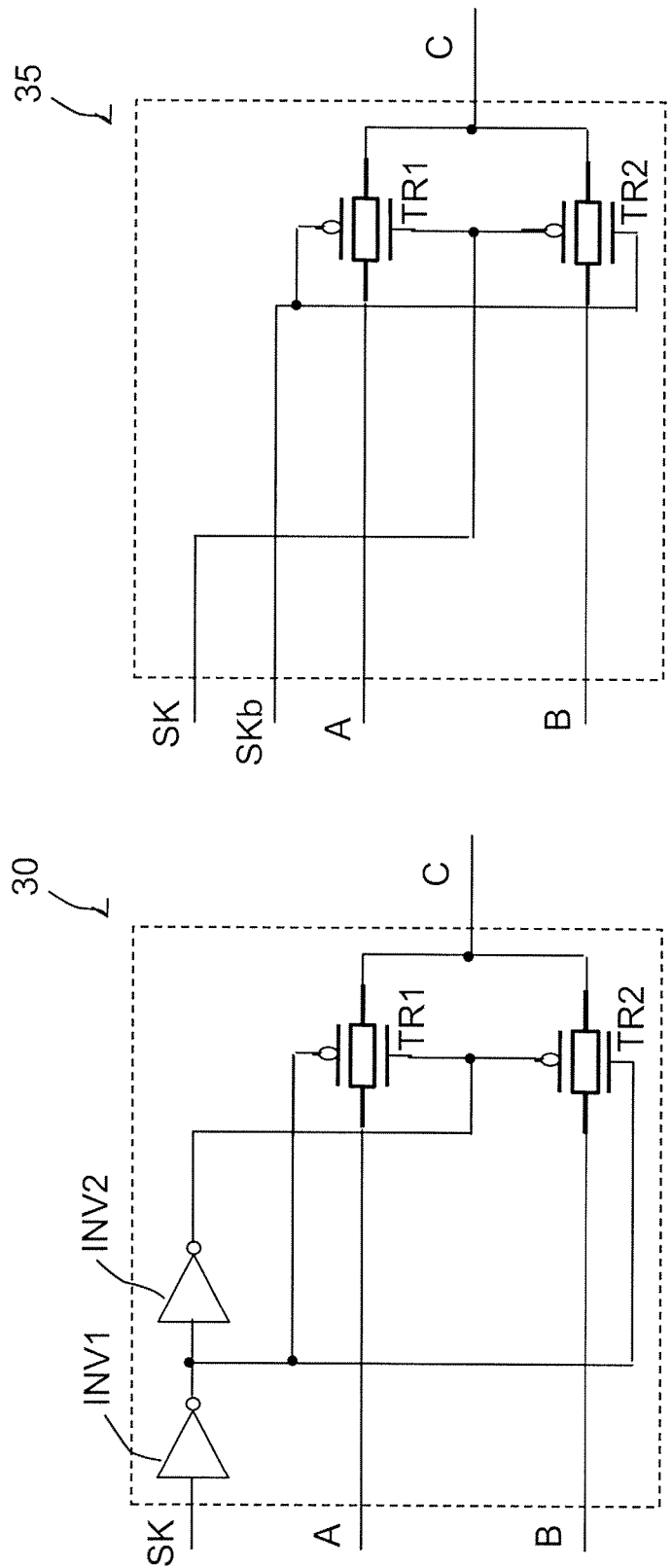
FIGS. 3A-3C are schematic representations of switches used to select or deselect (bypass) nonvolatile register file stages when forming the final nonvolatile register file, according to other embodiments of the invention.

Configuration selection circuit 26 may be decoder logic with a control input such as used in memory array spare row or column selection as described in U.S. Pat. No. 5,345,110, the entire contents of which are incorporated herein by reference. Alternatively, configuration selection circuit 26 may utilize a serial configuration control register as described in U.S. Pat. No. Re. 34,363, the entire contents of which are incorporated herein by reference. Configuration selection circuits are described further below Routing Switches Used to Select Nonvolatile Register File Stages FIG. 3A illustrates switch circuit 30 that may be used to include or bypass a corresponding nonvolatile register file stage when forming nonvolatile register file 20 illustrated in FIG. 2. Switch circuit 30 output C is connected to one side of each of CMOS transfer devices TR1 and TR2, where CMOS transfer devices are formed using parallel PFET and NFET devices, as illustrated in FIG. 3A, based on common industry practices. The opposite side of transfer device TR1 is connected to signal A and the opposite side of transfer device TR2 is connected to signal B. Control signal SK drives the input of inverter INV1. The output of inverter INV1 drives the input of inverter INV2 and the PFET control gate of TR1 and the NFET control gate of TR2. The output of inverter INV2 drives the NFET control gate of TR1 and the PFET control gate of TR2.

FIG. 3B illustrates switch circuit 35 that may be used to include or bypass a corresponding nonvolatile register file stage when forming nonvolatile register file 20 illustrated in FIG. 2. Switch circuit 35 terminal C is connected to one side of each of CMOS transfer devices TR1 and TR2, where CMOS transfer devices are formed using parallel PFET and NFET devices as illustrated in FIG. 3B based on common industry practices. The opposite side of transfer device TR1 is connected to terminal A and the opposite side of transfer device TR2 is connected to terminal B. Control signal SK drives PFET control gate of TR2 and the NFET control gate of TR1. Complementary control signal SKb drives the NFET control gate of TR2 and the PFET control gate of TR1.

In operation, as illustrated in FIG. 3C, if input control signal SK is high (1.5 to 2.5 volts, for example), then CMOS transfer gate TR1 is ON with both corresponding PFET and NFET parallel devices in the ON state, and terminal C is connected to terminal A. CMOS transfer device TR2 is OFF. However, if input signal SK is low (zero volts, for example), then CMOS transfer gate TR2 is ON with both corresponding PFET and NFET parallel devices in the ON state, and terminal C is connected to terminal B. CMOS transfer device TR1 is OFF. Note that when SK is high, then SKb is low, and when SK is low, then SKb is high.

In operation of switch circuit 30 or switch circuit 35, as illustrated in FIG. 3, terminals A and B may be input signals that may be routed to output C as a function of control signal SK (or control signals SK and SKb). Alternatively, terminal C may be an input signal that may be routed to terminal A or terminal as a function of control signal SK (or control signals SK and SKb). When switch circuit 30 or switch circuit 35 is used as representative switch SK of switches SW1 . . . SW(M+N) as illustrated in FIG. 2, terminal A may be used as a first input connected to the output corresponding nonvolatile register file stage K, for example, and terminal B may be used as a second input connected to the input of nonvolatile register file stage K, which may be used to bypass corresponding nonvolatile register file stage K, for example, as explained further above with respect to nonvolatile register file 20 operation illustrated in FIG. 2.

Routing Switch Control by Nonvolatile Signal Sources

Control signals to routing circuits 30 or 35 used to select or deselect individual nonvolatile register file stages, such as nonvolatile register file stage K as explained further above with respect to FIGS. 2 and 3, may be supplied by a nonvolatile latch, one latch for each switch, for example. One approach is to use various latches based on laser fuses that are programmed using laser ablation. These laser fuses may be formed of patterned metallic or polysilicon elements, for example. Alternatively, such laser fuses may be formed using a patterned nanofabric resistor similar to nanofabric-based resistors described in commonly-owned U.S. patent application Ser. No. 11/230,876, entitled "Resistive Elements using Carbon Nanotubes, filed Sep. 20, 2005, the entire contents of which are incorporated herein by reference.

Another approach is to use latches based on electronic fuses or electronic antifuses as described in Bertin et al. U.S. Pat. No. 6,570,806, the entire contents of which are incorporated herein by reference. These latch types are used as OTP (one-time-programmable) latches.

Yet another approach is to introduce new latches based on the resistance of nonvolatile nanotube switches as logic state fuse or antifuse storage elements such as the switches described in U.S. patent application Ser. No. 11/280,786. New latches that store a logic state based on the resistance of nonvolatile nanotube switches may be OTP or may be used more than once (multiple times) in an erase/program/read mode described in U.S. patent application Ser. No. 11/280, 786. Note that nonvolatile register file stages described in U.S. patent application Ser. No. 11/280,599, or modifications of such stages as described further below, may be used as nonvolatile logic state storage latches.

In all cases, the nonvolatile resistive state of a fuse or antifuse in a closed (conducting) state or open (non-conducting) state is used to indicate a first or second logical state. The latch circuit converts the fuse (or antifuse) nonvolatile resistive state into a corresponding electrical voltage level indicative of a logical 1 or 0. This corresponding voltage level is transmitted as a control signal to routing circuits 30 or 35 illustrated in FIG. 3. In this way, the logical state of a nonvolatile latch may be used to select or deselect (bypass) a nonvolatile register file stage as illustrated in FIG. 2.

Figure 4:
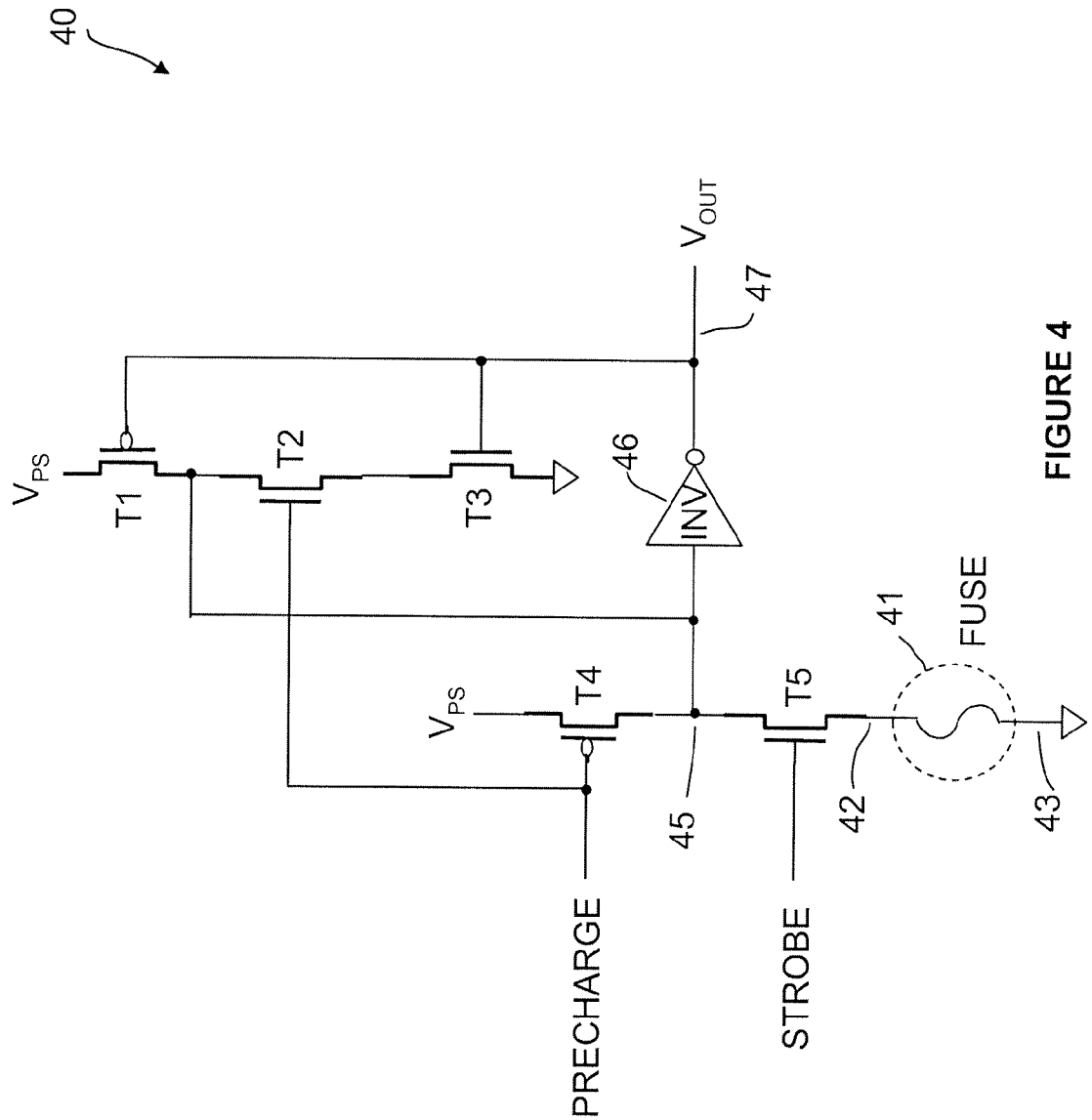
FIG. 4 is a latch circuit schematic of a laser fuse latch that may be used as part of the nonvolatile register file circuit described in FIG. 2, according to another embodiment of the invention.

Nonvolatile Signal Sources Based on Nonvolatile Latches Using Laser Ablation of Fuses as a Programming Means FIG. 4 illustrates an OTP fuse latch circuit 40 comprising a fuse element 41 shown with a first fuse terminal connected to strobe device (transistor) T5 at node 42 and a second fuse terminal connected to ground at node 43. A second terminal of strobe device T5 connected to terminal 45 is also connected to a latch circuit formed by transistors T1, T2, T3 and inverter device 46. A latch precharge device (transistor) T4 is also shown connected to a power supply $V_{PS}$ and to terminal 45. In this latch circuit 40, during chip power up the precharge and strobe voltages are held low (ground for example and node 45 is precharged to a positive voltage ($V_{PS}$) by precharge transistor T4 and latch circuit 40 is in a first logic state with node 45 at a high voltage and $V_{OUT}$ on node 47 at a low voltage. During chip power up, transistor T2 is held in an OFF state by a low precharge voltage thus keeping the latch circuit 40 feedback path open to ensure that latch circuit 40 is maintained in a first logic state ($V_{OUT}$=0) after chip power up is complete. After chip power up is complete, then precharge voltage transitions to a high value prior to a strobe high voltage transitions (illustrated further below with respect to FIG. 5) turning transistor T2 ON and latching (storing) a first logic state in latch circuit 40 while turning precharge device T4 OFF. When transistor T2 is in the ON state, the latch circuit 40 feedback path is complete which enables latch circuit 40 to store a first logic state. Latch circuit 40 uses a metal or polysilicon nonvolatile resistive fuse element 41 to indicate one of two logical states. For example, if fuse element 41 is left intact (conducting), when strobe transistor T5 is activated, node 45 is discharged and latch circuit 40 transitions to a second logic state such that node 45 is at a low voltage and $V_{OUT}$ on node 47 is at a high voltage. However, if fuse 41 has been programmed (made nonconducting) by laser ablation, then node 45 is not discharged and latch circuit 40 remains in a first logic state. That is, the latch circuit 40 converts the nonvolatile fuse's resistive value into an electrical voltage level indicative of a logical 0 (a first logic state) or a logical 1 (a second logic state).

Nonvolatile register file 20 illustrated in FIG. 2 is tested after fabrication and functional (good) and nonfunctional (bad) nonvolatile register file stages are identified from the total of N+M available stages. If a sufficient number of good nonvolatile register file stages are identified, in this example at least 256 stages, then a tester-generated map (yield map) showing good and bad stages is generated. If a stage such as nonvolatile register file stage K is to be included in the formation of nonvolatile register file 20, then a fuse 41 corresponding to a nonvolatile latch K is left intact (conducting), and corresponding latch circuit 40 transitions to a second logic state. If, however, a nonvolatile register file stage such as stage J is to be bypassed, that is excluded from nonvolatile register file 20, then a fuse 41 corresponding to a nonvolatile latch J is programmed (written) to a high resistance state (blown) by laser ablation, and corresponding latch circuit 40 remains in a first logic state. The tester-generated yield map is converted to fuse position coordinates (X, Y, for example) for laser ablation using a laser ablation tool, typically an off-the-shelf industry standard laser tool.

Figure 5:
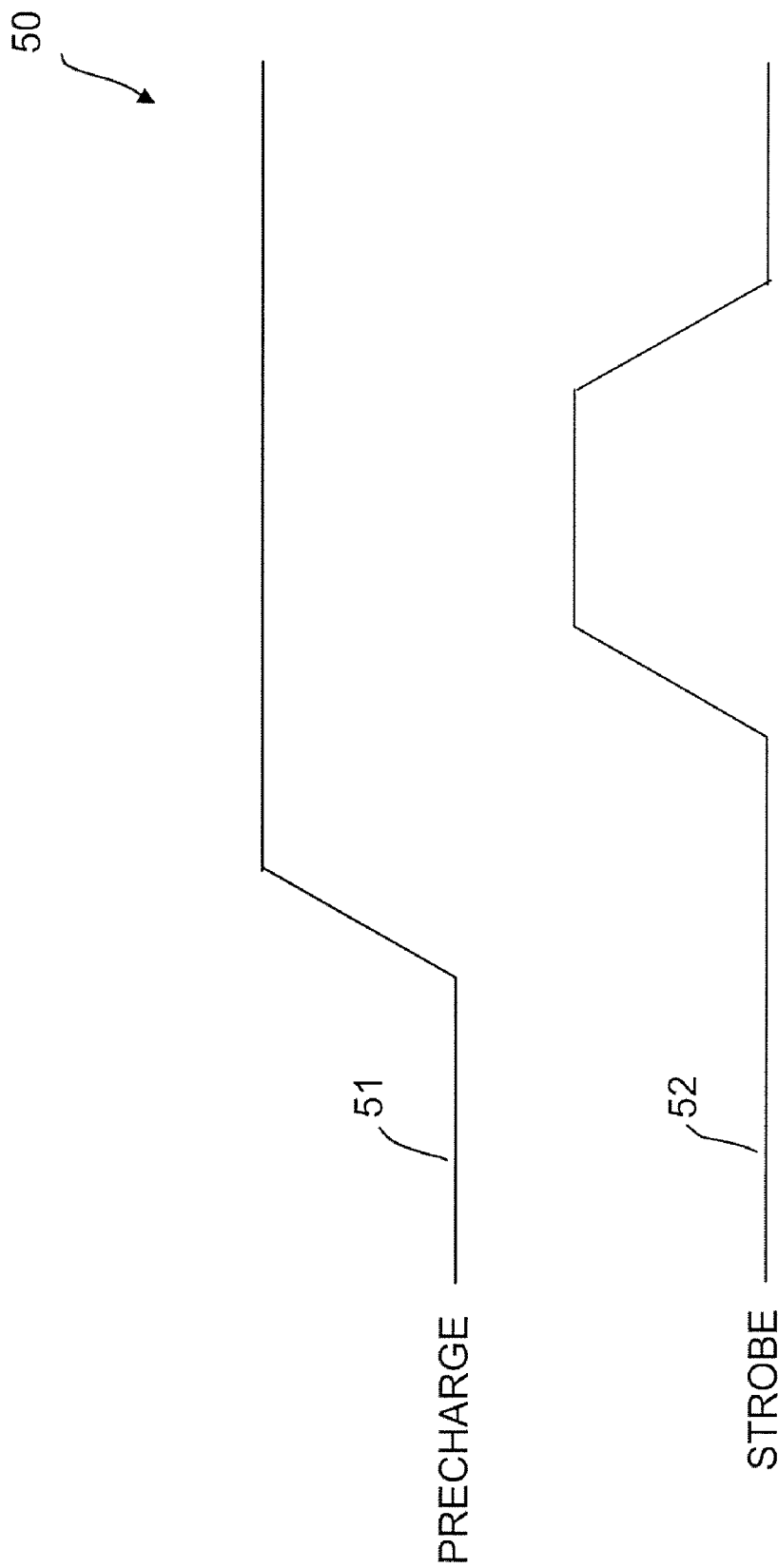
FIG. 5 is a representation of waveforms used in the operation of the latch circuit described in FIG. 4, according to another embodiment of the invention.

A typical read operation performed by latch circuit 40 shown in FIG. 4 is illustrated by waveforms 50 illustrated in FIG. 5 as follows: First, the precharge transistor device T4 is pulsed by signal 51 and precharges node 45 to voltage $V_{PS}$ and the latch circuit 40 to a first logical state and then turns OFF. In its first logical state, latch circuit 40 node 45 voltage is high and output voltage $V_{OUT}$ at node 47 is at a low voltage. Subsequently, the strobe device T5 is pulsed ON by signal 52. If the fuse element 41 is intact, it is conductive and drains off the precharge voltage from node 45 forcing latch circuit 40 to a second logical state in which node 45 is at a low voltage, and $V_{OUT}$ on node 47 is at a high voltage. If the fuse element 41 has been programmed, it no longer conducts enough to drain sufficient charge off (from) the latch node 45 to change the logical stage of the latch. In this case, when the strobe device is activated, the latch circuit 40 remains in its first logic state with node 45 voltage high and output voltage $V_{OUT}$ on terminal 47 low.

If nonvolatile file latch stage K is to be included as a stage in nonvolatile register file 20 illustrated in FIG. 2, then fuse 41 in corresponding latch circuit 40 is left intact in a conducting state. Therefore, when corresponding latch circuit 40 is strobed, it transitions to a second logic state as described further above in which node 45 is at a low voltage and $V_{OUT}$ on node 47 is at a high voltage. If routing switch 30 is used in nonvolatile register file 20, then a positive voltage $V_{OUT}$ on output 47 is transmitted to select signal input SK, CMOS transfer gate TR1 is activated and CMOS transfer gate TR2 is deactivated as described further above with respect to FIG. 3A. Routing switch 30 connects input A with output C, which transmits the output of nonvolatile register file 20 stage K to the input of nonvolatile register file 20 stage K+1, thus including stage K in nonvolatile register file 20

Note that if routing switch 35 illustrated in FIG. 3B were used instead of routing switch 30, then both select signal input SK corresponding to $V_{OUT}$ on node 47, and complementary select signal input SKb corresponding to node 45 of circuit latch 40 are provided. Therefore, routing switch 35 connects input A with output C, which transmits the output of nonvolatile register file 20 stage K to the input of nonvolatile register file 20 stage K+1, thus including stage K in nonvolatile register 20.

If nonvolatile file latch stage J is to be excluded as a stage in nonvolatile register file 20 illustrated in FIG. 2, then fuse 41 in corresponding latch circuit 40 is programmed to a nonconducting state. Therefore, when corresponding latch circuit 40 is strobed, it remains in a first logic state as described further above in which node 45 is at a high voltage and $V_{OUT}$ on node 47 is at a low voltage. If routing switch 30 is used in nonvolatile register file 20, then a low (near zero) voltage $V_{OUT}$ on output 47 is transmitted to select signal input SJ, CMOS transfer gate TR2 is activated and CMOS transfer gate TR1 is deactivated as described further above with respect to FIG. 3A. Routing switch 30 connects input B with output C, which bypasses the output of nonvolatile register file 20 stage J to the input of nonvolatile register file 20 stage J+1, thus excluding stage J in nonvolatile register file 20.

Note that if routing switch 35 illustrated in FIG. 3B were used instead of routing switch 30, then both select signal input SJ corresponding to $V_{OUT}$ on node 47, and complementary select signal input SJb corresponding to node 45 of circuit latch 40 are provided. Therefore, routing switch 35 connects input B with output C, which bypasses the output of nonvolatile register file 20 stage J to the input of nonvolatile register file 20 stage J+1, thus excluding stage J in nonvolatile register 20.

Nonvolatile Signal Sources Based on Nonvolatile Latches Using Laser Ablation of Patterned Nanofabric Fuses as a Programming Means Patterned laser fuses (resistors) using metallic or polysilicon resistor elements requires removal of a relatively large amount of material during laser ablation. Typical industry practices require an opening through dielectric layers to expose the fuse region such that the fuse material is expelled through the opening during laser ablation because of the relatively large quantity of material (metal or semiconductor).

A laser fuse formed from a patterned nanotube layer is easily integrated at any point in a semiconductor process. Also, a fuse- (resistor-) formed, patterned nanotube layer requires removal of a small amount of material during laser ablation. Therefore, a patterned nanotube laser fuse may be laser ablated with an opening through dielectric layers, or while covered with a protective insulating film providing dielectric layers are transparent to laser energy. Patterned nanofabric resistors are described in U.S. patent application Ser. No. 11/230,876.

Metallic and polysilicon fuses may also self-heal due to improper blowing of the fuse, creating too small of a gap in the resistor. If the device is employed in a high temperature environment such as in high radioactive environments, material diffusion can occur which will short the previously blown resistor, creating a leakage path through the fuse element. Due to the minuscule size of the nanotube fabric and the nature of the strong C—C bonding present in the nanotubes, the ability for a reconnection of a blown fabric is minimal to non-existent.

FIG. 6 illustrates patterned nanofabric fuses and corresponding contacts that may be substituted for fuse 41 in latch circuit 40 illustrated in FIG. 4. FIG. 6 fuses correspond to patterned nanofabric-based resistors (e.g. those shown in U.S. patent application Ser. No. 11/230,876) that can be included in any vertical layer in semiconductor (or ceramic, organic, or other packaging) process. Patterned nanofabric fuses may be used with any logic product such as processors, controllers, digital signal processors, ASICs, programmable logic arrays and other logic products. Patterned nanofabric fuses may also be used in memory products such as DRAM, SRAM, EEPROM, CRAM, FeRAM, MRAM, and NRAM. In the case of nonvolatile register file latches 20, since nonvolatile nanotube switches used in nonvolatile register file 20 stages illustrated in FIG. 2 are formed using one or more deposited layers of nanofabric that are then patterned into nonvolatile nanotube switches using certain photolithographic methods, using patterned nanofabric fuses as fuse element 41 in latch circuit 40 may be particularly useful. Nanofabric layers used to form fuses 41 may be deposited anywhere in the vertical integrated structure. Alternatively, nanotube fuses may be formed using the same nanofabric layer used to fabricate nonvolatile nanotube switches used in nonvolatile register file stages. This nanofabric layer may be located anywhere in the vertical integrated structure. Methods of making nanofabric layers and elements are described in greater detail in the incorporated patent references.

FIG. 6A illustrates a plan view of a patterned nanofabric resistor fuse 60 as fabricated (prior to insulating layer deposition) including a patterned nanofabric 61 resistor with contact 62 and contact 62'. The sheet resistance of the patterned nanofabric element 61 is controlled by controlling the porosity of the nanofabric, the number of nanotube fabric layers used to form the nanofabric element 61, along with other variables. The nanofabric can be applied to a surface in a reliably uniform manner such that the electric properties of the nanofabric can be controlled. A nanofabric layer may be applied using spin-on or spray-on techniques, for example. The patterned nanofabric 61 can be controlled to sheet resistances from 1 K-Ohm to 1 M-Ohm for example. Various examples of contact resistance and sheet resistance are given in U.S. patent application Ser. No. 11/230,876. FIG. 6B shows fuse 60 after laser ablation has removed region 63.

Contacts 62 and 62' may be used for both contact and interconnect purposes as illustrated in cross section FIG. 6C shown after insulator deposition. Insulator 68 may be deposited as an insulating protective layer to complete insulated patterned nanofabric resistor fuse 65. FIG. 6D shows a cross section of fuse 65 after laser ablation has removed region 63. Examples of contact and interconnect materials are elemental metals such as Ru, Ti, Cr, Al, Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or suicides such as RuN, RuO, TiN, TaN, $CoSi_x$ and $TiSi_x$ may be used as described further in U.S. patent application Ser. No. 11/230,876. Insulator layer may be $SiO_2$, $SiN_x$, $Al_2O_3$, BeO, polyimide, Mylar or other suitable insulating material. Patterned nanofabric resistor fuse 65 may be used as fuse 41 in latch 40 illustrated in FIG. 4 by depositing insulated patterned nanofabric resistor fuse 65 such that terminal 62 is in contact with node 42 and terminal 62' is in contact with terminal 43.

Fuse 65 may be left intact or may be programmed (blown) by laser ablation. FIGS. 6B and 6D show FIGS. 6A and 6C, respectively, before and after laser ablation. Fuse materials such as metals or polysilicon require removal of relatively large amounts of material and are typically left uninsulated as described further above. Nanofabrics composed of multiple SWNTs and/or MWNTs in the range of 1 to 5 nm, or 5 to 20 nm, in diameter respectively, result in a removal (laser ablation) of multiple SWNTs and/or MWNTs involving small volumes of material, such that fuse 65 may be programmed (blown) in the presence of an insulating layer providing the insulating layer is transparent to the laser optical wavelength used. Alternatively, a portion of insulating material 68 above patterned nanofabric 61 element may be removed (not shown) for purpose of laser ablation.

In operation, the logic state of latch 40 illustrated in FIG. 4 reflects the resistance state of patterned nanofabric resistor fuse 65 used as fuse 41 in latch 40. For example, if fuse element 41 is left intact (conducting) as illustrated in FIG. 6A or 6C, when strobe transistor T5 is activated, node 45 is discharged and latch circuit 40 transitions to a second logic state such that node 45 is at a low voltage and $V_{OUT}$ on node 47 is at a high voltage. However, if fuse 41 has been programmed (made nonconducting) by laser ablation such as illustrated in FIG. 6B or 6D, then node 45 is not discharged and latch circuit 40 remains in a first logic state. That is, the latch circuit 40 converts the nonvolatile fuse 65 resistance value into an electrical voltage level indicative of a logical 0 (a first logic state) or a logical 1 (a second logic state).

Nonvolatile Signal Sources Based on Nonvolatile Latches Using Both Electronic Fuses or Antifuses as a Programming Means Laser ablation requires that fuses be placed in a region with large dimensions (large footprint) because of the laser spot size and alignment, and required clearance to adjacent circuits. No devices may be placed under the fuses.

Electronic fuses (e-fuses) composed of metal or polysilicon resistive traces may fit in a region with a smaller area than required for fuses that use laser ablation. Also, electronic fuses may be activated before or after a chip is packaged. Electronic fuses are in an ON (conducting) resistive state as fabricated, typically in the hundreds of ohms and are programmed (blown) to OFF (nonconducting) state of greater than 100 K to 1 M Ohm range by an electric current that causes localized $I^2R$ heating. Typically such programming currents are in the milli-Ampere range. Note that e-fuse may sometimes be referred to simply as fuse.

Electronic antifuses (e-antifuses) are typically formed with capacitor structures that include metallic or polysilicon capacitor plates and a thin insulator, $SiO_2$ and/or SiN, for example. Electronic antifuses are in the OFF (nonconductive) state as fabricated, typically in the 10 M Ohm and above range, and are programmed (blown) to an ON (conductive) resistive state by applying voltages of 8 to 12 volts, and programming currents in the micro-Ampere range. ON (conductive) resistance values are typically in the 1 K to 50 K-Ohm range. Note that e-antifuse may sometimes be referred to simply as antifuse.

Figure 7:
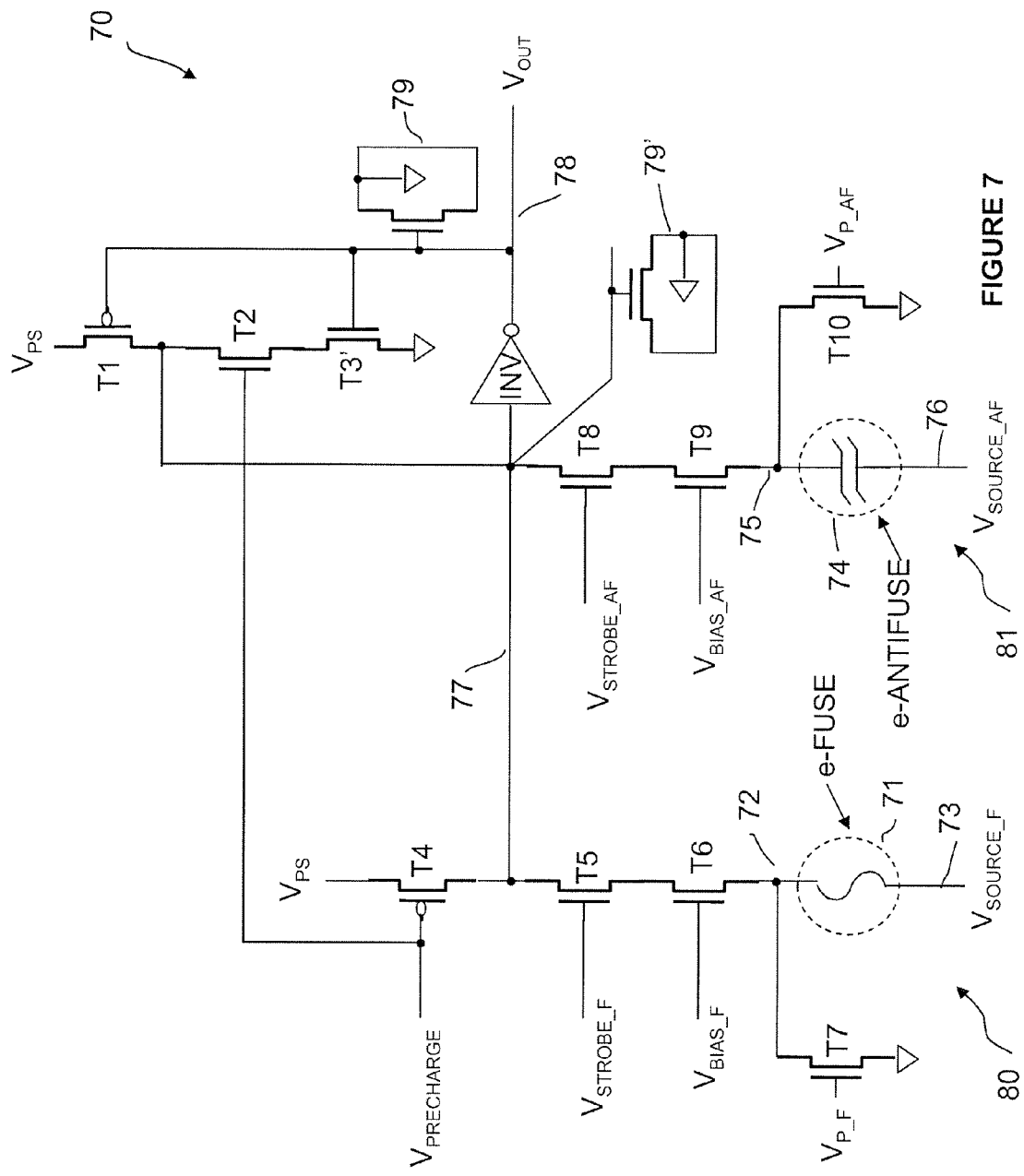
FIG. 7 is an illustration of a latch circuit using electronic fuses or electronic antifuses that may be used as part of the nonvolatile register file circuit described in FIG. 2, according to another embodiment of the invention.

FIG. 7 illustrates a representation of a universal fuse latch 70 designed to accommodate both electronically programmable (OTP) e-fuses and electronically programmable (OTP) e-antifuse as described in Bertin et al. U.S. Pat. No. 6,570,806. Universal latch 70 is adapted to provide different latch resistive trip points, referred to as intrinsic latch trip resistance, for different fuse or anti-fuse latch circuit types to accommodate differences in the ON state and OFF state resistance values as described in U.S. Pat. No. 6,570,806. Latch 70 may be used as nonvolatile configuration latch 1 (24-1) . . . nonvolatile configuration latch N+M (24-(N+M)) in FIG. 2.

In the universal latch circuit 70 illustrated in FIG. 7, the fuse latch circuit 40 illustrated in FIG. 4 has been modified to include a first e-fuse or strobing path 80 through transistors T5 and T6 and which includes an electrical fuse element 71 connected to node 72 of transistor T6 and to a source voltage $V_{SOURCE\_F}$ node 73. Transistor T6 is held in the linear region with a channel resistance which, when combined with the resistance of e-fuse 71 (typically 200 Ohms, for example), results in a latch resistive trip point of 10 kOhms as described in U.S. Pat. No. 6,570,806. A resistive trip point of 10 kOhms is consistent with a e-fuse ON resistance in the hundreds of Ohms, and an OFF resistance of at least 100 kOhms. Note that node 73 is at zero (ground) voltage when the state of latch 70 is set.

Transistor T7 has been added between node 72 and ground for e-fuse programming purposes. During e-fuse programming, a voltage source $V_{SOURCE\_F}$ is applied to node 73. If transistor T7 is turned on by input programming activation voltage $V_{P-F}$, then a programming current flows through fuse 71, and fuse 71 transitions to a high resistances state. If transistor T7 remains OFF, then fuse 71 is not programmed and remains in the low resistance (ON) state. E-antifuse 74 may be programmed only once. Typically a programming current in the milli-Ampere range is required. Examples of polysilicon fuses and programming requirements are described in U.S. Pat. Nos. 6,624,499 and 6,008,523, the entire contents of which are incorporated herein by reference.

In the universal latch circuit 70 illustrated in FIG. 7, the fuse latch circuit 40 illustrated in FIG. 4 has been modified to include a second e-antifuse or strobing path 81 through transistors T8 and T9 and which includes an electrical antifuse element 74 connected to node 75 of transistor T9 and to a source voltage $V_{SOURCE\_AF}$ node 76. Transistor T9 is held in the linear region with a channel resistance which, when combined with the resistance of e-antifuse 74 (typically 10 kOhms to 50 kOhms, for example), results in a latch resistive trip point of 100 kOhms as described in U.S. Pat. No. 6,570,806, the entire contents of which are incorporated herein by reference. A resistive trip point of 100 kOhms is consistent with an e-antifuse ON resistance in the thousands of Ohms, and an OFF resistance of at least 1 MOhm. Note that node 76 is at zero (ground) voltage when the state of latch 70 is set.

Transistor T10 has been added between node 75 and ground for e-antifuse programming purposes. During e-antifuse programming, a voltage source $V_{SOURCE\_AF}$ is applied to node 76. If transistor T10 is turned on by input programming activation voltage $V_{P-AF}$, then a programming voltage is applied across e-antifuse 74, a small current (micro-Amperes) flows, and e-antifuse 74 transitions to a low resistances state. If transistor T10 remains OFF, then e-antifuse 74 is not programmed and remains in a high resistance (OFF) state. Fuse may be programmed only once. Typically $V_{SOURCE\_AF}$ is in the 8 to 12 volt range, and a corresponding programming current in the micro-Ampere range. Examples of antifuses and programming requirements are described in U.S. Pat. No. 5,956,282, the entire contents of which are incorporated herein by reference.

Universal latch circuit 70 output node 78 corresponds to latch circuit 40 output node 47. Universal latch circuit 70 node 77, the complement of output node 78, corresponds to latch circuit 40 node 45. If the intrinsic latch trip resistance of universal latch circuit 70 is designed for 100 kOhms, then universal latch circuit 70 may be more sensitive to upset by cosmic-rays of alpha particles generated hole-electron pairs than latch circuit 40. Accordingly, ballast capacitor 79 may be added to output node 78, and ballast capacitor 79' may be added to complementary node 77. Ballast capacitor values may be 10 to 20 fF, for example.

The read operation for universal latch circuit 70 when using e-fuse 71 in strobing path 80 is the same as the read operation for latch circuit 40 using fuse 41. Thus, if nonvolatile file latch stage K is to be included as a stage in nonvolatile register file 20 illustrated in FIG. 2, then e-fuse 71 in corresponding universal latch circuit 70 is left intact in a conducting state. Therefore, when corresponding universal latch circuit 70 is strobed, it transitions to a second logic state as described further above in which node 77 is at a low voltage and $V_{OUT}$ on node 78 is at a high voltage. If routing switch 30 is used in nonvolatile register file 20, then a positive voltage $V_{OUT}$ on output 78 is transmitted to select signal input SK, CMOS transfer gate TR1 is activated and CMOS transfer gate TR2 is deactivated as described further above with respect to FIG. 3A. Routing switch 30 connects input A with output C, which transmits the output of nonvolatile register file 20 stage K to the input of nonvolatile register file 20 stage K+1, thus including stage K in nonvolatile register file 20.

The read operation for universal latch circuit 70 when using e-fuse 71 in strobing path 80 is the same as the read operation for latch circuit 40 using fuse 41. Thus, if nonvolatile file latch stage J is to be excluded as a stage in nonvolatile register file 20 illustrated in FIG. 2, then e-fuse 71 in corresponding universal latch circuit 70 is programmed to a non-conducting state. Therefore, when corresponding universal latch circuit 70 is strobed, it remains in a first logic state as described further above in which node 77 is at a high voltage and $V_{OUT}$ on node 78 is at a low voltage. If routing switch 30 is used in nonvolatile register file 20, then a low (near zero) voltage $V_{OUT}$ on output 78 is transmitted to select signal input SJ, CMOS transfer gate TR2 is activated and CMOS transfer gate TR1 is deactivated as described further above with respect to FIG. 3A. Routing switch 30 connects input B with output C, which bypasses the output of nonvolatile register file 20 stage J to the input of nonvolatile register file 20 stage J+1, thus excluding stage J in nonvolatile register file 20.

Note that with respect to universal latch circuit 70, if node 78 is positive and if both node 78 output is made available to select signal input SK and complementary node 77 output is made available to select signal input SKb of switch circuit 35, then stage K will be included in register file 20. However, if node 78 is zero is made available to signal input SJ and complementary node 77 output is made available to select signal input SJb of switch circuit 35, then stage J will be excluded in register file 20 as described further above with respect to latch circuit 40.

The read operation for universal latch circuit 70 when using e-antifuse 74 in strobing path 81 is the opposite of the read operation for latch circuit 40 using fuse 41 with respect to programming. Thus, if nonvolatile file latch stage K is to be included as a stage in nonvolatile register file 20 illustrated in FIG. 2, then e-antifuse 74 in corresponding universal latch circuit 70 is programmed from an intact normally nonconducting state to a conducting state. Therefore, when corresponding universal latch circuit 70 is strobed, it transitions to a second logic state as described further above in which node 77 is at a low voltage and $V_{OUT}$ on node 78 is at a high voltage. If routing switch 30 is used in nonvolatile register file 20, then a positive voltage $V_{OUT}$ on output 78 is transmitted to select signal input SK, CMOS transfer gate TR1 is activated and CMOS transfer gate TR2 is deactivated as described further above with respect to FIG. 3A. Routing switch 30 connects input A with output C, which transmits the output of nonvolatile register file 20 stage K to the input of nonvolatile register file 20 stage K+1, thus including stage K in nonvolatile register file 20.

The read operation for universal latch circuit 70 when using e-antifuse 74 in strobing path 81 is the opposite of the read operation for latch circuit 40 using fuse 41 with respect to programming. Thus, if nonvolatile file latch stage J is to be excluded as a stage in nonvolatile register file 20 illustrated in FIG. 2, then e-antifuse 74 in corresponding universal latch circuit 70 is left intact in its nonconducting state. Therefore, when corresponding universal latch circuit 70 is strobed, it remains in a first logic state as described further above in which node 77 is at a high voltage and $V_{OUT}$ on node 78 is at a low voltage. If routing switch 30 is used in nonvolatile register file 20, then a low (near zero) voltage $V_{OUT}$ on output 78 is transmitted to select signal input SJ, CMOS transfer gate TR2 is activated and CMOS transfer gate TR1 is deactivated as described further above with respect to FIG. 3A. Routing switch 30 connects input B with output C, which bipasses the output of nonvolatile register file 20 stage J to the input of nonvolatile register file 20 stage J+1, thus excluding stage J in nonvolatile register file 20.

Note that with respect to universal latch circuit 70, if node 78 is positive and if both node 78 output is made available to select signal input SK and complementary node 77 output is made available to select signal input SKb of switch circuit 35, then stage K will be included in register file 20. However, if node 78 is zero is made available to signal input SJ and complementary node 77 output is made available to select signal input SJb of switch circuit 35, then stage J will be excluded in register file 20 as described further above with respect to latch circuit 40.

Nonvolatile Signal Sources Based on Nonvolatile Latches Using Nonvolatile Nanotube Switches as Electronic Fuses or Antifuses as a Programming Means Typically, OTP electronic fuses using metallic or polysilicon traces have relatively small resistance values, typically in the 100 Ohm range, and require relatively large currents in the milli-Ampere range in order to reach sufficiently high $I^2R$ power dissipation to cause a fuse to transition from a conducting to a nonconducting state. Also, electronic fuse lengths are typically longer than minimum dimensions in order to achieve sufficient resistance to avoid requiring even higher currents. As a result, electronic fuses do not scale well and remain relatively large in size even as technology dimensions are reduced with each new generation of technology.

Typically, OTP electronic antifuses use capacitor structures having capacitor plates of metal or semiconducting (polysilicon, for example) material on either side of a thin insulator layer (5 to 10 nm of $SiO_2$ and/or SiNx, for example) and require relatively high breakdown voltages in the range of 8 to 12 volts, for example, that are not easily scalable. Electronic antifuses do not scale well and remain relatively large in size even as technology dimensions are reduced with each new generation of technology.

What is needed is a scalable fuse and/or a scalable antifuse that integrates easily in silicon integrated circuit technologies such as CMOS and bipolar memory, logic, mixed signal, etc. and may be reduced in size, programming voltage and current as new technology generations are introduced. Nonvolatile nanotube switches (described in U.S. patent application Ser. No. 11/280,786) are scalable nonvolatile nanotube switches that may be added at any convenient point in the process flow. These scalable nonvolatile nanotube switches may be used to replace nonvolatile electronic fuses or antifuses.

Figure 8:
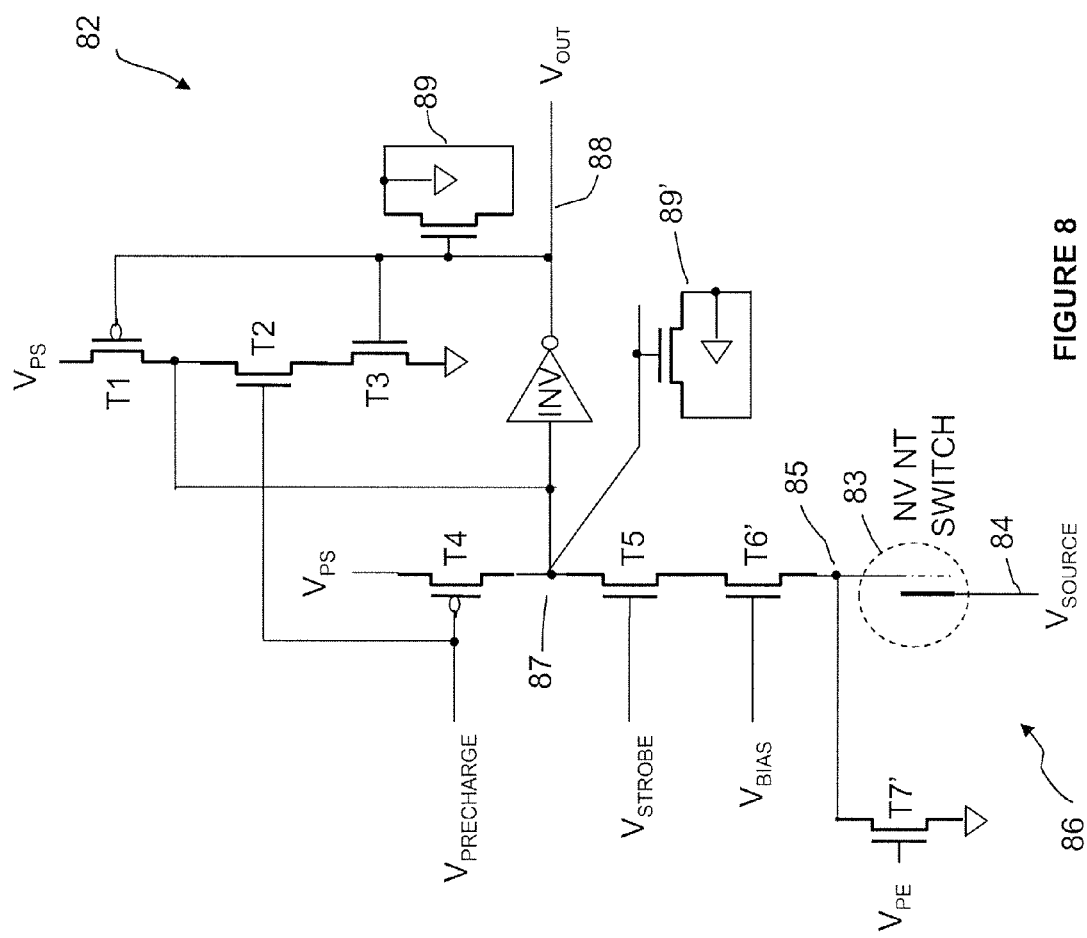
FIG. 8 is an illustration of a latch circuit using a nonvolatile nanotube switch as a programming element useable as part of the nonvolatile register file circuit described in FIG. 2, according to another embodiment of the invention.

FIG. 8 illustrates latch circuit 82 designed to accommodate nonvolatile nanotube switch 83 which are described in U.S. patent application Ser. No. 11/280,786 and summarized further below with respect to FIG. 9. Latch 82 is designed to provide a latch resistive trip point, referred to as an intrinsic latch trip resistance of 100 kOhms as described in U.S. Pat. No. 6,570,806, the entire contents of which are incorporated herein by reference. An intrinsic latch trip resistance of 100 kOhms is selected because nonvolatile nanotube switch ON resistance is typically in the 10 kOhm to 50 kOhm resistance range as illustrated in FIG. 1C. The OFF resistance of nonvolatile nanotube switches is typically greater than 1 GOhm or greater as illustrated in FIG. 1C.

In the latch circuit 82 illustrated in FIG. 8, the universal latch circuit 70 illustrated in FIG. 7 has been modified to include a nonvolatile nanotube switch strobing path 86 through transistors T5 and T6' and which includes nonvolatile nanotube switch element 83 connected to node 85 of transistor T6' and to a voltage source $V_{SOURCE}$ node 84. Transistor T6' is held in the linear region with a channel resistance which, when combined with the resistance of nonvolatile nanotube switch (typically 10 kOhms to 50 kOhms, for example), results in a latch resistive trip point of 100 kOhms as described in U.S. Pat. No. 6,570,806. A resistive trip point of 100 kOhms is consistent with a nonvolatile nanotube switch ON resistance in the 10 kOhm to 50 kOhm range, and an OFF resistance of at least 1 MOhm (nonvolatile nanotube switch OFF resistance is typically 1 GOhm or greater). Note that node 84 is at zero (ground) voltage when the state of latch 82 is set.

Latch circuit 82 described further above with respect to FIG. 8 illustrates NV NT switch 83 with one terminal connected to node 84 to which program/erase pulse (or pulses) $V_{OUT}$ is (are) applied, and a second terminal connected to common node 85 and the drain of operating mode select transistor T7'. The operation of latch circuit 82 is described with respect to a NV NT switch 83 in the relatively high resistance range of 10 kOhm to 50 kOhm range. However, NV NT switch 83 may in a lower resistance range such as 100 Ohm to 10 kOhm range, for example.

Latch circuit 82 is also described with respect to a particular latch configuration connected to common node 85 consisting of an inverter INV, an inverter with feedback enable/disable means formed by transistors T1, T2, and T3 and corresponding interconnect means. Also included are precharge and strobe transistors T4 and T5 respectively and their interconnections, as well as bias transistor T6' typically in the linear region, connected to common node 85. Different latch configurations may be connected to common node 85 to achieve corresponding function and operation as described with respect to latch circuit 82. Latch circuit 82, and many other latch circuit configurations known in the industry, may be used to convert low resistance and high resistance states of NV NT switch 83 to logical "1" and logical "0" states corresponding to high and low voltage output $V_{OUT}$ values. Also, capacitors 89 and 89' used for additional latch stability are optional and are not used in many configurations. These capacitors may be omitted from latch circuit 82 as well.

There are technology differences when referring to a programmed state, for example, between OTP nonvolatile electronic fuses (e-fuses) used in nonvolatile latches such as latch 70 illustrated in FIG. 7 and scalable nonvolatile nanotube switches used in nonvolatile register files 10, 15, and 20 illustrated in FIGS. 1 and 2. These terminology differences can lead to confusion when discussing both nonvolatile latches and nonvolatile register files in the same specification. Table 1 and table 2 illustrate differences in terminology for clarification purposes.

In table 1, an e-Fuse used in a latch is in the ON state as-fabricated, and may be programmed once (OTP) to an OFF state. Therefore, an e-Fuse OFF state is referred to as a programmed state in the corresponding conventional terminology and in the corresponding text in this specification.

By contrast, as can be seen in table 2, a nonvolatile nanotube switch (NV NT Switch) typically used in nonvolatile register files such as illustrated in FIGS. 1 and 2 is ON as fabricated, is referred to as erased in the OFF state in the incorporated patent references and the corresponding text in this specification. Since NV NT Switches may be cycled multiple times, the ON state resulting due to an OFF state-to-ON state transition is referred to as a programmed state in the incorporated patent references and the corresponding text in this specification.

TABLE 1

Latch Nonvolatile Electronic Fuse (e-Fuse)
Replacement with Scalable Nanotube Fuse (nt-Fuse)
using a Nonvolatile Nanotube Switch

| Type of Element | ON State (Conductive) | OFF State (Non-conductive) | Comments |
| --- | --- | --- | --- |
| e-Fuse | As-fabricated | Programmed | Metallic or semiconducting common terminology used OTP-only operation |
| NV NT Switch | As-fabricated or Programmed | Erased | NV NT Switch Multiple ON & OFF cycles |
| OTP only (nt-Fuse) | As-fabricated | (programmed) | OTP-only operation |

TABLE 2

Nonvolatile Register File using Nonvolatile Nanotube Switch

| Type of Element | ON State (Conductive) | OFF State (Non-conductive) | ON State (Conductive) | Comments |
| --- | --- | --- | --- | --- |
| NV NT Switch | As-fabricated | Erased | programmed | common terminology used |

In reference to Table 1, in the case where an e-Fuse has been replaced by a scalable nonvolatile nanotube switch (NV NT Switch) in a latch, the terminology depends on the application. If the NV NT Switch application requires changes between ON and OFF states multiple times, then an OFF state is considered erased and an ON state is programmed (or as-fabricated). However, if the NV NT Switch is to be used as a OTP e-fuse replacement, then the NV NT Switch may be referred to as a nanotube fuse (nt-Fuse), a new terminology. Thus in the OTP mode, an OFF state may be referred to as a programmed state as illustrated in table 1 instead of an erased state. The programmed OFF state is only used with respect nonvolatile latch 82 in FIG. 8, and only if latch 82 is used in an OTP mode. In latch 82 the term nt-Fuse corresponds to NV NT Switch 83 when used in an OTP mode.

Note that unlike e-Fuses, NV NT Switches are, and operate as, nonvolatile nanotube switches and therefore may change between ON and OFF states numerous times. Therefore, NV NT Switches are much more versatile than OTP e-Fuses. Product configurations may be changed after programming, even in the field when using NV NT Switches as part of latch circuits. For example, nonvolatile register file 20 illustrated in FIG. 2 may experience a failure in one or more of the 256 stages. This may occur under normal operating conditions, or may occur as a result of exposure to harsh environments such as high levels of radiation, high temperatures, or other conditions when operating in an application in the field. If this occurs, then assuming extra unused latches exist, and assuming nonvolatile configuration control latches used were similar to latch 82 illustrated in FIG. 8, then configuration selection circuit 26 can reset nonvolatile configuration latches as needed by changing the ON and OFF states of corresponding NV NT Switches to restore nonvolatile register file 20 operation.

The terminology used with respect to nonvolatile latches using e-Fuses is shown in Table 1 and is illustrated in U.S. Pat. No. 6,570,806. The terminology used with respect to nonvolatile register files using NV NT Switches is shown in both Table 1 and Table 2 and is illustrated in U.S. patent application Ser. Nos. 11/280,786 and 11/280,599.

Transistor T7' has been added between node 85 and ground for NV NT Switch programming purposes. During NV NT Switch programming, a voltage source $V_{SOURCE}$ is applied to node 84. Transistor T7' may be turned on before or after $V_{SOURCE}$ transition by input program/erase activation voltage $V_{PE}$ and one (or several) voltage pulses may be applied, current may flows through NV NT Switch 83, and NV NT Switch may transition from a low to a high resistances state, or from a high to a low resistance state depending on the desired operation. If transistor T7' remains OFF, then NV NT Switch 83 remains in the same state. NV NT Switch 83 may be change states once or may be cycled multiple times between ON and OFF states.

FIG. 9A illustrates a cross sectional representation of a two terminal nonvolatile nanotube switch 90. Nanofabric element 93 is disposed on substrate 95, which includes a layer of insulator 94. Nanofabric element 93 of channel length $L_{CHANNEL}$ at least partially overlaps two terminals, e.g., conductive elements 91 and 92, which are both deposited directly onto nanofabric element 93. Methods of making nanofabric elements are described in greater detail in the incorporated patent references.

Nonvolatile nanotube switch 90 passivation involves depositing a suitable dielectric layer 96 over the nonvolatile nanotube switches. An example of this approach is the use of spin-coated polyvinylidenefluoride (PVDF), polyimide, or other insulator for example, in direct contact with the nonvolatile nanotube switches. Then a suitable secondary dielectric passivation film, such an alumina or silicon dioxide is used to seal off underlying PVDF, polyimide, or other insulator and provide a passivation robust to nonvolatile nanotube switch operation. Nonvolatile nanotube switch 90 or 90' may be included (inserted) at any point in an integrated circuit process flow. Typical programming and erase currents for switch 90 are approximately 1-50 micro-Ampere, or two to three orders of magnitude lower than currents typically required to program conventional e-fuse currents.

FIG. 9B illustrates a cross sectional representation of a two terminal nonvolatile nanotube switch 90'. Nanofabric element 93' is disposed on insulator 97 and contacts 91' and 92'.

Insulator 97 and contacts 91' and 92' are disposed on substrate 95', which includes insulator 94'. Insulator 97 may have a lower thermal conductivity than insulator 94'. Nanofabric element 93' of channel length $L_{CHANNEL}$ at least partially overlaps two terminals, e.g., conductive elements 91' and 92', which are both deposited prior to the deposition of nanofabric element 93'. Switch 90' may be more easily integrated in the semiconductor process than switch 90.

An advantage of structure 90' is that a large amount of the $I^2R$ power is lost to the substrate; therefore, if an insulator 97 with a smaller thermal conductivity than 94' is chosen, then the switching of the nanotube fabric at lower currents is facilitated because of less heat loss to the underlying substrate. Without wishing to be bound by theory, the inventors believe that the two terminal nanotube switch may primarily function due to heating within the fabric that causes breaking and reforming of carbon-carbon and/or carbon-metal bonds, as described in U.S. patent application Ser. No. 11/280,786. Therefore, less heat that is lost to the substrate may allow for smaller applied voltages to 'break' the nanotube switch, hence turn the switch to an OFF state.

Nonvolatile nanotube switch 90' passivation involves depositing a suitable dielectric layer 97' over the nonvolatile nanotube switches. An example of this approach is the use of spin-coated polyvinylidenefluoride (PVDF), polyimide, or other insulator for example, in direct contact with the nonvolatile nanotube switches. Then a suitable secondary dielectric passivation film, such an alumina or silicon dioxide is used to seal off underlying PVDF, polyimide, or other insulator and provide a passivation robust to nonvolatile nanotube switch operation. Nonvolatile nanotube switch 90 or 90' may be included (inserted) at any point in an integrated circuit process flow. Nonvolatile switches 90 and 90' are described in more detail in U.S. patent application Ser. Nos. 11/280,786 and 11/280,599. Typical programming (erase) currents for switch 90' are in the range of 1-20 micro-Ampere, or three orders of magnitude lower than currents of 10's of milli-Amperes typically required to program conventional e-fuse currents.

Figure 9C:
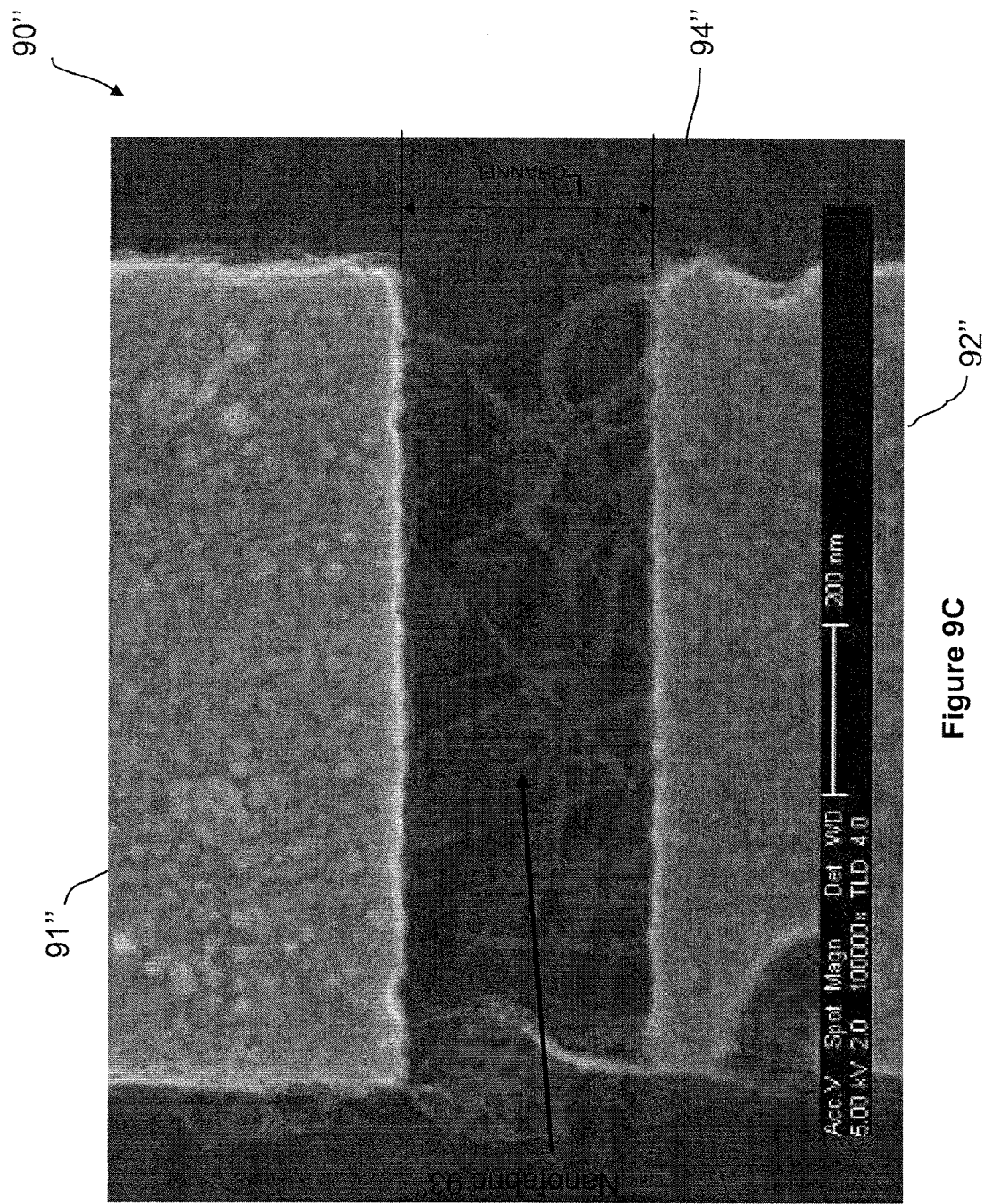

FIG. 9C illustrates an SEM image of a nonvolatile nanotube switch 90'' prior to passivation and corresponds to nonvolatile nanotube switch 90' in the cross sectional drawing in FIG. 9B. Nonvolatile tube switch 90'' includes nanofabric element 93'', contacts 91'' and 92'' and an insulator 94''. Nonvolatile nanotube switches 90 and 90' have been fabricated with channel lengths $L_{CHANNEL}$ scaled from 250 nm to 22 nm thereby reducing nonvolatile nanotube switch size and lowering programming voltages, as illustrated further below.

Figure 9D:
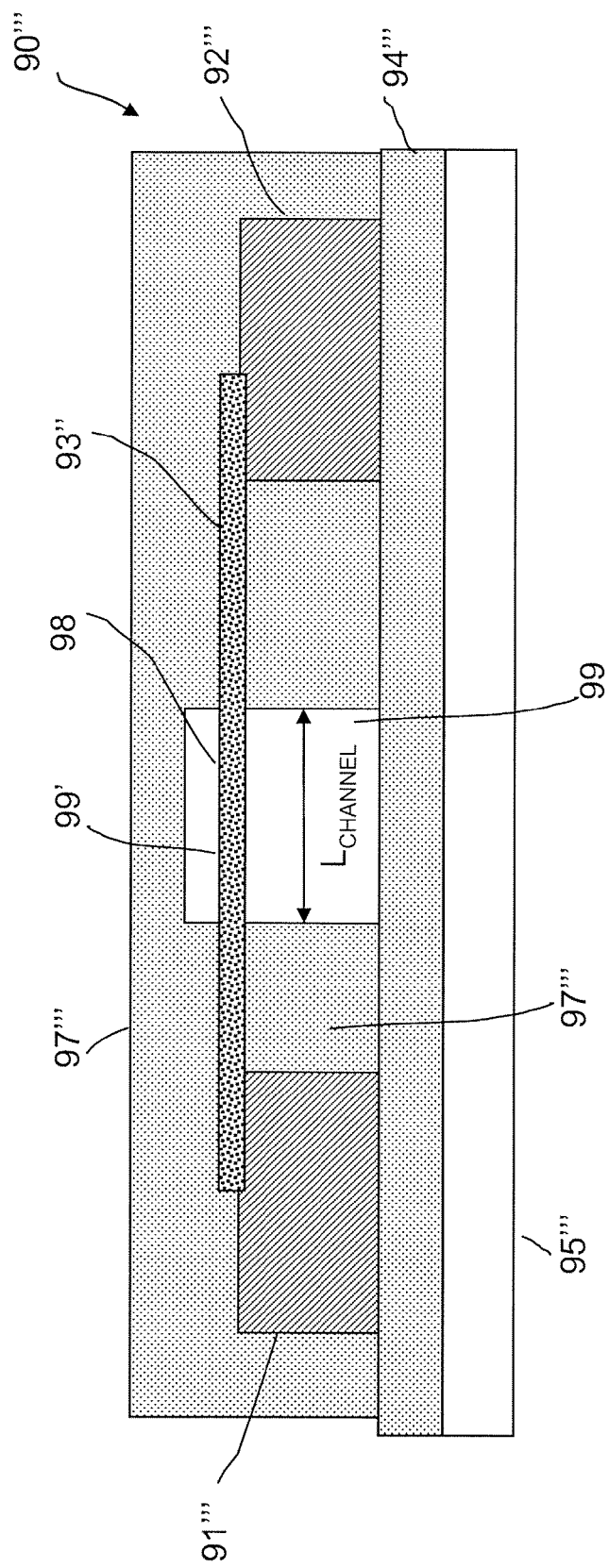

FIG. 9D shows a variation of the two terminal NRAM switch 90''' that includes a suspended gap region 99 and 99' with suspended nanotube fabric 98. This structure would have optimum electrical and thermal properties for the nanotube switch described in U.S. patent application Ser. No. 11/280,786. The reason for the improved switching ability of 90''' is that in the suspended region no heat is lost to the surrounding substrate. Therefore, smaller voltages and currents are required to heat the nanotubes to the desired temperature for switching to occur (as described above and in U.S. patent application Ser. No. 11/280,786). The channel length may range from ~50 nm to the entire length of the active region in between metal contacts 91''' and 92'''. Another advantage of this structure is that scaling to lower lithography nodes is not required to achieve the lower switching voltages. Note that utilizing only a lower gap 99 may be sufficient.

With proper design conditions, it is not expected that the nanotubes will only break in the suspended region. It is expected that a proportion of the nanotubes in the fabric will switch OFF on substrate 97''', allowing for the NRAM switch to be cycled.

The cavity used for the suspended region may also be filled with an oxidizing gas such as $O_2$ or $O_3$ to further decrease the current required to blow the nanotube fuse. This would be valuable for an OTP device that does not need to be reprogrammed.

Nonvolatile nanotube switches illustrated in FIG. 9 are normally ON as fabricated. While nonvolatile nanotube switches such as NV NT Switches 16 illustrated in FIG. 1C may be cycled between ON and OFF states many millions of times as illustrated in FIG. 1C, they are initially formed as relatively high resistance switches. Referring to nonvolatile latch 82 illustrated in FIG. 8, if nonvolatile nanotube switches 83 are similar to NV NT Switches 16 then $R_{ON}$ in a conducting state will typically have a resistance range of 10 kOhms to 50 kOhms. If NV NT Switches as described with respect to latch circuit 82 NV NT Switches 83 are similar to NV NT Switches 16, then $R_{OFF}$ in a nonconducting state will have resistance values typically 1 GOhm or higher.

Figure 10A:
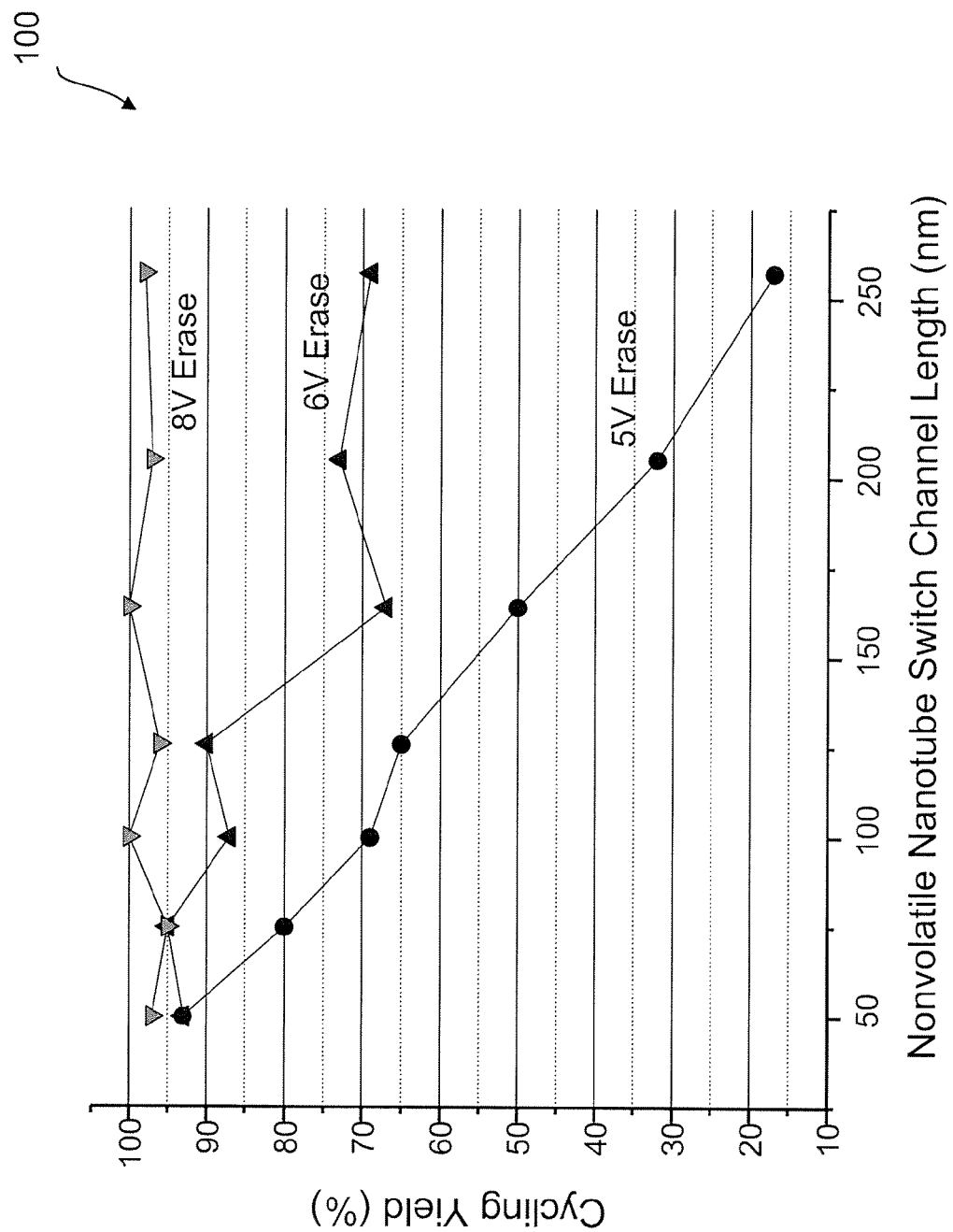
FIG. 10A is a graphical representation of several nonvolatile nanotube switches of varying channel length illustrating the scaling of erase voltages, according to another embodiment of the invention.

FIG. 10A curves 100 illustrate the voltage scaling effect of channel length $L_{CHANNEL}$ reduction on erase voltage for nonvolatile nanotube switches as $L_{CHANNEL}$ is reduced from over 250 nm to 50 nm. Note that the ON and OFF state-related terminology used is as defined in table 2. $L_{CHANNEL}$ refers to switch channel length as described with respect to FIG. 9. The effectiveness of channel length reduction is illustrated in terms of erase voltage as a function of channel length reduction and erase/program cycling yield, where each data point represents 22 devices and the number of ON/OFF erase/program cycles is five. Erase voltage is a strong function of channel length and is reduced (scaled) from 8 volts to 5 volts as the nonvolatile nanotube switch channel length is reduced from 250 to 50 nm as illustrated by curves 100 shown in FIG. 10A. Corresponding programming voltages (not shown) are less than erase voltages, typically in the range of 3 to 5 volts, for example. Erase voltage measurements on structures of varying channel width (data not shown) shows no significant dependence of erase voltage on device channel width as the channel width is varied from 500 to 150 nm. Erase voltage measurements on structures of varying nanofabric-to-contact terminal overlap lengths (data not shown) show no significant dependence of erase voltage on overlap lengths as overlap lengths are varied from approximately 800 to 20 min.

Figure 10B:
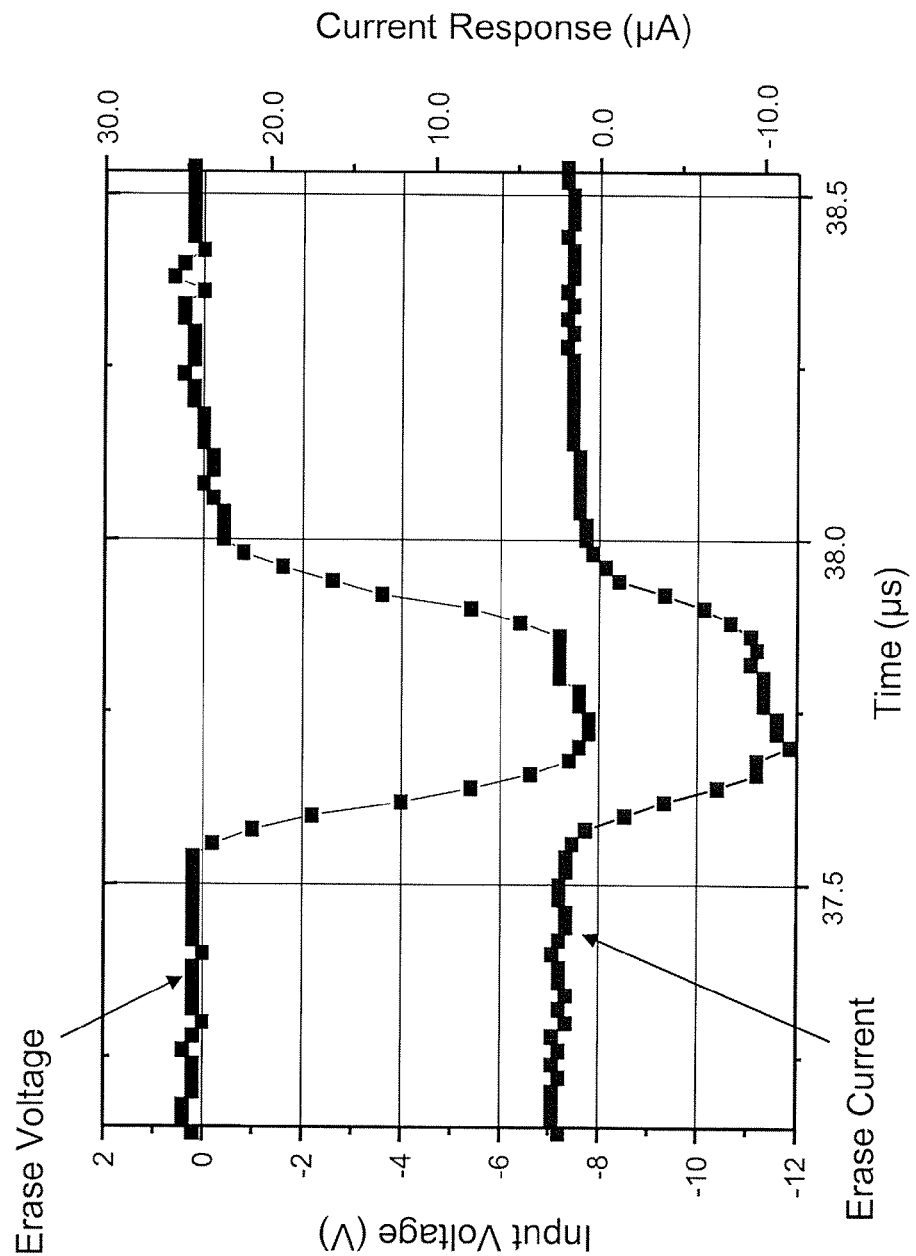
FIG. 10B is graphical representation of a nonvolatile nanotube switch illustrating erase voltage and erase current as a function of time, according to another embodiment of the invention.

FIG. 10B shows erase curves 125 of erase voltage and corresponding erase current as a function of time for a device with an erase voltage of 8 Volts and a corresponding erase current of 15 micro-Amperes. Note that a negative voltage was applied to the nonvolatile nanotube switch under test. Nonvolatile nanotube switches will work with positive or negative applied voltages and current flow in either direction. Erase currents are typically in the range of 1 to 20 uA, depending on the number of activate SWNTs in the nanofabric in the channel region. Programming currents are also typically in the 1 to 20 uA range. It has been observed for some NV NT Switches, that controlling current flow during programming can improve programming characteristics. Methods of controlling current flow are described further below with respect to FIG. 17; these methods may be applied to the control of current during both programming and erase operations. The erase data illustrated in FIG. 10B and corresponding measurement details are described in U.S. patent application Ser. No. 11/280,786. Typically, e-Fuse program currents are in the 10's of milli-Ampere range, so nt-Fuses reduce programming currents by approximately 1000x.

Figure 10C:
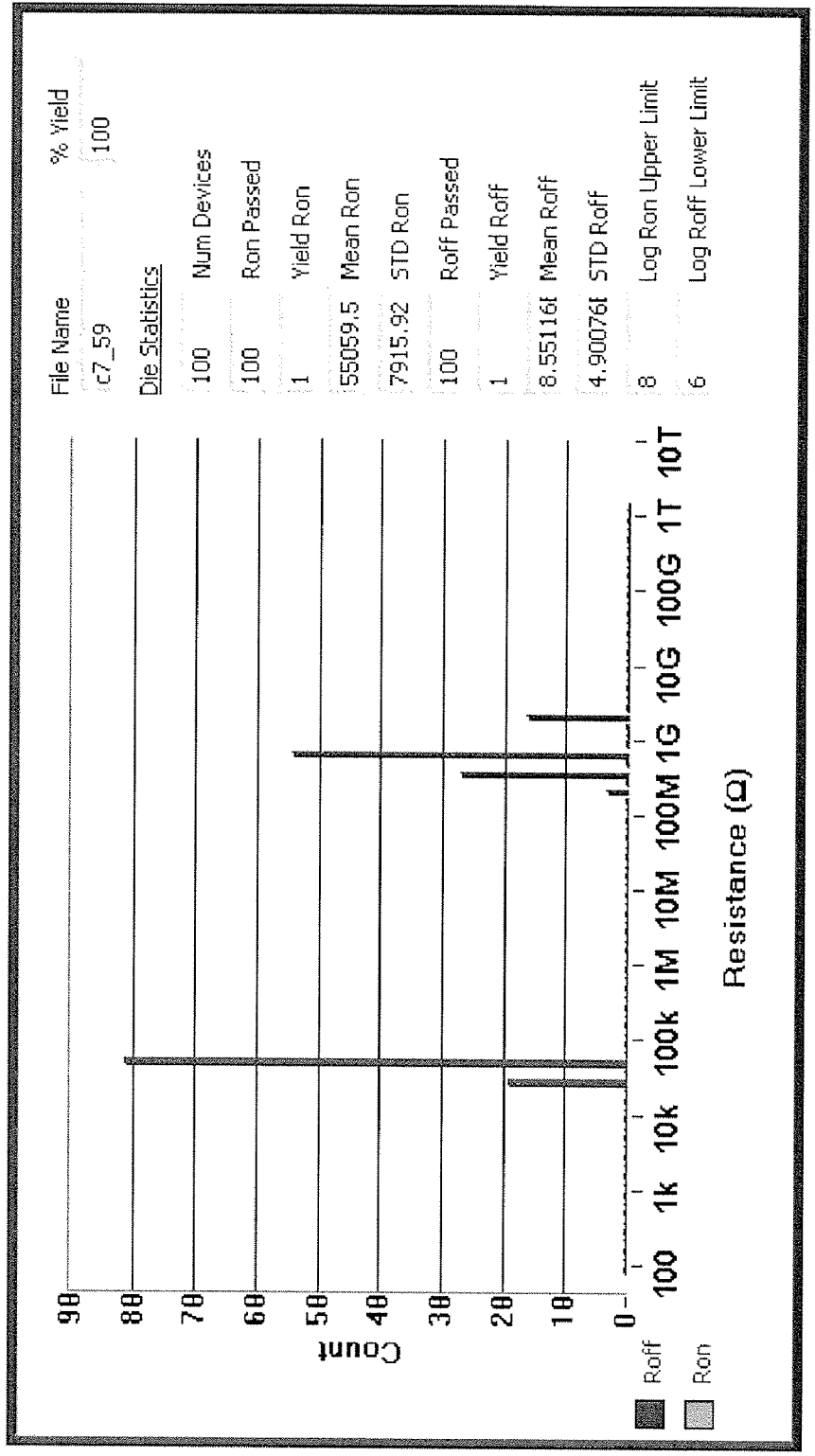
FIG. 10C is a graphical representation of a nanotube switch illustrating the ON state resistance and OFF state resistance measured during 100 cycles, according to another embodiment of the invention.

FIG. 10C illustrates recent cycling data 150 on a device having channel length of approximately 22 nm and channel width of approximately 22 nm. Devices with channel lengths of approximately 20 nm typically have erase voltages in the 4 to 5 volt range. The particular device illustrated in FIG. 10C has an erase voltage of 5 Volts, a programming voltage of 4 Volts, and was subjected to 100 erase/program cycles. The ON resistance ($R_{ON}$) is well under 100 kOhms, and the OFF resistance ($R_{OFF}$) is well above 100 MOhms.

Nonvolatile nanotube switches used as shadow devices in nonvolatile register files shown in FIGS. 1 and 2 require $10^4$ to $10^6$ operating cycles, for example, and therefore additional (redundant) nonvolatile register file stages are introduced as shown in FIG. 2. For latch circuit 82 NV NT Switches 83 in a OTP mode, a single program operation (see table 1 for program definition) on nonvolatile nanotube switch 83 used as a switch would have a nonvolatile nanotube switch yield approaching 100%. Even if nanotube switch 83 were exposed to a few ON/OFF cycles, its yield would still approach 100%.

The read operation for latch circuit 82 when using NV NT Switch 83 in strobing path 86 is the same as the read operation for latch circuit 70 using electronic fuse 71. Thus, if nonvolatile file latch stage K is to be included as a stage in nonvolatile register file 20 illustrated in FIG. 2, then NV NT Switch 83 in corresponding universal latch circuit 82 is left intact in a conducting state. Therefore, when corresponding latch circuit 82 is strobed, it transitions to a second logic state as described further above in which node 87 is at a low voltage and $V_{OUT}$ on node 88 is at a high voltage. If routing switch 30 is used in nonvolatile register file 20, then a positive voltage $V_{OUT}$ on output 88 is transmitted to select signal input SK, CMOS transfer gate TR1 is activated and CMOS transfer gate TR2 is deactivated as described further above with respect to FIG. 3A. Routing switch 30 connects input A with output C, which transmits the output of nonvolatile register file 20 stage K to the input of nonvolatile register file 20 stage K+1, thus including stage K in nonvolatile register file 20.

The read operation for latch circuit 82 when using NV NT Switch 83 in strobing path 86 is the same as the read operation for latch circuit 70 using electrical fuse 71. Thus, if nonvolatile file latch stage J is to be excluded as a stage in nonvolatile register file 20 illustrated in FIG. 2, then NV NT Switch 83 in corresponding latch circuit 82 is programmed to a nonconducting state. Therefore, when corresponding universal latch circuit 82 is strobed, it remains in a first logic state as described further above in which node 87 is at a high voltage and $V_{OUT}$ on node 88 is at a low voltage. If routing switch 30 is used in nonvolatile register file 20, then a low (near zero) voltage $V_{OUT}$ on output 88 is transmitted to select signal input SJ, CMOS transfer gate TR2 is activated and CMOS transfer gate TR1 is deactivated as described further above with respect to FIG. 3A. Routing switch 30 connects input B with output C, which bypasses the output of nonvolatile register file 20 stage J to the input of nonvolatile register file 20 stage J+1, thus excluding stage J in nonvolatile register file 20.

Note that with respect to universal latch circuit 82, if node 88 is positive and if both node 88 output is made available to select signal input SK and complementary node 87 output is made available to select signal input SKb of switch circuit 35, then stage K will be included in register file 20. However, if node 88 is zero is made available to signal input SJ and complementary node 87 output is made available to select signal input SJb of switch circuit 35, then stage J will be excluded in register file 20 as described further above with respect to latch circuit 70.

Note that latch 82 NV NT Switch 83 may changed from an ON state to an OFF state, then back to an ON state, then back to an OFF state any number of times. Therefore the setting of latch 82 may be changed multiple times if desired. This unique feature offered by latch 82 because of NV NT Switch 83 element offers useful flexibility at the module level for the manufacturer and for field upgradeable reconfigurable products.

Latch circuit 82 output node 88 corresponds to universal latch circuit 70 output node 78. Latch circuit 82 node 87, the complement of output node 88, corresponds to latch circuit 70 node 77. If the intrinsic latch trip resistance of latch circuit 82 is designed for 100 kOhms, then latch circuit 82 may be more sensitive to upset by cosmic-rays of alpha particles generated hole-electron pairs. Accordingly, ballast capacitor 89 may be added to output node 88, and ballast capacitor 89' may be added to complementary node 87. Ballast capacitor values may be 10 to 20° F., for example.

Nonvolatile Latch Circuit Selection Using Configuration Selection Circuit

Universal latch circuit 70 (FIG. 7), and latch circuit 82 (FIG. 8) described further above may be used as electronically programmed nonvolatile configuration latches 1 through N+M and supply a corresponding output signal S1 through S(N+M) illustrated in FIG. 2. A configuration selection circuit 26 (FIG. 2) may be used to determine the state of latch circuit outputs, thereby determining which nonvolatile register file stages are included in nonvolatile register file 20. Latch circuits 70 and 82 are universally applicable to memory, logic, digital and analog standalone and embedded products and not limited to the nonvolatile register file example. Note that latch circuit 40 (FIG. 4) does not require configuration selection circuit 26 because the state of latch circuit 40 is determined by laser ablation.

In one implementation, configuration selection circuit 26 may be decoder logic with control input as used in memory array spare row or column selection. The use of reconfiguration latch circuits to substitute redundant row and column lines for row and column lines in memory arrays in DRAM and SRAM memories is described in a reference book by Itoh, Kiyoo, "VLSI Memory Chip Design", Springer-Verlag Berlin Heidelberg 2001, pp. 178-183, the entire contents of which are incorporated herein by reference.

In an alternative implementation, configuration selection circuit 26 may utilize a configuration control register such as described in U.S. Pat. No. Re. 34,363. A configuration control register was chosen as configuration selection circuit 26 in this example because of ease of integration with nonvolatile register file latch stages to form nonvolatile register file 20 shown in FIG. 2.

Figure 11:
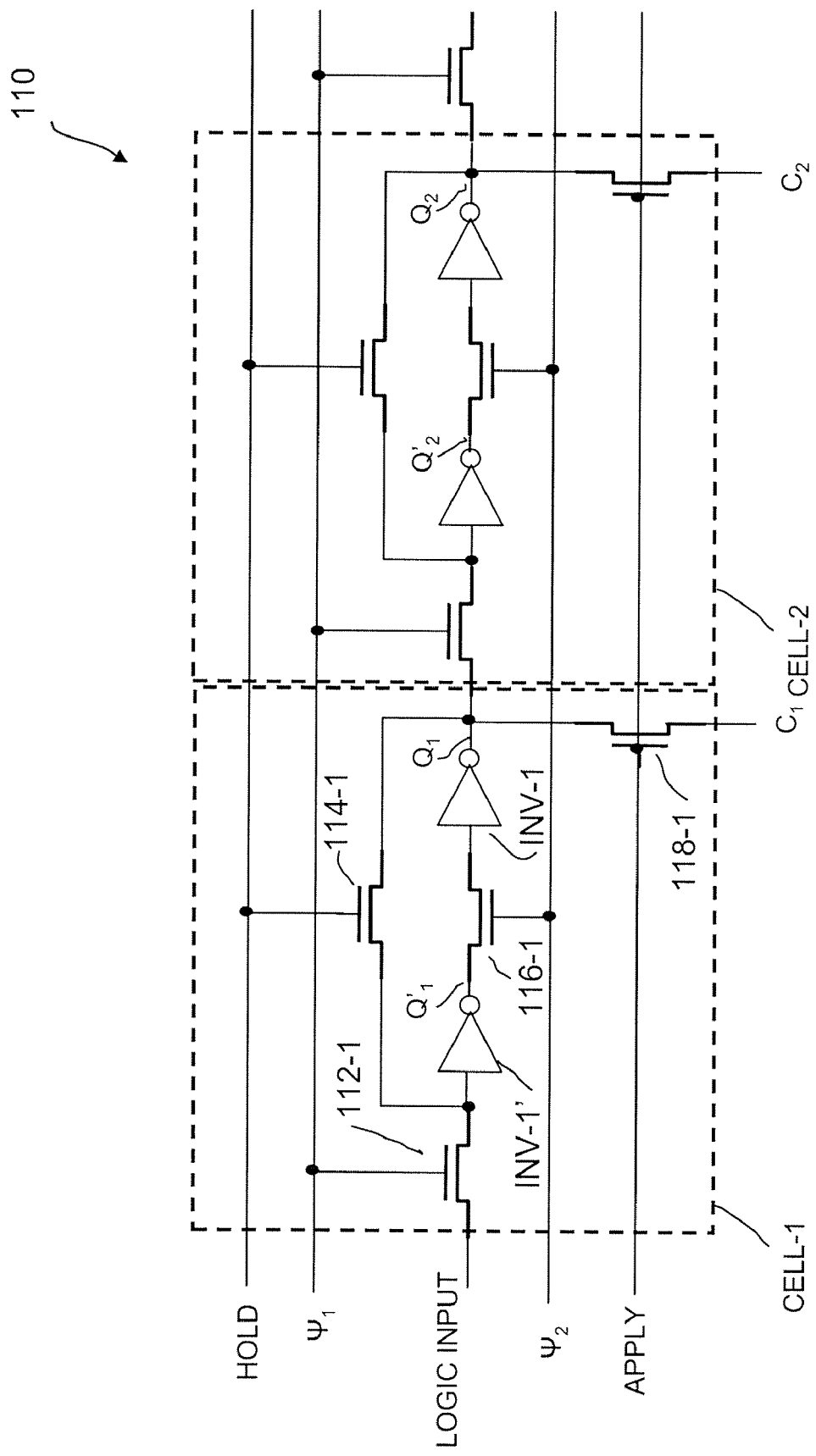
FIG. 11 is a schematic representation of a configuration control register, according to another embodiment of the invention.

FIG. 11 illustrates a representation of a configuration control register 110 showing two stages of a multistage shift register described in more detail in US Pat. No. Re. 34,363. Configuration control register 110 shows two shift register cells, however, an actual configuration control register contains as many cells as required to conFigure the logic element, in this example N+M shift register cells. A basic shift register cell includes transfer device 112-1 in series with inverter INV-1', in series with transfer device 116-1 which is in series with inverter INV-1. The output of inverter INV-1 is fed back to the input of inverter INV-1' through transfer device 114-1 enabling CELL-1 to store a logic state as long as a power source is maintained (volatile shift register operation) to configuration control register 110 and the HOLD voltage is held high. The output of inverter INV-1 also connects to the input of shift register CELL-2, which is identical to shift register cell 1, and also connects to one terminal of transfer device 118-1. The output of inverter INV-1' connects to the input of transfer device 116-1. Two non-overlapping clocks $\Psi_1$ and $\Psi_2$ connect to control gates of transfer device 112-1 and 116-1, respectively, and to corresponding transfer devices in other shift register cells. Transfer device 114-1 and corresponding devices in other cells enable or disable the feedback path between INV-1 output and INV-1' input depending on the state of the HOLD input. Redundancy data is transmitted to configuration control register 110 by a LOGIC INPUT signal. When APPLY control input is activated, the output C1, C2, . . . C(N+M) is transferred to the programming inputs of latches such as latch 70 and latch 82, for example. In this example, configuration control register 110 is used as configuration selection circuit 26 in FIG. 2.

In operation, the entire configuration control register 110 may be set to a high or low voltage by setting $\Psi_1$ and $\Psi_2$ voltage high and HOLD voltage low. With HOLD set at a high voltage, clocks $\Psi_1$ and $\Psi_2$ may be used to transfer a logic pattern of 1 and 0 into the shift register to program (or not program) nonvolatile configuration latches 1 . . . N+M based on test results (a yield map). Enough time should be allowed for the INPUT signal to propagate the entire length of configuration control register 110. At that point in time, APPLY may transition to a positive voltage and inverter outputs C1, C2, . . . C(N+M) are transferred to corresponding configuration control latches 1 . . . N+M.

Referring to FIG. 2, configuration control register 110 may be used as configuration selection circuit 26 for nonvolatile register file 20 with output C1 . . . C(N+M) controlling the state of nonvolatile configuration latch 1 . . . nonvolatile configuration latch (N+M). Nonvolatile configuration control latches 1 . . . (N+M) are programmed to hold corresponding configuration control register 110 logic states.

If latch circuit 70 is used as a nonvolatile configuration control latch, then an OTP state is stored in each nonvolatile configuration latch, and individual nonvolatile file register stages are selected from the N+M individual nonvolatile file register stages and interconnected to form nonvolatile register file 20. This register file configuration may not be changed.

Alternatively, if latch circuit 82 is used as a nonvolatile configuration control latch state, then a nonvolatile ON or OFF state is stored in NV NT Switch 83. Because NV NT Switch 83 is a nonvolatile nanotube switch, NV NT Switch 83 may be cycled between ON and OFF states multiple times such that configuration control latches may be cycled through several logic states, and therefore the configuration of nonvolatile register file 20 may be changed from its initial state, even in the field.

Figure 12:
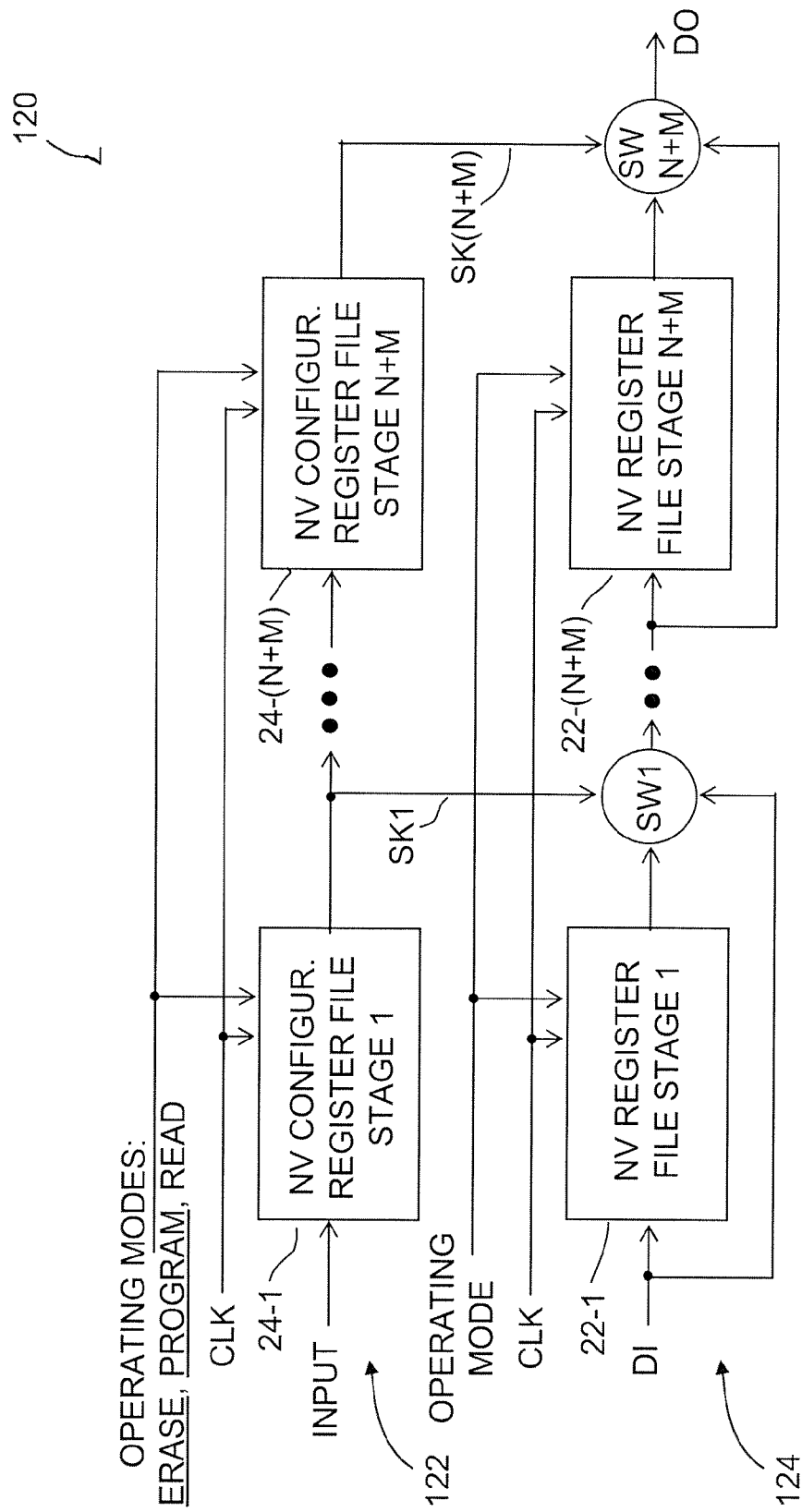
FIG. 12 is an alternative (to FIG. 2) schematic representation of the nonvolatile register file of FIG. 1A with additional redundant nonvolatile register file stages and corresponding selection circuitry, according to another embodiment of the invention.

Nonvolatile Signal Sources Based on Nonvolatile Register Files Using Nonvolatile Nanotube Switches as Programming Means It is possible to replace configuration selection circuit 26 and nonvolatile configuration latches 1 through N+M in FIG. 2 by a nonvolatile configuration file 122 including nonvolatile configuration register file stages 1 through N+M with outputs S1 through S(N+M) as illustrated in FIG. 12. The combination of nonvolatile configuration register 122 with nonvolatile register file 124 forms nonvolatile register file 120. Nonvolatile register file 120 corresponds to nonvolatile register file 20.

In a first configuration of nonvolatile configuration control register 122 including nonvolatile configuration control register file stage 1 . . . stage (N+M), input data in the form of an input data stream of logical "1's" and "0's is loaded into register 122. Nonvolatile configuration register file stages are identical to nonvolatile register file stages. However, the number of cycles is limited. For example, for an OTP operation, in this case erase ("programming" in latch terminology), is performed only once (½ cycle) on selected nonvolatile nanotube switches. Yield is high, between 99 and 100% for example, and outputs S1 through S(N+M) select or deselect (bypass) nonvolatile register files stages in a corresponding approach described further above with respect to latch circuits 70, and 82. With respect to latch circuit 70, only OTP programming is possible because of the electronic fuse blow approach. With respect to latch circuit 82, several operating cycles are possible because electronic blow fuses are replaced with nonvolatile nanotube switches.

In operation, this first configuration nonvolatile configuration register 122 may be changed several times by undergoing erase and programming cycles using the operating mode input as described with respect to FIG. 1. By limiting changes to a few cycles, 1 to 3 cycles, for example, nonvolatile configuration control register 122 yield remains between 99% and 100%, while providing the ability to conFigure nonvolatile register files (include or exclude (bypass) various stages) at the factory or to reconfigure nonvolatile register files (to change included/excluded stages) in the field after product shipment as needed.

Figure 13A:
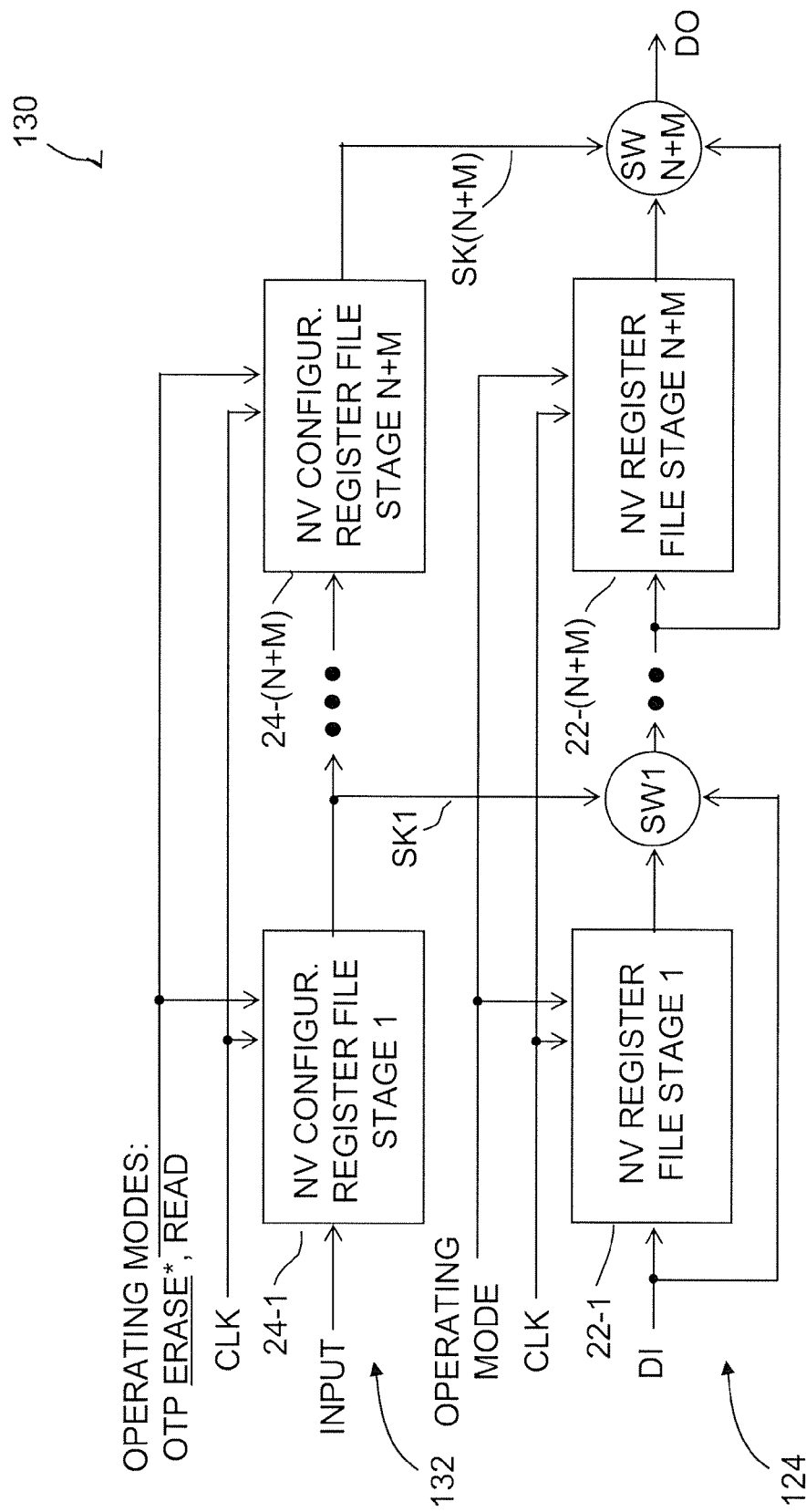
FIG. 13A is an alternative (to FIG. 12) schematic representation of the nonvolatile register file of FIG. 1A with additional redundant nonvolatile register file stages and corresponding selection circuitry, according to another embodiment of the invention.
Figure 13B:
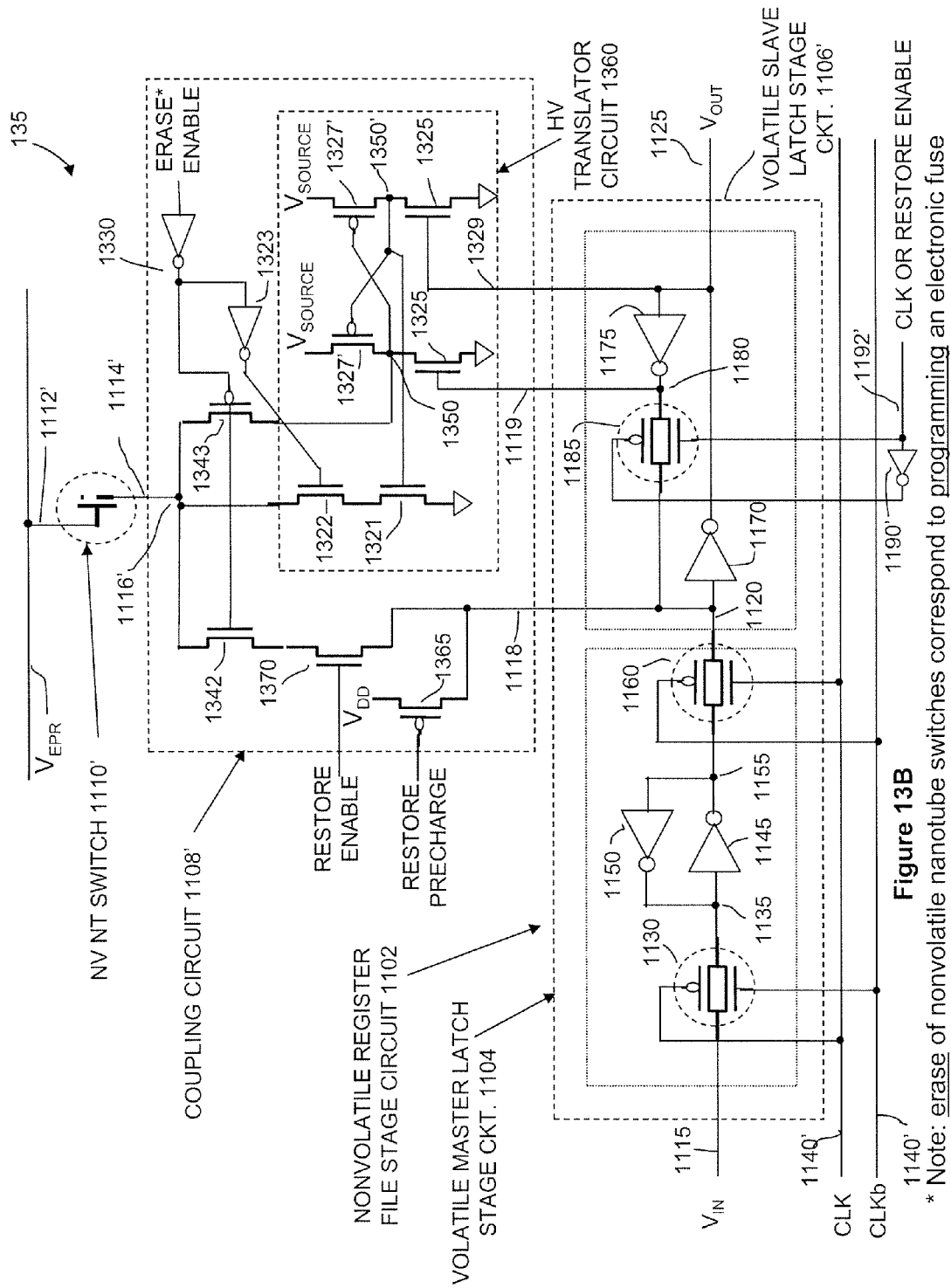
FIG. 13B is a circuit representation of nonvolatile configuration control register used in FIG. 13A, according to this embodiment of the invention.

Nonvolatile Signal Sources Based on New Configuration Serial Latches Using Nonvolatile Nanotube Switches as Programming Means In a second configuration, nonvolatile configuration control register 132 is illustrated in FIG. 13A. Register 132 is a modified version of register 122 such that only one erase ("program" in latch terminology) ½ cycle may be performed to enhance corresponding nonvolatile nanotube switch yield in the 99 to 100% range as described further below with respect to FIG. 13B. Note that in FIG. 13A, erase of nonvolatile nanotube switches correspond to programming an electronic fuse. FIG. 13B is a modified version of register stage 15 in FIG. 1B. Nonvolatile configuration register file 132 receives input data in the form of an input data stream of logic "1s" and "0"s that is loaded into register 132. Nonvolatile configuration register file stages are a modified version of nonvolatile file stages described further above with respect to FIG. 1B such that only one erase ½ cycle operation is permitted in order to enhance yield to the 99 to 100% range. In this sense, nonvolatile configuration register file 132 operation is similar to the operation of nonvolatile configuration register file 122 when operated in an OTP mode, allowing an erase ("programming" in latch terminology) ½ cycle; and is also similar to FIG. 2 with configuration selection circuit 26 using configuration control register 110, for example, and nonvolatile configuration latches 1 . . . (N+M) using latch circuit 70 or latch circuit 82 to supply control signals S1 . . . S(N+M).

In operation, this second nonvolatile configuration register 132 may be changed only once using a half cycle erase operation. This operating mode is described further below with respect to FIG. 13B.

OTP nonvolatile register latch 135 is a modification of nonvolatile register file 15 illustrated in FIG. 1B, in which erase-enable-NFET 1320 is eliminated and replaced with NFETs 1321, 1322, and inverter 1323 and corresponding connections. One terminal of NFET 1321 is connected to ground and other terminal is connected to NFET 1322, which is in turn connected to node 1116'. The input to NFET 1321 is controlled by output 1350' of high voltage translator circuit 1360', and the input of NFET 1322 is controlled by the output of inverter 1323. The input of inverter 1323 in connected to the output of inverter 1330, which also drives the gate of PFET 1343.

In operation, PROGRAM ENABLE of nonvolatile register file stage 15 shown in FIG. 1B has been eliminated and converted to an OTP ERASE ENABLE input as shown in nonvolatile configuration control stage 135 shown in FIG. 13B. Programming has been eliminated and one erase half-cycle is permitted.

Nonvolatile Signal Control Sources Based on Nanotube Nonvolatile Latches Used to Optimize Critical Path Timings for Higher Speed with in Creased Yield Nonvolatile register files described further above include high speed volatile registers, typically comprising a master and slave latch per stage, and a nonvolatile nanotube switch (NV NT Switch) coupled to each slave latch, for example. The NV NT Switch may be directly coupled to the slave latch, or may be coupled using a coupling circuit. In addition to optimizing the yield of nonvolatile operation of nonvolatile register file latches as described further above, there is a need to optimize the high speed performance of volatile registers as well. Also, not all register files need to be nonvolatile. However, register files require high speed (high clock speed) synchronous operation.

At high clock speeds, in excess of 1 GHz for example, the yield of register latches is reduced due to device parameter variations that cause logic delays or cache delays. Such parameter variations occur from lot-to-lot during fabrication and also change under field use. For example, a synchronous CPU and on-board cache may require a cache access time of 170 ps or even less, for example, to ensure that the data read from the cache is ready at the CPU terminals one clock cycle after a CPU data request is initiated.

A variable delay circuit may be introduced in critical clocking and/or signal paths to optimize performance and minimize yield loss due to lot-to-lot parameter variation during fabrication and parameter changes (such as parameter drift) during product operation in the field. Latch circuits with nonvolatile nanotube switches (NV NT Switches) that may be in an ON state, an OFF state, and toggled between ON and OFF states are used to optimize critical timing paths.

Figure 14A:
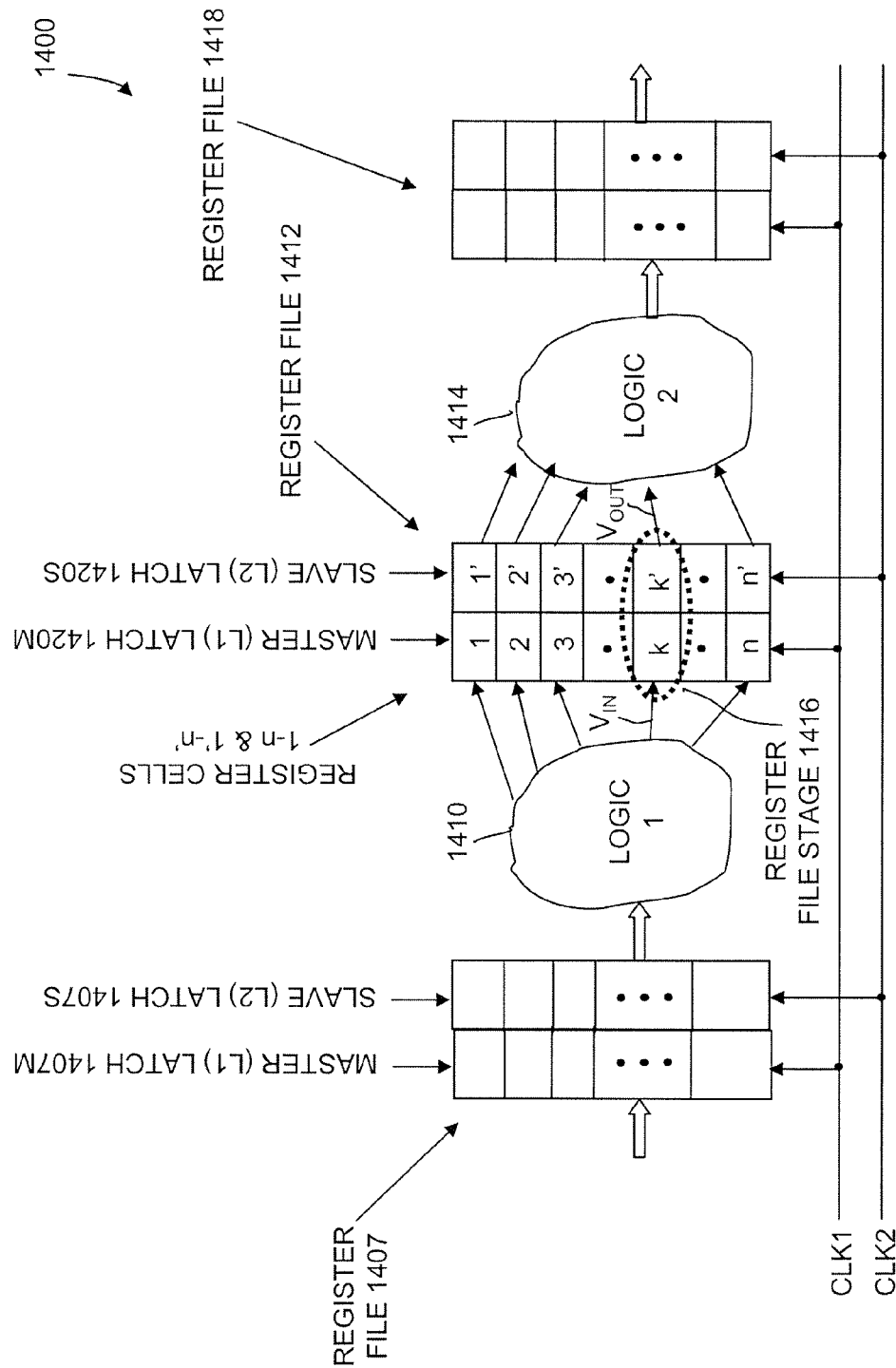
FIG. 14A illustrates a synchronized register file architecture application, according to another embodiment of the invention.

FIG. 14A illustrates pipelined synchronous logic function 1400 using two nonoverlapping clocks CLK1 and CLK2, including asynchronous logic stages 1410 and 1414 (and others not shown) separated by register files 1407, 1412, 1418 (and other register files not shown) operated in a synchronous mode and designed for state-of-the-art high speed operation. Exemplary register 1412 is composed of a master (L1) latch 1420M and a slave (L2) latch 1420S. Master (L1) latch 1420M is composed of register cells 1-$n$ and slave (L2) latch 1420S is composed of cells 1'-$n$'. A register stage is composed of a corresponding pair of register cells, such as register stage 1416 composed of corresponding register cells k and k'. It is important to note that logic stages 1410 and 1414 may be composed of asynchronous random logic stages, for example, or may be a synchronous onboard cache such as a high speed Sync SRAM L1 cache, for example. A master (L1) latch such as master (L1) latch 1420M accepts data from preceding logic stage 1410 when activated by clock CLK1, captures and holds the input data. A slave (L2) latch such as slave (L2) latch 1420S accepts information from a corresponding master (L1) latch 1420M when activated by clock CLK2, transmits the information to the next logic stage 1414, and then latches the information near the end of the CLK2 clock cycle. Examples of register (latch) design are illustrated in the reference H. B. Bakoglu, "Circuits, Interconnections, and Packaging for VLSI", Addison-Wesley Publishing Company, Inc, pp. 338-349, the entire contents of which are incorporated herein by reference.

Variations in process parameters that cause variation in transistor electrical characteristics and interconnect line resistance and capacitance may result in logic race conditions that introduce logic errors. For example, logic 1 in FIG. 14A may include one or more logic paths with relatively long delay times that prevent completion of a logic operation before a CLK1 transition results in logic 1 state sampling by master (L1) latch 1420M. Premature sampling of a logic 1 state results in the latching and transmission of an incorrect logic state. Such a race condition problem may only occur in one particularly sensitive logic circuit, such as logic 1 in this example, or on several logic circuit paths. Critical design paths sensitive to parameter variations are usually known as a result of logic simulation. Allowances are made in clock CLK1 and CLK2 timings to avoid such race condition problems. However, as clock rates in crease from 1 Gb to 2 Gb to greater than 5 Gb, for example, then performance optimization becomes more critical and yield loss may occur at high clock rates.

Figure 14B:
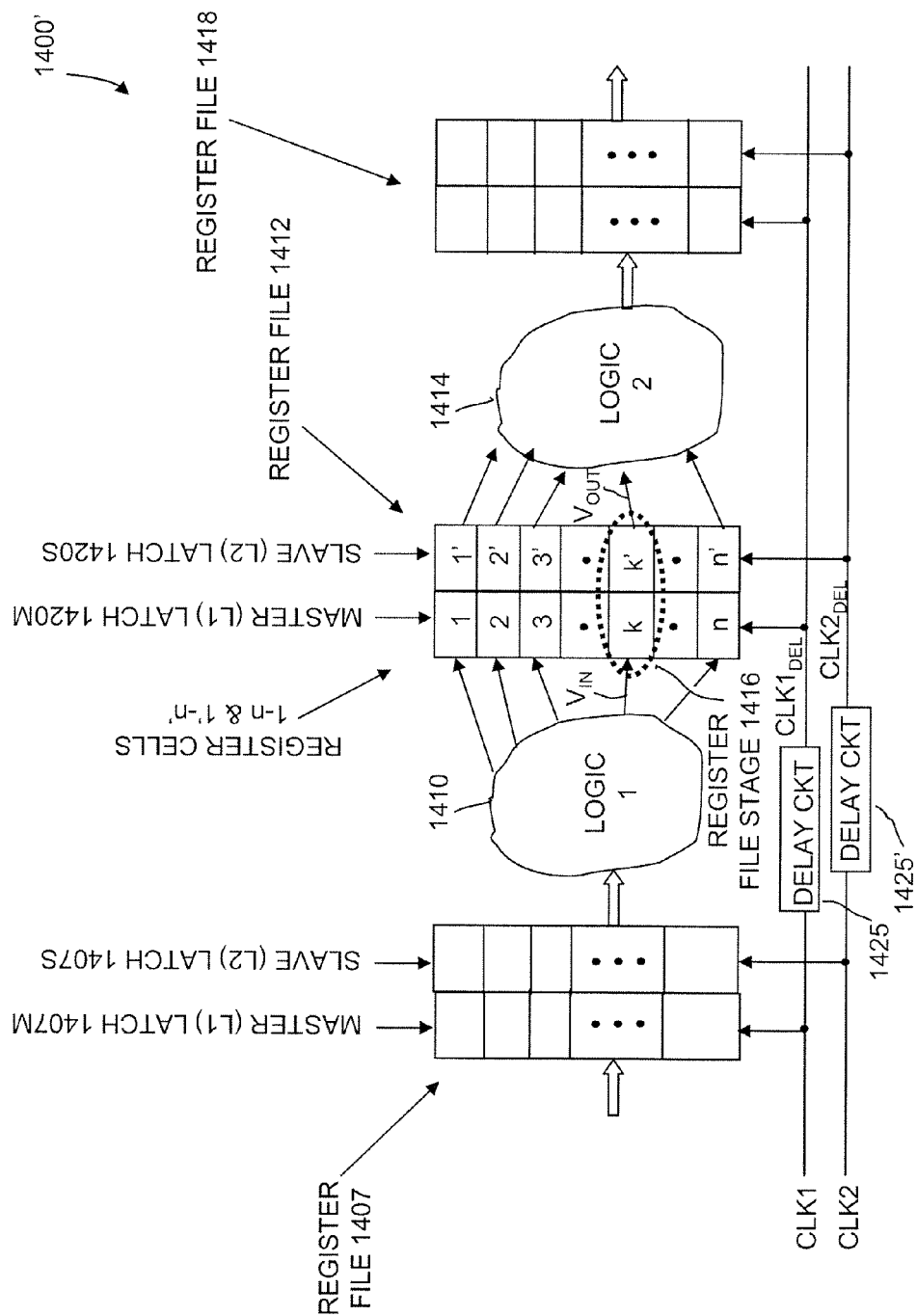
FIG. 14B illustrates synchronized register file architecture with controlled delay circuits to optimize clock timing, according to another embodiment of the invention.

FIG. 14B illustrates a performance optimized pipelined synchronous logic function 1400'. Controllable delay circuits 1425 and 1425' have been added in CLK1 and CLK2 clock signal paths, respectively, in order to delay the transition of master (L1) latch 1420M sampling of the logic state of logic 1 circuit, and to also delay the transition time of slave (L2) latch 1420S with respect to master (L1) latch 1420M. Controllable delay circuit elements may be added to one or more timing critical (or sensitive) signal paths or to all signal paths. The clock signal delay introduced by controllable delay circuits 1425 and 1425' circuit examples are described further below.

FIG. 15A illustrates a synchronous CPU and Cache system 1500 including CPU 1510 and Cache 1515, with CPU and Cache synchronized by lock signal CLK. Memory address locations and control signals are provided to cache 1515 by CPU 1510, and data may be stored by CPU 1510 in Cache 1515 using a write operation, or data may transferred from Cache 1515 to CPU 1510 using a read operation. FIG. 15B illustrates a timing diagram 1525 for a high performance cache read operation in which cache data is available to CPU 1510 one clock cycle after data request. Clock 1530 transitions from low to high voltage at a data request time. At the time of the data request clock transition, control signals identify the desired operation, in this illustration a read operation. Also, addresses are valid. Cache 1515 completes the read operation in one clock cycle and makes data output $V_{DATA}$ available in valid data window 1535 often referred to as the "data eye". Clock 1530 data capture transition for CPU 1510, one cycle after the clock 1530 request transition, is timed to occur in the center of the data window 1535. FIG. 15A adapted from the reference K. Itoh, "VLSI Memory Chip Design", Springer, 2001, pp. 358-363, the entire contents of which are incorporated herein by reference.

Output driver 1520 receives signal $V_{SIG}$ through the cache 1515 on-chip data path. Output driver 1520 is shown as a tristate driver; however, a non-tristate may be used in some applications. Tristate drivers are well known in the industry, see for example, R. J. Baker "CMOS: Circuit Design, Layout, and Simulation, IEEE Press, 1598, p. 226, the entire contents of which are incorporated herein by reference. An output inverter (driver) is formed using NFET transistor T1 and PFET transistor T2, with respective T1 and T2 gates electrically connected to common inverter input 1522, and T2 drain and T1 drain connected to common output terminal 1523. The drain of tristate PFET T4 is connected the source of T2, the source of T4 is connected to a power supply such as $V_{DD}$, and the gate of T4 is connected to the output of inverter INV whose input is connected to common tristate input 1524. The drain of tristate NFET T3 is connected to the source of T1, the source of T3 is connected to ground, and the gate of T3 is connected to common tristate input 1524.

In operation, if tristate driver 1520 has tristate mode activated, $V_{TRI-STATE}=0$ volts, and T4 and T3 are an OFF state. Output node 1523 cannot be connected to power supply $V_{DD}$ or to ground for any value of signal $V_{SIG}$. Thus, the node 1523 voltage is not defined by tristate driver 1520, but may instead be set by other tristate drivers (not shown) that share node 1523. When cache 1515 is activated by a request for data as illustrated in FIG. 15B, then the cache memory controller causes $V_{TRI-STATE}$ to transition from zero to a positive voltage that turns T3 and T4 transistors to an ON state. In this tristate de-activated mode, transistor T2 drain is connected to $V_{DD}$ through transistor T4 and transistor T1 source is connected to ground through transistor T3, and $V_{SIG}$ controls $V_{DATA}$ output signal on node 1523. In response to a CPU 1510 data request as illustrated in FIG. 15B, inverter drive signal $V_{SIG}$ is provided by the cache 1515 on-chip data path that may include predriver stages (not shown).

In operation, variations in transistor parameters due to fabrication, as well as parameter drift during operation over time in the field, can result in variability in the location of valid data window 1535. FIG. 15D waveforms 1540 illustrate fast data path valid data window 1545 in which output data $V_{DATA}$ is available early in the clock 1530 cycle. Clock 1930 read data transition occurs at the trailing edge of valid data window 1545 where data may be faulty as illustrated in FIG. 15D. FIG. 15E waveforms 1540' illustrates slow data path valid data window 1550 in which output data $V_{DATA}$ is available late in the clock 1530 cycle. Clock 1530 read data transition occurs at the leading edge of valid data widow 1550 where data may be faulty as illustrated in FIG. 15E. What is needed is a way to minimized valid data window variations to optimize system performance, yield, and reliability.

FIG. 15F illustrates synchronous CPU and cache system 1500' in which cache 1515 of synchronous CPU and Cache system 1500 has been modified by adding a controllable delay circuit element to optimize the valid data window for cache 1515' data output $V_{DATA}$. A controllable delay circuit element, or more than one controllable delay circuit element, may be added in the cache 1515' data path between sense/latch circuits and output drivers.

FIG. 15G illustrates one approach in which controllable delay circuit 1560, with controllable delay circuit 1560 input connected to data signal $V_{SIG}$, and controllable delay circuit output connected to common inverter input 1522' of output driver 1520'. Controllable delay circuit 1560 is described further below. $V_{SIG}$ input to common inverter input 1522' is delayed by a controlled amount of time set by controllable delay circuit 1560. Output data signal $V_{DATA}$ on common output terminal 1523' is delayed by a time corresponding to the $V_{SIG}$ time delay set by controllable delay circuit 1560. With the exception of the addition of controllable delay circuit 1560, the circuit elements, interconnection of elements, and operation of output driver 1520' corresponds to the description of output driver 1520. The timing of $V_{TRI-STATE}$ may be adjusted if needed (not shown).

In operation, variability in the location of the valid data window because of variations in transistor parameters due to fabrication, as well as parameter drift during operation over time in the field, are eliminated as illustrated by waveform 1540" in FIG. 15H. Waveform 1540" illustrates waveform $V_{DATA}$ with CLK 1930 data capture transition in the center of valid data window 1555.

Figure 16:
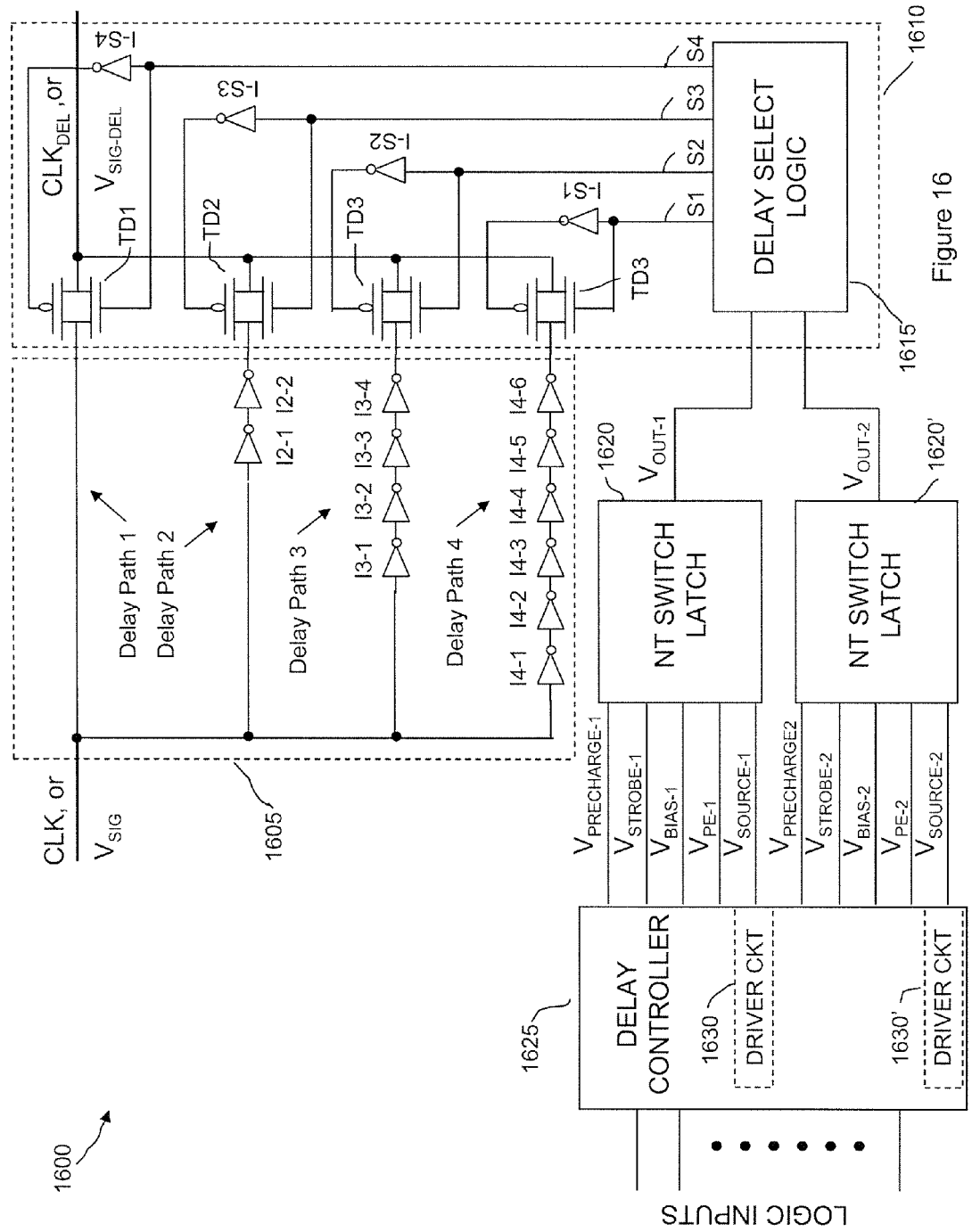
FIG. 16 illustrates a delay control circuit that uses nonvolatile nanotube switch-based latches for timing control, according to another embodiment of the invention.

FIG. 16 illustrates controllable delay circuit 1600 which is designed to accommodate to select one of four delay paths 1-4. For example, clock CLK may be delayed resulting in $CLK_{DEL}$, or signal $V_{SIG}$ may be delayed resulting in signal $V_{SIG\_DEL}$ Chips may contain multiple controllable delay circuits 1600.

In one example, controllable clock delays may be introduced in pipelined synchronous logic functions such as pipelined synchronous logic function 1400' illustrated in FIG. 14B, where controllable delay circuit 1600 may be used as controllable delay circuits 1425 and 1425'.

In another example, controllable signal delay may be introduced in a synchronous CPU and cache system 1500' illustrated in FIG. 15, where controllable delay circuit 1600 is used as controllable delay circuit 1560. CPU 1510 may operate at a clock frequency of 2 GHz with a one clock cycle cache 1515' access time of 170 ps. Therefore, from CPU 1510 data request to cache 1515' data available is 170 ps. Assuming the valid data window is 150 ps, delay paths 1-4 may be set as follows: path 1 approximately zero; path 2 as approximately 30 ps; path 3 as approximately 80 ps; and path 4 approximately 150 ps. Controllable circuit delay 1600 selects one of data paths 1-4 to position the center of valid data window 1555 at or near clock 1530 data transition time as illustrated by waveforms 1540" in FIG. 15H.

FIG. 16 includes delay circuits 1605 with four delay paths 1-4, although a greater or lesser number of delay paths (or options) may be included. The input to delay circuit 1605 is a clock CLK or signal $V_{SIG}$ waveform to be delayed by a controlled amount. Logic delay block 1610 outputs a corresponding delayed clock $CLK_{DEL}$ or delayed signal $V_{SIG-DEL}$ waveform by selecting one of four (in this example) delay paths 1-4. Delay select logic 1615 provides delay select signals S1, S2, S3, and S4 that are used to select one of four CMOS transfer devices TD1, TD2, TD3, or TD4. Corresponding inverters I-S1, I-S2, I-S3, and I-S4 generate complementary S1, S2, S3, and S4 logic signals, respectively, to enable both true and complement select signals at each of the CMOS transfer devices TD1 . . . TD4.

Delay select logic 1615 inputs $V_{OUT-1}$, and $V_{OUT-2}$ are used to select one of four select signals S1 . . . S4. $V_{OUT-1}$ and $V_{OUT-2}$ are outputs of NT Switch Latch 1620 and NT Switch Latch 1620', respectively. NT Switch Latch 1620 and 1620' correspond to latch circuit 82 illustrated in FIG. 8, which include nonvolatile nanotube switches 83 that use scaled nanotube fuses (nt-Fuses) and may be programmed and erased multiple times. Terminology described further above is used. For example, in a latch circuit application, transition from an ON to OFF state transition is referred to as programming (erase in NV NT Switch) and OFF to ON is referred to as erasing (programming in NV NT Switch). Input signals $V_{PRECHARGE}$, $V_{STROBE}$, $V_{BIAS}$, $V_{PE}$, and $V_{SOURCE}$ are described further above with respect to latch 82. These input signals are supplied by delay controller 1625. The logic inputs to delay controller 1625 are used to select one of four delay paths 1-4 by enabling the programming of each of the NT Switch latches 1620 and 1620' to a programmed or erased state with $V_{OUT-1}$ in a high or low voltage state, and $V_{OUT-2}$ in a high or low voltage state as described further above with respect to latch 82. Driver circuit 1630 and 1630' generate $V_{SOURCE}$ signal inputs as described further below. Logic inputs to delay controller 1625 may be supplied through logic (not shown) by testers in a fabricator and/or may be supplied by on-board built-in self-test (BIST) test engines (not shown) for field upgraded performance optimization.

With respect to delay circuits 1605 illustrated in FIG. 16, delay path 1 is approximately zero; delay path 2 may be set at 30 ps if inverters I2-1 and I2-2 are each designed for 15 ps; delay path 3 may be set at 80 ps if inverters I2-1, I3-2, I3-3, and I3-4 are designed for 20 ps delay; and delay path 4 may be set at 150 ps if inverters I4-1, I4-2, I4-3, I4-4, I4-5, and I4-6 are designed for 25 ps delay. CMOS inverter designs follow known industry practices. With respect to waveforms 1540" illustrated in FIG. 15H, for a valid data window 1555 of 150 ps, for example, choosing one of delay paths 1-4 may place clock 1530 data timing transition at or near the mid-point of valid data window 1555. Circuit 1605 may be designed with more data paths or combinations of data paths for more precise signal delay control increments.

Driver circuits 1630 and 1630' are activated when changing the state of NV NT Switches such as NV NT Switches 83 in latch circuit 82 illustrated in FIG. 8, where latch circuit 82 operation corresponds to the operation of nonvolatile NT Switch Latches 1620 and 1620' as described further above. Three driver circuits 1630 and 1630' examples are provided in FIG. 17. A first driver circuit 1700 illustrated in FIG. 17A uses a voltage translator circuit to provide an output source voltage $V_{SOURCE}$ (corresponding to $V_{SOURCE-1}$ and $V_{SOURCE-2}$ illustrated in FIG. 16) without current control. A second driver circuit 1700' illustrated in FIG. 17B uses a voltage translator to provide an output voltage $V_{OUT}$, and also a means of controlling output current I using a voltage $V_{I-CONTROL}$ applied to the gate of a series transistor to limit current flow as needed. A third driver circuit 1700" illustrated in FIG. 17C uses a voltage translator to provide a voltage output to a current mirror that in turn controls the output current I associated with the V output.

Driver circuits 1630 and 1630', which may utilize driver circuits 1700, or 1700', or 1700", for example, may alter the state of a NV NT Switch in each of NV Switch latches 1620 and 1620' and thus determine the state of $V_{OUT-1}$ and $V_{OUT-2}$ (high voltage or low voltage) as illustrated in table 3. A high voltage (HIGH V) output corresponds to a NV NT Switch in the ON position, and low voltage (LOW V) output corresponds to a NV NT Switch in the OFF position as described further above with respect to latch circuit 82 illustrated in FIG. 8. NV NT Switch cycling results 16 illustrated in FIG. 1C show a NV NT Switch operating range having ON resistance $R_{ON}$ in approximately a range of 10 kOhm to 50 kOhm, and an OFF resistance $R_{OFF}$ of greater than 10 GOhms.

TABLE 3

| $V_{OUT-1}$ | $V_{OUT-2}$ | S1 | S2 | S3 | S4 |
|---|---|---|---|---|---|
| HIGH V | HIGH V | X | | | |
| HIGH V | LOW V | | X | | |
| LOW V | HIGH V | | | X | |
| LOW V | LOW V | | | | X |

FIG. 17 illustrates circuits that may be used to limit current during nonvolatile nanotube switch change of state when supplying $V_{SOURCE}$ to a NT switch latch as illustrated in FIG. 16, or to NRAM memory array bit lines such as NRAM memory array bit lines illustrated in U.S. patent application Ser. Nos. 11/280,786 and 11/280,599. Current limiting is most useful during transitions from OFF-to-ON state, typically referred to as a program NV NT switch operation, and not typically used for ON-to-OFF state transitions, typically referred to as an erase NV NT switch operation. NV NT switch ON and OFF resistance cycling results 16 illustrated in FIG. 1C was activated by a programmable laboratory voltage source with current limiting during program OFF-to-ON state transition from greater than 10 GOhms to an ON resistance range of 10 kOhms to 50 kOhms.

Figure 17A:
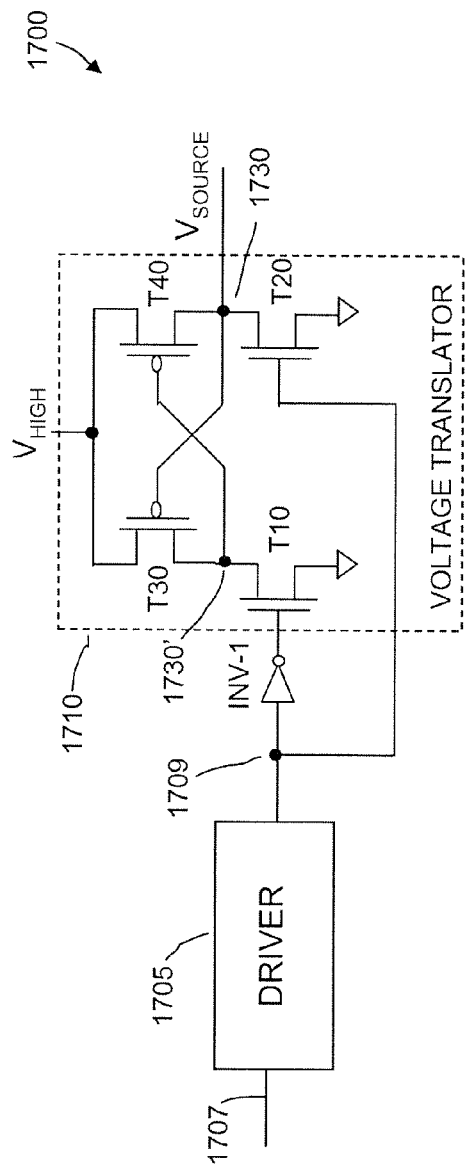
FIG. 17A illustrates a driver circuit used to change the state of nonvolatile nanotube switches in latch circuits using a voltage source, according to another embodiment of the invention.

Driver circuit 1700 illustrated in FIG. 17A incldes driver 1705, an inverter INV-1, and voltage translator 1710. Driver 1705 has an input 1707 supplied by a delay controller such as delay controller 1625. The output 1709 of driver circuit 1700 drives the gate of NFET T20, and the input of inverter INV-1 whose output drives the gate of transistor T10.

Voltage translator 1710 includes NFETs T10 and T20 with source connected to ground and drains connected to the drains of PFETs T30 and T40, respectively. The sources of PFET T30 and T40 are both connected to voltage source $V_{HIGH}$. $V_{HIGH}$ may range from a typical value of 8 volts to less than 5 volts depending on the channel length of the NV NT Switches used in latch circuits 1620 and 1620' as illustrated by curves 100 in FIG. 10A. The gate connections of PFETs T30 and T40 are cross coupled. The output voltage $V_{SOURCE}$ on voltage translator 1710 output terminal 1730 controls the output voltage without additional current control circuits. Terminal 1730 is connected to one terminal of a NV NT Switch in a latch circuit, for example, terminal 84 of latch circuit 82 illustrated in FIG. 8.

In operation, if the output of driver 1705 is a positive voltage, 2.5 volts for example, then NFET T20 is ON and NFET T10 is OFF. Output terminal 1730 is at ground turning PFET T30 ON, which drives terminal 2130' to $V_{HIGH}$ turning PFET T40 OFF. $V_{SOURCE}$ is at zero voltage. However, if driver 1705 is at zero volts, then NFET T20 is OFF and NFET T10 is ON. Terminal 1730' is at zero volts, which turns PFET T40 ON which drives terminal 1730 to $V_{HIGH}$ turning PFET T30 OFF. $V_{SOURCE}$ is at voltage $V_{HIGH}$, which is typically in the 5 to 8 volts range, for example, resulting in a change of state for a connected NV NT Switch, such as NV NT Switch 83 in latch 82 illustrated in FIG. 8 with terminal 1730 connected to terminal 84.

When driving NV NT Switches such as switch 83 illustrated in FIG. 8, the addition of a current limiting circuit may facilitate transition from an ON state to an OFF state or from an OFF state to an ON state. Driver 1700' is the same as driver 1700, except that output node 1730 of voltage translator 1710 is connected to first terminal of a transfer device 1715, whose gate (second terminal) is controlled by $V_{I-CONTROL}$, with a third terminal providing output voltage $V_{SOURCE}$ at current I. Current I is determined by the voltage $V_{I-CONTROL}$ input voltage as well as the voltage on terminals 1730 and 1735. Transfer device 1715 may be operated in a linear region, or a current saturated region. Driver circuit 1700 provides both $V_{SOURCE}$ and current limitation I at output terminal 1735. $V_{SOURCE}$ is at voltage $V_{HIGH}$, which is typically in the 5 to 8 volts range, for example, resulting in a change of state for a connected NV NT Switch, such as NV NT Switch 83 in latch 82 illustrated in FIG. 8 with terminal 1735 connected to terminal 84. Current I may typically be controlled in the 1 to 50 uA range.

In operation, driver 1700' is similar to the operation of driver 1700 described further above; except that current is limited to a current I when supplying output voltage $V_{SOURCE}$.

Figure 17B:
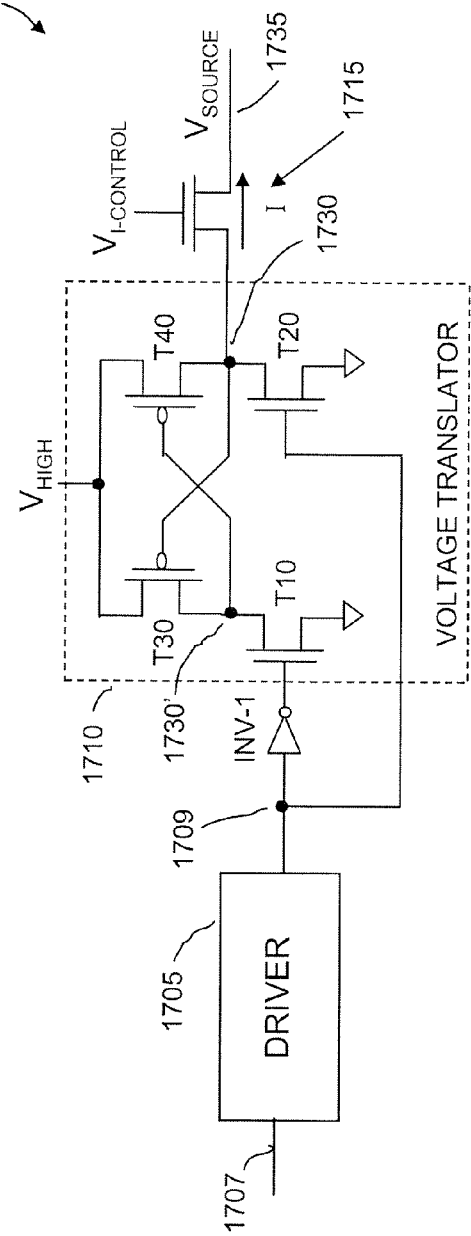
FIG. 17B illustrates a driver circuit used to change the state of nonvolatile nanotube switches in latch circuits using a voltage source with current limits, according to another embodiment of the invention.
Figure 17C:
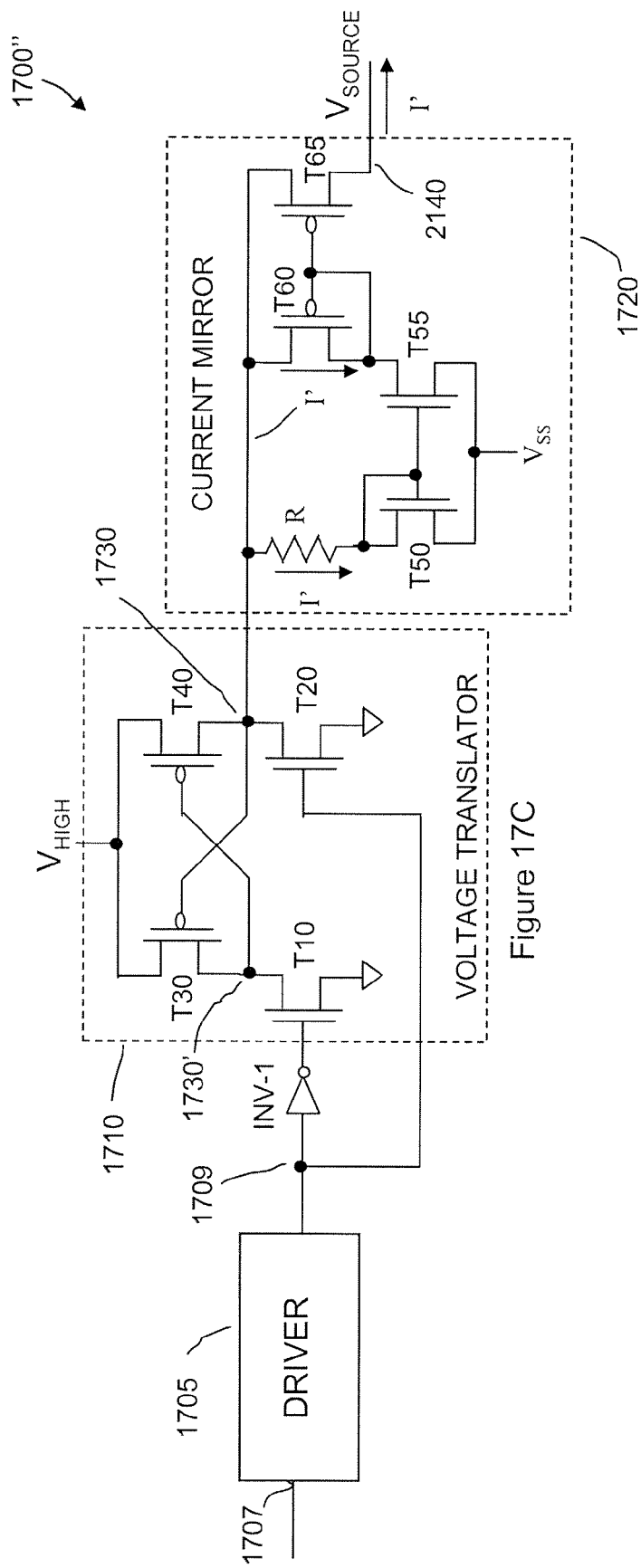
FIG. 17C illustrates a driver circuit used to change the state of nonvolatile nanotube switches in latch circuits using a voltage source with current controlled by a current mirror, according to another embodiment of the invention.

When driving NV NT Switches such as switch 83 illustrated in FIG. 8, the addition of a current limiting circuit using a transfer gate such as transfer gate 1715 illustrated in FIG. 17B may not provide sufficient current control. Driver 1700" illustrated in FIG. 17C introduces current mirror 1720 for more precise control of current I'. Current I' is determined by resistor R in series with NFET T50 with gate connected to drain, and source connected to $V_{SS}$. NFET T55 also has source connected to $V_{SS}$, has gate connected to the gate of NFET T50, with drain connected to the drain of PFET T60. The source of PFET T60 is connected to output 1730 of voltage translator 1710, and the gate and drain of PFET T60 are connected. Output PFET T65 has gate connected to the gate of PFET T60, the source of PFET T65 is connected to terminal 1730, and the drain of PFET T65 drives output 1740 which is connected to one terminal of a NV NT Switch. PFET T65 device supplies $V_{SOURCE}$ with current constrained to I'. Driver circuit 1700" provides $V_{SOURCE}$ and current limited to I' at the output terminal 1740. $V_{SOURCE}$ is at voltage $V_{HIGH}$, which is typically in the 5 to 8 volts range, for example, resulting in a change of state for a connected NV NT Switch, such as NV NT Switch 83 in latch 82 illustrated in FIG. 8 with terminal 1740 connected to terminal 84. Current I' may typically be controlled in the 1 to 50 uA range.

In operation, driver 1700" is similar to the operation of driver 1700' described further above, except that current is limited to a current I' by using a current mirror when supplying output voltage $V_{SOURCE}$. Current mirror 1720 provides better control of output current. Current mirror operation is described in the reference R. J. Baker "CMOS: Circuit Design, Layout, and Simulation, IEEE Press, 1998, pp. 427-433.

NV NT Switch cycling results 16 illustrated in FIG. 1C show an operating range having ON resistance $R_{ON}$ in approximately a range of 10 kOhm to 50 kOhm, and an OFF resistance $R_{OFF}$ of greater than 10 GOhms. Such ON and OFF range of NV NT Switch resistance values may be used for multiple adjustments of delay circuit 1600 for timing optimization at the time of fabrication and during product operation in the field as described further above.

NV NT Switch $R_{ON}$ and $R_{OFF}$ values have been measured as-fabricated (in the ON state) and after cycling. Some NV NT Switches display similar values for as-fabricated and cycled $R_{ON}$ values. Other NV NT Switches display lower as-fabricated $R_{ON}$ resistance values and higher cycled $R_{ON}$ values, in some cases cycled $R_{ON}$ values may be 10× higher, for example. $R_{OFF}$ values are typically in the 1 GOhm and higher range.

Nonvolatile Nanotube Switch ON-Resistance Control Circuit and Integration in an NRAM Memory NV NT switch resistance is formed by series/parallel combinations of SWNT-to-SWNT; MWNT-to-MWNT; and SWNT-to-MWNT combinations that form a continuous electrical path between two terminals as illustrated by NV NT switch 90" in FIG. 9C. NV NT switch OFF resistance values are typically 100 MOhms and higher and often greater than 10 GOhms, and are typically several orders of magnitude greater than ON resistance values. NV NT switch ON resistance values may range from 1 kOhms to 1 MOhms, for example. NV NT switch ON and OFF resistance cycling results 16 illustrated in FIG. 1C used a programmable laboratory voltage source with current limiting during program OFF-to-ON state transition from greater than 10 GOhms to an ON resistance range of 10 kOhms to 50 kOhms. For certain applications, such as NRAM arrays described in U.S. patent application Ser. Nos. 11/280,786 and 11/280,599, it is desirable to achieve a tighter ON resistance distribution such as a resistance range variation not greater than 2×, for example. A resistance control circuit for programming NV NT circuits is described further below.

Figure 17D:
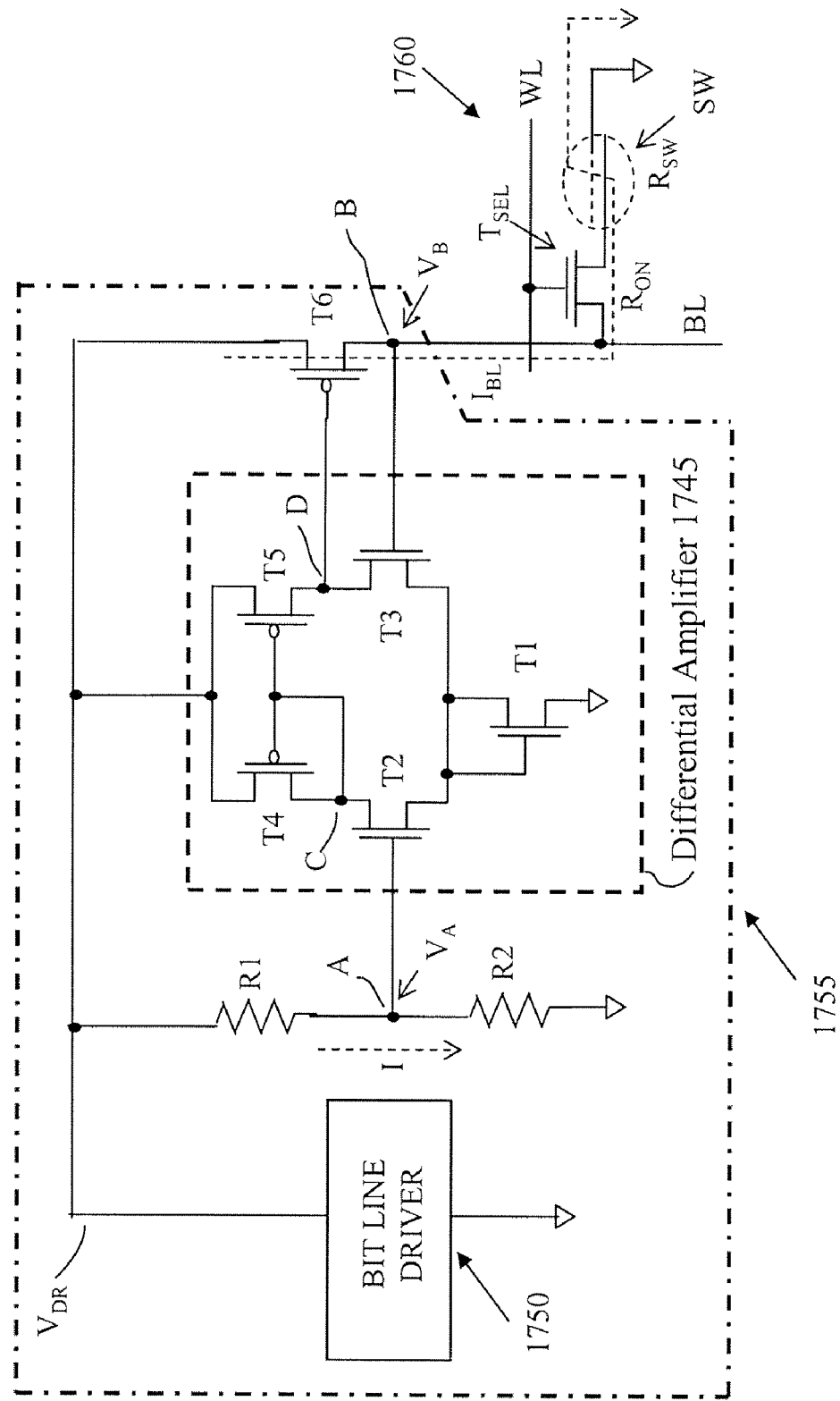
FIG. 17D illustrates a nonvolatile nanotube switch resistance control circuit that drives an NRAM array cell to a predetermined resistance value, according to another embodiment of the invention.

FIG. 17D illustrates a nonvolatile nanotube switch resistance control circuit 1755 driving NRAM array cell 1760 in a selected state, where NV NT switch resistance control circuit 1755 is used to control nonvolatile nanotube switch SW resistance value $R_{SW}$ resulting during a program operation (NV NT Switch OFF-to-ON transition). It is assumed that the nonvolatile nanotube switch SW resistance $R_{SW}$ is in an erased high resistance state, 100 MΩ to 1 GΩ or greater for example, at the start of the programming cycle. Word line WL is brought to a high voltage that turns select transistor $T_{SEL}$ ON, with a series resistance $R_{ON}$, selecting nonvolatile nanotube switch SW in NRAM array cell 1760. Other select transistors along bit line BL remain in the OFF state so that no other nonvolatile nanotube switches along bit line BL are selected for programming.

Nonvolatile nanotube switch resistance control circuit 1755 illustrated in FIG. 17D includes a modified on-chip differential amplifier 1745, bit line driver 1750, resistors R1 and R2, and output PFET T6. Differential amplifier design, operation, and simulation is described in the reference R. Baker et al., "CMOS Circuit Design, Layout, and Simulation", IEEE Press, 1998, pp. 579-595 and driver circuit design and operation is described in the reference H. G. Bakoglu, "Circuits, Interconnections, and Packaging for VLSI", Addison-Wesley Publishing Co., 1990, pp. 171-178, the entire contents of which are incorporated herein by reference. Resistor network R1 and R2 in series, having node A with voltage $V_A$ and carrying a current I, has been added to a first input of differential amplifier 1745 which is also the gate of NFET T2 as illustrated in FIG. 17D. FIG. 17D also includes output (PMOS) device T6 with a large width W to channel length L (W/L) ratio, 10/1 to 100/1 or greater for example, the source of T6 connected to voltage bit line driver 1750 output $V_{DR}$, and drain of T6 connected to common node B at voltage $V_B$ of NV NT switch resistance control circuit 1755. The gate of PFET T6 is connected to differential amplifier 1745 output D. NV NT switch resistance control circuit 1755 output node B is also connected to a second input of differential amplifier 1745 which is also the gate of NFET T3, and also to bit line BL of NRAM array cell 1760. Bit line driver 1750 output voltage $V_{DR}$ is supplied to one terminal of resistor R1, the source of PFET T6, and the voltage supply to differential amplifier 1745. A resistance network is formed that includes R1, R2, the channel resistance of PFET T3, and $R_{SW}$, where $R_{SW}$ is the resistance of the nonvolatile nanotube switch SW in NRAM array cell 1760, is used to control the programmed resistance value $R_{SW}$ of switch SW as illustrated in FIG. 17D. In operation, as described further below, program voltage $V_B = V_{PROG}$ and current $I_{BL}$ result in a transition of switch SW from an OFF-to-ON state, and current flow is reduced to below program current values when voltage $V_B$ is approximately equal to voltage $V_A$. Program current values may be in the range of 1 uA to 50 uA as described in U.S. patent application Ser. No. 11/280,786.

In operation, transistors T1, T2, and T4 are typically in the ON state. Transistor T2 is in the linear region, controlled by resistors R1 and R2. The voltage on the gate of PFET T5 is controlled by common node C. Transistor T3 controls the level of common node D. PFET T6 is in an ON state (linear region) during an initial transition of $R_{SW}$ from a high resistance OFF state to a lower resistance ON state. W/L ratios of the FETs in NV NT switch resistance control circuit 1755 are optimized using known circuit simulation techniques (see Baker et al. reference above, for example) for FETs at a given technology node, and for a corresponding nonvolatile nanotube switch SW of selected channel length and width, such that NV NT switch resistance control circuit 1755 turns transistor T3 OFF when $R_{SW}$ of NV NT switch SW is at a predetermined ON resistance value, which causes node D to rise and turn PFET T6 OFF thus ending the program cycle at NV NT switch SW ON resistance value $R_{SW}$. The ON resistance value of NV NT switch SW may be programmed to a predetermined resistance value in the 1 kOhm to 1 MOhm range, for example, which occurs when $V_B$ is approximately equal to $V_A$.

As $V_{DR}$ approaches a program voltage value $V_{PROG}$, typically in the 3.5 to 8 volt range for example, $R_{SW}$ is programmed and $R_{SW}$ transitions to the ON state. When the value of $R_{SW}$ is not directly controlled using a circuit such as NV NT switch resistance control circuit 1755 during programming, the post-program ON resistance value of $R_{SW}$ may be in the range of 10 KΩ to 1 MΩ, for example, a function of the number of activated serial/parallel paths in the ON state of nonvolatile nanotube switch SW. The value of the ON resistance value of $R_{SW}$ may range from 10 KΩ to 1 MΩ for the same switch for example, as the switch goes through cycles from erase-to-program to erase-to-program for millions of cycles. Switch resistance control circuit 1755 ensures that the ON resistance $R_{SW}$ of switch SW is approximately equal to a value in the 10 KΩ to 1 MΩ range, 25 KΩ may be selected for example.

Figure 17E:
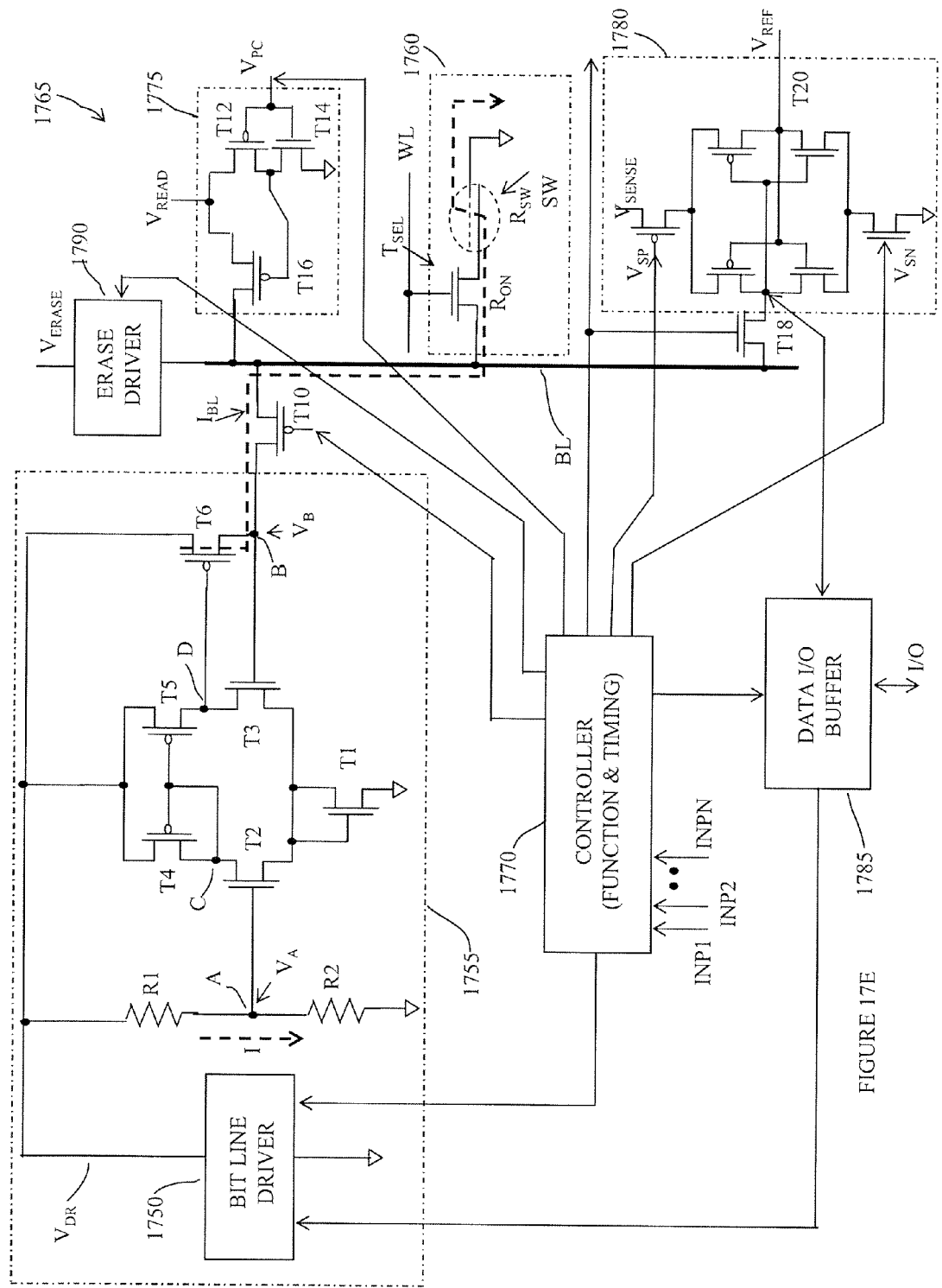
FIG. 17E illustrates the circuit of FIG. 17D integrated in an NRAM memory system, according to another embodiment of the invention.

FIG. 17E illustrates a resistance controlled NV NT switch memory subsystem 1765 which includes NRAM array cell 1760, NV NT switch resistance control circuit 1755 for controlled NV NT switch ON resistance programming, and also erase, read, controller, data I/O buffer, sense amplifier, and other circuits illustrated in FIG. 17E and described further below.

Controller 1770 with inputs INP1 to INPN is used to provide logic function and timing control signals. PFET T10 is used to isolate NV NT switch resistance control circuit 1755 from bit line BL during other operations such as erase and read. The W/L ratio of PFET T10 is sufficiently large that the ON resistance of PFET T10 is negligible compared to the ON resistance of transistor T6 for example.

In a programming operation, controller 1770 activates data I/O buffer 1785 which receives input data from the I/O signal node. Controller 1770 turns PFET T10 ON electrically connecting NV NT switch resistance control circuit 1755 and bit line BL. Controller 1770 also activates bit line driver 1750 in NV NT switch resistance control circuit 1755 which provides output $V_{DR}$ as described further above with respect to FIG. 17D for controlled switch resistance programming operation.

Read pre-charge circuit 1775 includes an inverter formed by PFET T12 and NFET T14 and pre-charge PFET T16 and is connected to bit line BL, voltage source $V_{READ}$, and controller 1770. Bit line BL is also connected to sense amplifier/latch 1780 through isolating transistor T18, which is turned ON during a read operation. Sense amplifier latch 1780 is also connected to data I/O buffer 1785, a voltage source $V_{SENSE}$ which may be 1 to 5 volts, for example, $V_{REF}$ which may be 1 to 2 volts for example, and controller 1770.

In a read operation, control signal applies pre-charge activation signal $V_{PC}$ to pre-charge circuit 1775, pre-charging bit line BL to $V_{READ}$, 1 to 2 volts for example. Controller 1770 also activates isolation transistor T18, provides sense amplifier activation signals $V_{SP}$ and $V_{SN}$, and sets data I/O buffer 1785 to receive a read output signal from sense amplifier/latch 1780 and apply a corresponding logic output signal to the I/O signal node. Controller 1770 deactivates programming circuit NV NT switch resistance control circuit 1755, isolation PFET T10, and erase driver 1790.

Erase Driver 1790 is connected to bit line BL, erase voltage source $V_{ERASE}$, and controller 1770. $V_{ERASE}$ is typically in the range of 5 to 12 volts, for example.

In an erase operation, NRAM array cell 1760 is activated by turning $T_{SEL}$ transistor ON. Erase driver 1790 output voltage is then ramped from zero to $V_{ERASE}$. If switch SW is in the ON state, then switch SW transitions to the OFF state. If switch SW is in the OFF state, then it remains in the OFF state. After switch SW is erased, then erase driver 1790 output voltage transitions to zero volts. Erase driver 1790 in the OFF state presents a high impedance to bit line BL. Controller 1770 deactivates programming circuit NV NT switch resistance control circuit 1755, isolation PFET T10, pre-charge circuit 1775, sense amplifier 1780 and isolation NFET T18.

FIG. 18A illustrates the as-fabricated $R_{ON}$ resistance values 1800 of 11 different NV NT Switches in the range of 80 kOhm to 700 kOhm. FIG. 18B illustrates the $R_{ON}$ and $R_{OFF}$ resistance distributions 1800' of the 11 NV NT Switches after 50 cycles. $R_{ON}$ distribution after cycling is in the range of 700 kOhm to 8 MOhm. The $R_{ON}$ cycled resistance off all 11 switches is too high to be of interest for multiple cycles. However, for an OTP application where timing is optimized prior to shipment from a fabricator, then 9 of the 11 switches with as-fabricated $R_{ON}$ resistance values in the 80 kOhm to 200 kOhm are of interest because the $R_{ON}$ as fabricated is high and requires a low current to switch from an ON state to an OFF state. Latch circuit resistance trip points may be increased to as high as 400 kOhm to 500 kOhm to accommodate the relatively high as-fabricated $R_{ON}$ values. Resistance trip point adjustment is described further above with respect to FIGS. 7 and 8.

Nonvolatile Nanotube Switch Multilevel Storage Using Nonvolatile Nanotube Switch Resistance Control NV NT switch resistance may be formed by a series/parallel combination of pathway (or network) resistances/impedances of individual nanotubes and contact terminals such as first-contact-to-SWNT-to-SWNT-to second-contact resistance; first-contact-to-MWNT-to-MWNT-to-second-contact resistance; first-contact-to-SWNT-to-MWNT-to-second-contact resistance; first-contact-to-SWNT-to-second contact resistance; first-contact-to-MWNT-to-second-contact resistance; and other combinations. NV NT switch resistance between a first contact and second contact may be switched into a high resistance state $R_{OFF}$ such as 100 MOhm to 1 GOhm and even higher, 10 GOhm for example, by an erase operation that may also be referred to as a write 0 operation. A voltage contrast SEM of a NV NT switch illustrated in U.S. patent application Ser. No. 11/835,651, entitled "Nonvolatile Nanotube Diodes and Nonvolatile Nanotube Blocks and Systems Using Same and Methods of Making Same," filed concurrently herewith, and shows a discontinuous electrical pathway (network) between a first contact and a second contact for $R_{OFF}$. Alternatively, NV NT switch resistance between a first contact and a second contact may be switched to a low resistance state $R_{ON}$ between 1 kOhm and 1 MOhm, for example, by a program operation that may also be referred to as a write 1 operation. A voltage contrast SEM of the same NV NT switch described further above and shows a continuous electrical pathway (network) between a first contact and a second contact for $R_{ON}$. NRAM memory array operations such as erase (write 0), program (write 1), and read are defined in patent publication US 2006/0250856, the entire contents of which is herein incorporated by reference in its entirety.

The NV NT switch resistance value $R_{SW}$ of NV NT switch SW illustrated in NRAM array cell 1760 may be set to a predetermined value by using a feedback approach by NRAM NV NT switch memory system 1765 illustrated in FIG. 17E. FIG. 17E illustrates a resistance control circuit 1755, essentially a differential amplifier, powered by the bit line driver that supplies voltage and current to NRAM array cell 1760 through transistors T6 and T10. The FET channel ON resistance of transistors T6, T10, and $T_{SEL}$ is typically much lower than the NV NT switch resistance $R_{SW}$ so almost all the bit line driver 1750 voltage $V_{DR}$ appears across NV NT switch SW. Controller 1770 causes bit line driver 1750 to apply a ramp or multiple pulses of increasing amplitude $V_{DR}$ to bit line BL which are in turn applied to NV NT switch SW through select transistor $T_{SEL}$. Assuming NV NT switch SW in NRAM array cell 1760 is in an erased or $R_{OFF}$ state, then the applied ramp or multiple pulses of increasing amplitude $V_{DR}$ causes the resistance of NV NT switch SW to transition to an ON state $R_{ON}$. $V_{DR}$ continues to increase until $R_{SW} \approx R2$ at which point the resistance control circuit 1755 (a differential amplifier) turns-off transistor T6 and the program operation (write 1) to the desired $R_{ON}$ value is complete. Therefore the NV NT switch SW $R_{ON}$ (corresponding to $R_{WS}$) value is approximately equal to R2. R2 may be varied over a broad range of values resulting in $R_{ON}$ ($R_{SW}$) values that cover a broad range of $R_{ON}$ resistance values in the kilo-Ohm range, for example. $R_{ON}$ and $R_{OFF}$ are nonvolatile resistance states that are maintained even in the absence of applied voltages. A description of differential amplifier operation, such as the differential amplifier used in resistance control circuit 1755, may be found in Baker et al., "CMOS Circuit Design, Layout, and Simulation", IEEE Press pp. 579-591 (1998).

While resistance control circuit 1755 is used to program the $R_{ON}$ resistance value of NV NT switch SW in NRAM array cell 1760 in the example given by the NRAM NV NT switch memory subsystem 1765 illustrated in FIG. 17E, controller 1770 and sense amplifier/latch 1780 may be used without resistance control circuit 1755 to achieve $R_{ON}$ resistance value control. As explained further below, a fabricated 8 Kb NRAM memory corresponding to the NRAM memory array illustrated in patent publication US 2006/0250856 and corresponding NRAM NV NT switch memory subsystem 1765, but without resistance control circuit 1755, was tested and demonstrated resistance change from a high resistance $R_{OFF}$ state in excess of 100 MOhm (most NV NT switch resistance values in excess of 1 GOhm) to multiple low nonvolatile $R_{ON}$ resistance states programmed in a resistance range from approximately 50 kOhms to 1 MOhm. Programming multiple nonvolatile $R_{ON}$ resistance states by voltage modulation was achieved by the application of multiple increasing bit line voltage programming pulses and included cell readout of the NV NT switch resistance state after each voltage pulse. The NRAM memory array in patent publication US 2006/0250856 includes a matrix of nonvolatile storage cells C00 through Cnm. The NRAM memory array also includes erase (write 0), program (write 1), and read word lines (WL0, WL1, to WLn); erase (write 0), program (write 1), and read secondary word lines (WWL0, WWL1, to WWLn); and erase (write 0), program (write 1), and read bit lines (BL0, BL1, to BLm). A word line signal generator (not shown) provides word line signals to the memory cells. A secondary word line signal generator (not shown) provides secondary word line signals to the memory cells. In some applications, secondary word lines are all connected to a reference voltage such as ground. A bit line signal generator (not shown) provides bit line signals to the memory cells. The fabricated 8 Kb NRAM memory array included selectable options of voltage sensing, similar to sense amplifier/latch 1780, or current sensing. Current sensing may comprise any known current sensing circuitry such as, for example, the current differential sense amplifier of FIG. 27 and corresponding description of Baker et al., "CMOS Circuit Design, Layout, and Simulation", IEEE Press, PP. 607-608 (1998).

Programming by current modulation of nonvolatile $R_{ON}$ resistance states was also measured using the fabricated 8 Kb NRAM memory array described further above by the application of multiple increasing bit line current programming pulses and included cell readout of the multiple NV NT switch resistance states after each current step. Current modulation of nonvolatile $R_{ON}$ resistance is described further below.

NV NT switches may be programmed over a wide range of resistance states as described further below. Multilevel storage, in the context of NV NT switches used as storage element refers to multiple resistance states on each NV NT switch and correspond to the storage of multiple logic states on the same NV NT switch. So for example, two resistance states such as $R_{OFF}$ and $R_{ON}$ correspond to the storage of one logic state or one bit of information per NV NT switch. However, $R_{OFF}$ and three $R_{ON}$ resistance states (values) correspond to two logic states or two bits of information per NV NT switch. Because multilevel storage or states refers to multiple NV NT switch resistance states, other terms such as multistate storage, multiresistance states, multiple resistance states, and other variations may be used in the description further below.

Programming Multiple NRAM Cell Resistance States Using Programming Voltage Modulation of Nonvolatile Nanotube Switch Resistance A memory tester was used to control the fabricated 8 Kb NRAM memory described further above. The memory tester provides addresses, data, timings, and other functions to the fabricated 8 Kb NRAM memory operation. Testing was at wafer level with some testing at module level. In alternate embodiments, other testing mechanisms could be used. In this example, a 1 Kb NRAM subset of the 8 Kb NRAM memory described further above was tested with secondary word lines grounded and NRAM memory array cells accessed using word lines and bit lines. An erase (write 0) operation was performed and over 1000 bits were switched to an OFF resistance ($R_{OFF}$) state of at least 100 MOhms. Next, bit line voltage pulses were applied through select FET devices to the corresponding NV NT switches for activated word lines. Applied bit line programming voltage pulses started at 2.4 volts and increased in 200 mV (0.2 V) steps to 7 volts. After each pulse, a tester readout was performed to determine how many of the 1000+bits conducted at least 1 uA of current with an applied readout voltage of approximately 1 V using a current sense amplifier/latch with an approximately 1 uA current detect level. In addition, an actual cell current measurement was recorded by the memory tester. NV NT switches that conduct at least 1 uA are in multiple nonvolatile $R_{ON}$ resistance states. FIG. 19 provides various graphical representations of the results of the present testing example.

Figure 19A:
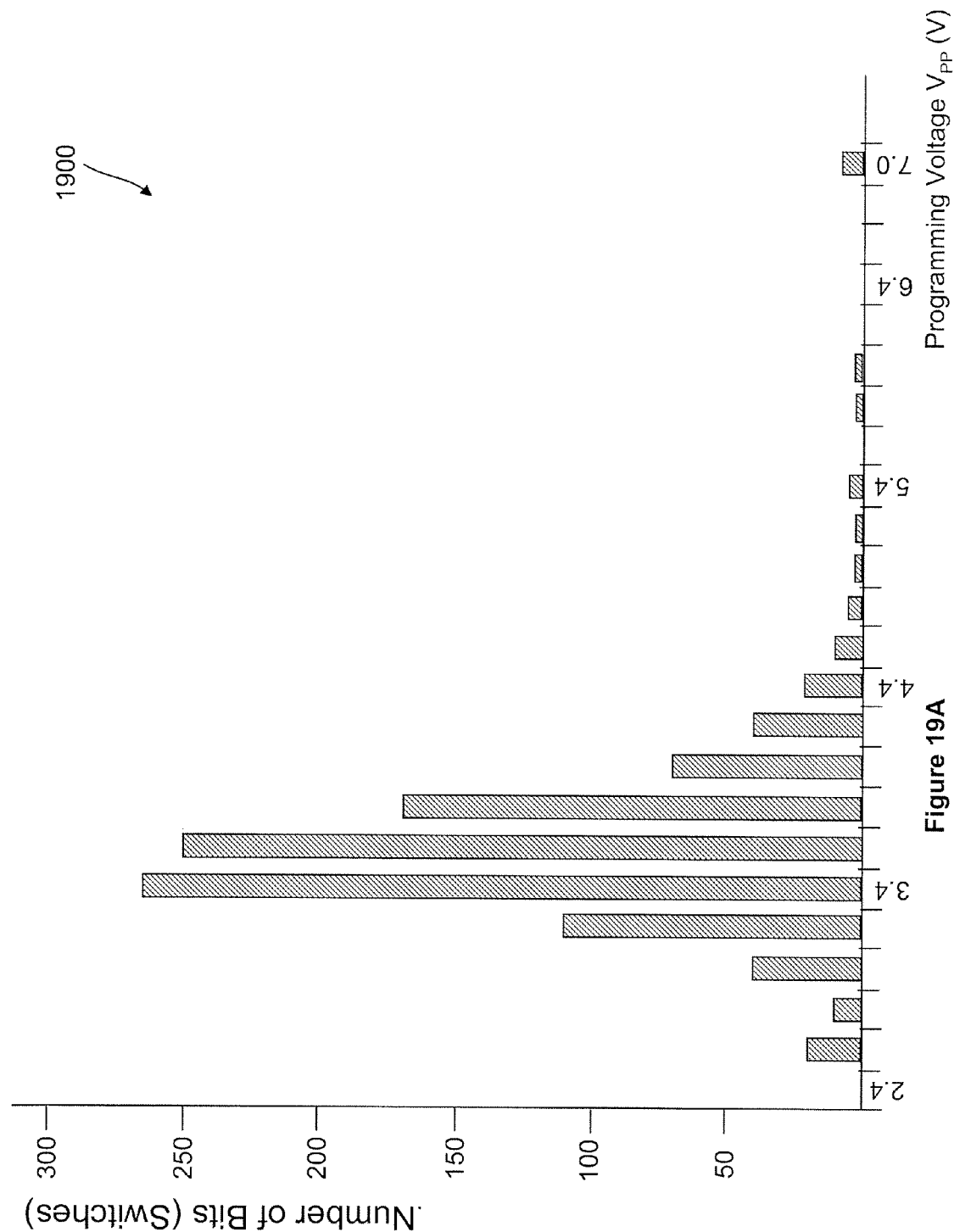
FIG. 19A illustrates an example of the number of nanotube switches programmed at selected voltage levels, according to another embodiment of the invention.
Figure 19B:
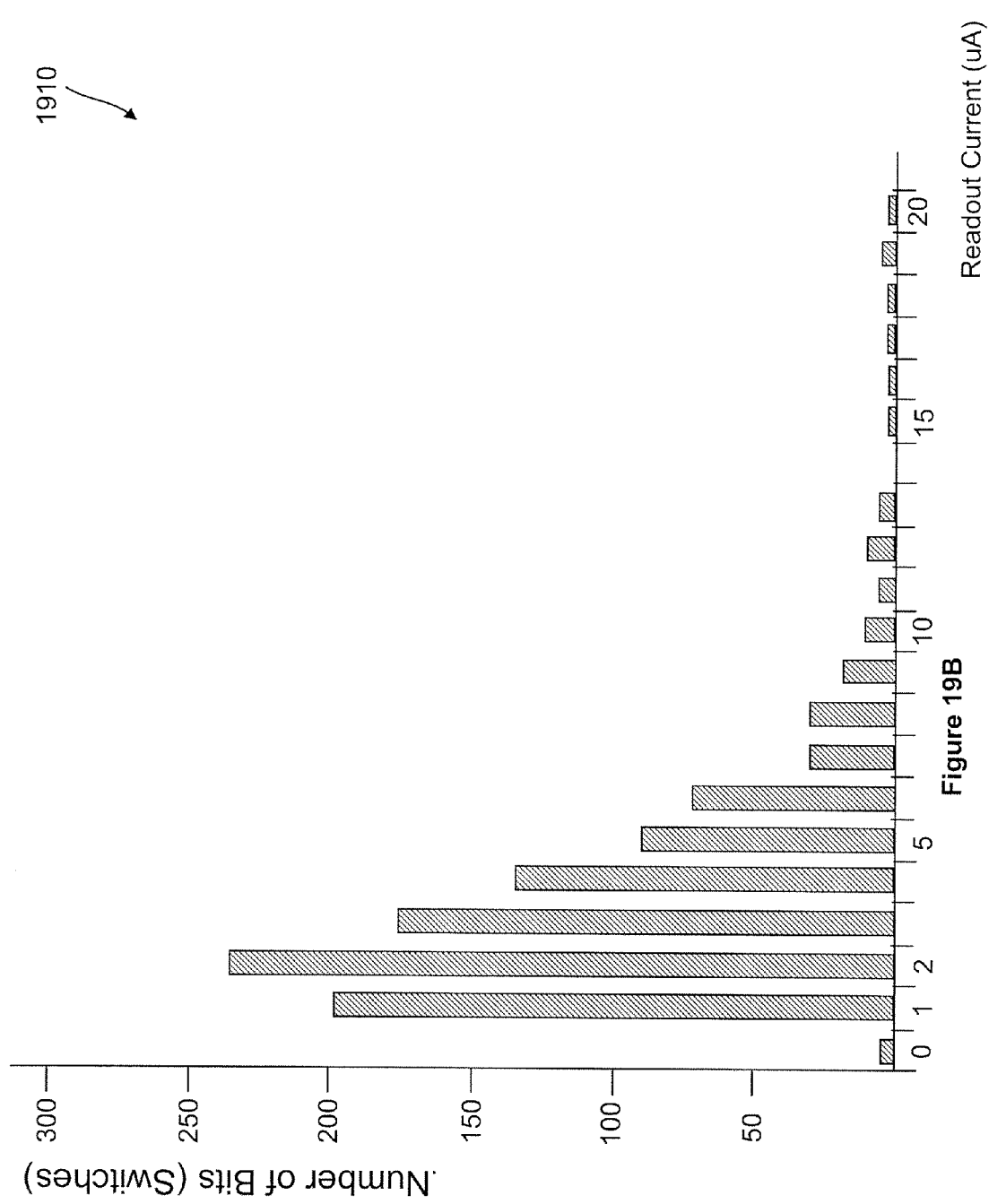
FIG. 19B illustrates an example of the number of programmed nanotube switches at various readout currents corresponding to a one volt bit line readout voltage, according to another embodiment of the invention.
Figure 19C:
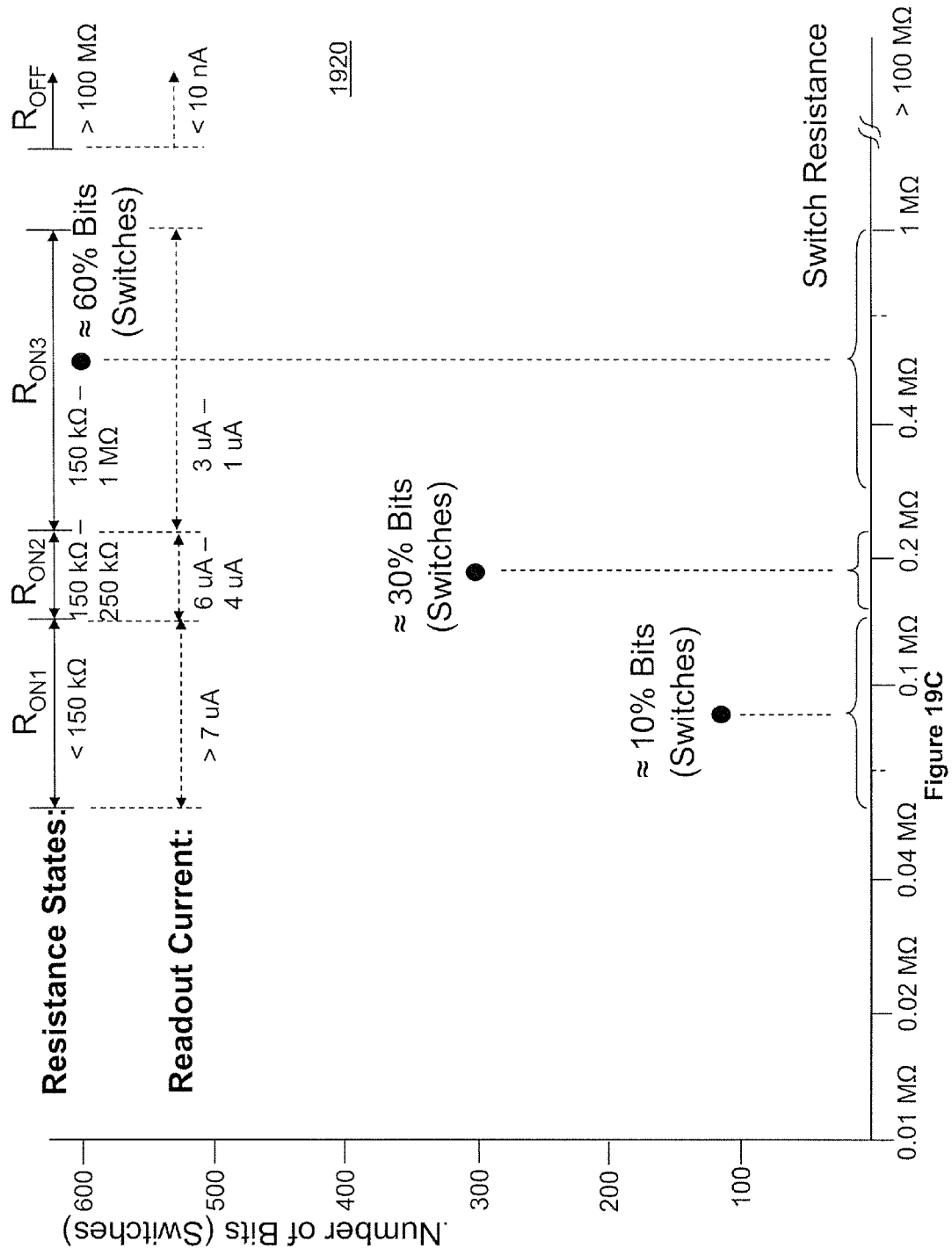
FIG. 19C illustrates an example of the number of nanotube switches operating within selected resistance ranges, where resistance values correspond to FIG. 19B readout current at one volt, according to the present embodiment of the invention.

FIG. 19A illustrates graphical representation 1900 of the number of bits that conduct at least 1 uA of current with a readout voltage of 1 V as a function of the programming voltage $V_{PP}$ applied to the bit line. As more voltage pulses $V_{PP}$ of increasing amplitude are applied, more switches transition from an OFF high resistance state ($R_{OFF}$>100 MOhm) to multiple $R_{ON}$ resistance states. FIG. 19B illustrates graphical representation 1910 of the number of bits (cells) as a function of measured cell current. Since the NV NT switch resistance is much greater than the select FET channel resistance, almost all of the 1 volt readout voltage appears across the NV NT switch. NV NT switch resistance may be calculated by dividing the 1 volt readout voltage by the corresponding cell readout current because the NFET series resistance is much smaller than the NV NT switch resistance. FIG. 19C illustrates graphical representation 1920 of the number of bits as a function of multiple $R_{ON}$ resistance states for more than 1000 switches. $R_{ON}$ resistance state values range from approximately 50 kOhms to 1 MOhm and corresponding cell currents range from approximately zero (in this example, 2 bits did not switch and were inoperable, typically fixed by redundant bit substitution) to approximately 20 uA. $R_{OFF}$ resistance states are in excess of 100 MOhm with currents much less than 10 nA.

NV NT switch multiple resistance states are grouped into three $R_{ON}$ ranges and one $R_{OFF}$ range as illustrated by graphical representation 1920. Approximately 10% of the bits (switches) have $R_{ON}$ less than 150 kOhms with a corresponding cell readout current of more than 7 uA for a readout voltage of 1 volts; approximately 30% of the bits (switches) have $R_{ON}$ in the 150 kOhm-to-250 kOhm range and a corresponding cell readout current in the range of 6 uA to 4 uA for a readout voltage of 1 volts; approximately 60% of the bits (switches) have $R_{ON}$ in the 250 kOhm-to-1 MOhm range. In this example, we elected to program all 1000-F bits. Unprogrammed bits have $R_{OFF}$ greater than 100 MOhm range with corresponding cell readout currents typically less than 10 nA for a readout voltage of 1 volt. In other examples, different resistance ranges may be preferred.

Test results of a 1000+bit subset of an 8 Kb NRAM memory illustrated by graphic representation 1920 show four resistance state ranges with four corresponding readout current ranges. Current sense amplifiers such as illustrated by the current differential sense amplifier of FIG. 27 and corresponding description of Baker et al., "CMOS Circuit Design, Layout, and Simulation", IEEE Press, PP. 607-608 (1998) are capable of detecting multiple current ranges by using multiple current sense amplifier reference values. In this example four resistance ranges may be defined for the same NV NT switch comprising three $R_{ON}$ resistance states and one $R_{OFF}$ resistance state. These four resistance states may be translated by a current sense amplifier/latch to corresponding logic states 00, 01, 10, 11. If each bit consists of a 1 and 0 value, then two bits per NV NT switch may be stored. The number of resistance states are not limited to four but may be substantially greater enabling the storage of more than four logic states or two bits on each NV NT switch.

Note that while multiple $R_{ON}$ resistance states were achieved by applying multiple program (write 1) pulses to NRAM memory array cells to reduce resistance from an $R_{OFF}$ state to a desired $R_{ON}$ value as described further above, tests were also performed (results not shown) showing that multiple erase (write 0) voltage pulses of increasing amplitude increase $R_{ON}$ resistance to increasingly high $R_{ON}$ values and also to high resistance state $R_{OFF}$. Therefore, multiple voltage pulses may be used to achieve desired NV NT switch resistance values using both program and erase operations.

Programming Multiple NRAM Cell Resistance States Using Programming Current Modulation of Nonvolatile Nanotube Switch Resistance The fabricated 8Kb NRAM memory described above was designed, in the present example, to apply voltage pulses to NRAM memory array bit lines. In order to evaluate the use of current pulses to program multiple $R_{ON}$ resistance states, test methods described above were modified. During memory tester operations, a selected block of 8 Kb NRAM memory array cells were erased to a high resistance $R_{OFF}$ state. Then selected secondary word lines were pulsed to a programming voltage of 6.7 volts, bit lines were grounded, and selected word lines were used to modulate the gate voltage of select transistors in each cell thereby controlling the current flowing through the corresponding switch. After each 6.7 volt programming pulse, selected secondary word lines were grounded, a readout voltage of 1 volt was applied to selected bit lines, selected word lines were activated, and a cell current readout measurement was taken by the memory tester as described further above.

In this example, the applied secondary word line voltage 6.7 volts is much greater than the word line voltage applied to the select FET transistor gate to form a corresponding FET conducting channel so the FET is in its saturated region of operation. The FET saturated current $I_{SAT}$ also flows through the NV NT switch in series with the FET. Table 1930 in FIG. 19D shows that the range of applied word line voltages ($V_{WL0}$) range from 0.9 volts to 1.4 volts and the calculated corresponding saturation current $I_{SAT}$. $I_{SAT}$ is not measured directly, but is calculated from the read current $I_{READ}$ measured during cell readout operations performed after each program cycle. The median cell readout current $I_{READ}$ measured with a bit line voltage of 1 volt and is recorded in FIG. 19D. The median $I_{READ}$ current value corresponds to over 15,000 current values.

During the programming (write 1) operation, the FET channel resistance is much less than the NV NT switch resistance value. Therefore, almost all of the 6.7 volts applied to selected secondary word lines appears across the corresponding NV NT switch. The saturation current $I_{SAT}$ controlled by the select FET transistor and flowing through the corresponding NV NT switch results in a voltage drop through the switch of $I_{SAT} \times R_{SW}(I_{SAT} \times R_{ON})$. Since the voltage across the NV NT switch is approximately 6.7 volts, then the programmed resistance value $R_{ON} \approx 6.7/I_{SAT}$. $I_{SAT}$ is not directly measurable. However, since $R_{ON}$ is a nonvolatile resistance value, and the readout voltage of 1 volt is too low to disturb the nonvolatile resistance state, the value of $R_{ON}$ is the same during readout as it was after the program (write 1) operation. Therefore, $I_{READ} \times R_{ON} = 1$ volts and $I_{SAT} \approx I_{READ} \times 6.7/1$. Therefore, the $I_{SAT}$ values shown in FIG. 19D are median saturated current values that are calculated by multiplying 6.7 times the median $I_{READ}$ current values. Median $R_{ON}$ resistance values corresponding median $I_{SAT}$ values and can be calculated by dividing $I_{SAT}$ into 6.7 volts.

Figure 19E:
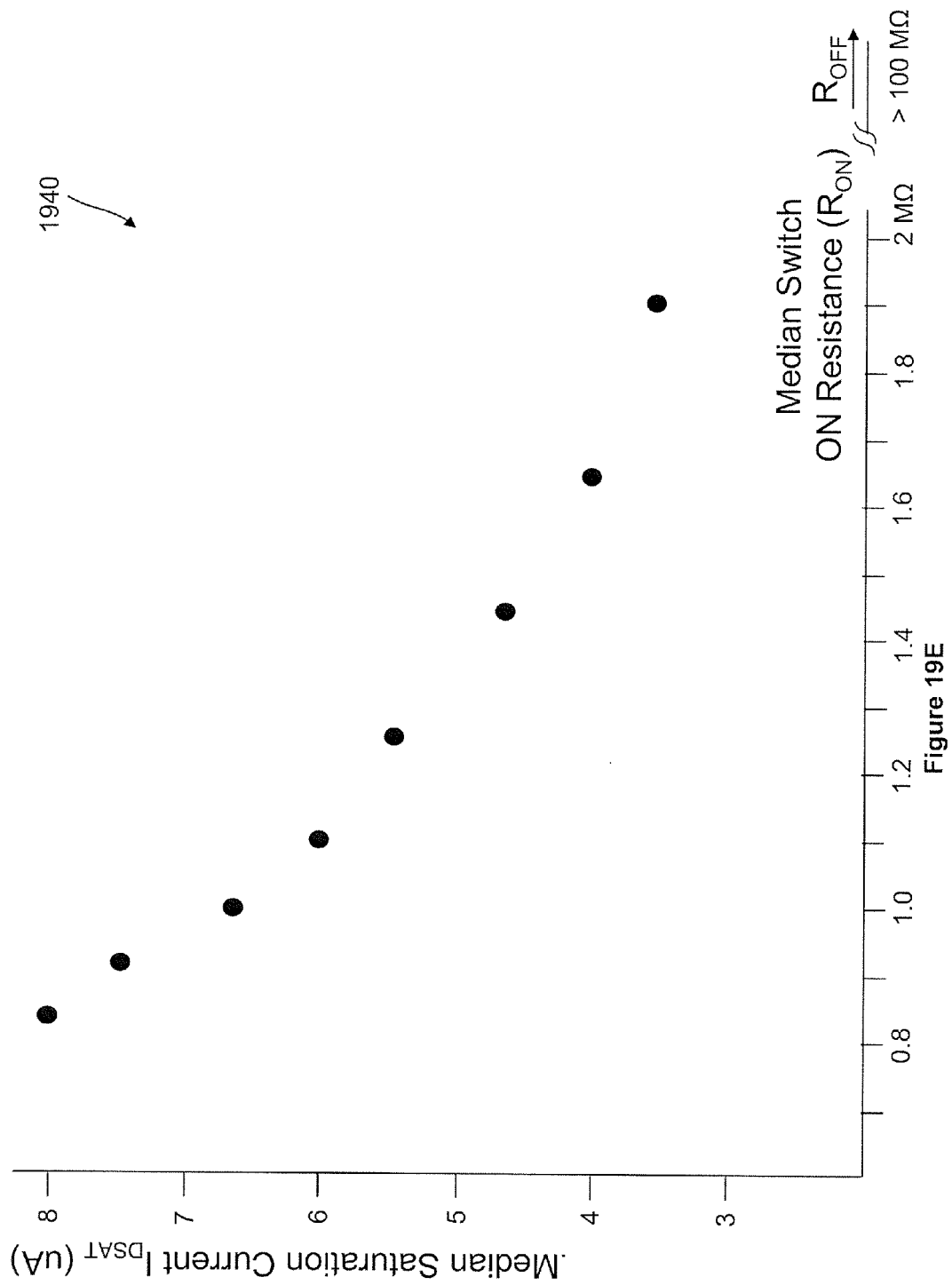
FIG. 19E illustrates an example of median saturation current levels at selected median switch ON-state resistance levels, according to the present embodiment of the invention.

FIG. 19E illustrates graphic representation 1940 of median saturation current $I_{SAT}$ VS median switch resistance $R_{ON}$. Graphic representation 1940 shows that current programming pulses applied to NV NT switches using multiple current pulses ($I_{SAT}$) of increasing current amplitude from approximately 3.5 uA to 8 uA results in a median $R_{ON}$ resistance ranging from approximately 1.9 MOhms to 830 kOhms. Hence, programming of multiple resistance state $R_{ON}$ may be achieved using current programming as well as voltage programming illustrated further above.

FIG. 19 shows a large number of NV NT switches in nonvolatile resistance state $R_{OFF}$ and nonvolatile multiple ON resistance states $R_{ON}$ by testing fabricated 8 Kb NRAM memory blocks showing the behavior of a large number of bits. Erase, program, and read methods as described further above are used. These test results illustrate that individual NV NT switches in NRAM memory cells selected by a series FET transistor and used as nonvolatile storage nodes may be erased or programmed to store multiple nonvolatile resistance states. These multiple nonvolatile resistance states may be used to store multiple logical states on each NV NT switch in each NRAM memory cell. Programming methods include voltage pulses of increasing amplitude and current pulses of increasing amplitudes that reduce the value of $R_{ON}$. Multiple erase voltage pulses may be used to increase $R_{ON}$ values from a lower to higher $R_{ON}$ value or to high resistance state $R_{OFF}$. Other programming methods are possible and may be preferred in certain applications.

Implementation of Memory Cells used to form Nonvolatile Nanotube Flash (NFlash) Memories Including Multistate Storage and Reprogrammable Nonvolatile Impedance Networks NRAM memory storing logic states in terms of $R_{OFF}$ and one $R_{ON}$ state, or multilevel store including $R_{OFF}$ and multiple values of $R_{ON}$ are described further above with respect to NRAM memory array cells having a select FET and NV NT switch in series. However, it is also possible to form a parallel combination of a select FET and a NV NT switch also capable of storing $R_{OFF}$ and one $R_{ON}$, or multilevel (multiresistance) store including $R_{OFF}$ and multiple values of $R_{ON}$ as described further above with respect to NRAM memory applications. A parallel FET and NV NT switch combination results in a variety of new memory, logic, and analog applications because selection methods are different and because the parallel FET/NV NT switch may be formed with the NV NT switch placed above the FET transistor thereby occupying a smaller area than a series combination. NV NT electrical characteristics are independent of voltage polarity and the direction of current flow.

FIG. 20 illustrates series circuit 2000 comprising a series combination of FET transistor 2010 and NV NT switch 2030 connected at common node 2040 and also illustrated further above with respect to NRAM memory array cells. FET 2010 has a gate G that controls the channel region conduction of the FET, drain 2050 connected to terminal T1 and FET 2010 source and one terminal of NV NT switch 2030 connected at common node 2040. A second NV NT switch 2030 terminal 2060 is connected to terminal T2. FET 2010 is a symmetrical device so drain and source may be used interchangeably. The ON channel resistance of FET 2010 is much lower (at least 10× lower, for example) than any of the multiple resistance values of NV NT switch 2030.

FIG. 21 illustrates parallel circuit 2100 comprising a parallel combination of FET 2120 and NV NT switch 2130. FET 2120 has a gate G' that controls the FET channel region conduction. FET 2120 drain is connected to one of NV NT switch 2130 terminals at common node 2140 which is also connected to terminal T1 and FET 2120 source is connected to the other NV NT switch 2130 terminal at common node 2145 which is also connected to terminal T2. Various methods of fabrication may be used to position NV NT switch 2130 above FET 2120 for greater density. The ON channel resistance of FET 2120 is much lower (at least 10× lower, for example) than any of the multiple resistance values of NV NT switch 2130. The highest resistance value of NV NT switch 2130 may be controlled so as not to be substantially higher than the OFF resistance value of FET 2120 to ensure sufficient current flow control between ON and OFF conducting states for parallel circuit 2100. So for example, NV NT switch 2130 may be programmed in the approximately 50 kOhm to 1 MOhm resistance range shown in graphical representation 1920 illustrated in FIG. 19C.

FIG. 22 illustrates series/parallel circuit 2200 comprising a series/parallel combination of FET 2210, FET 2220 and NV NT switch 2230. FET 2220 has a gate G' that controls the FET channel region conduction. FET 2220 drain is connected to one of NV NT switch 2230 terminals at common node 2240 which is also connected to the FET 2210 source. The FET 2210 channel region conduction is controlled by gate G and drain 2250 is connected to terminal T1. FET 2220 source is connected to the other NV NT switch 2230 terminal at common node 2245 which is also connected to terminal T2. Various methods of fabrication may be used to position NV NT switch 2230 above FET 2220 for greater density. The ON channel resistance of FET 2220 is much lower (at least 10× lower, for example) than any of the multiple resistance values of NV NT switch 2230 as described further above with respect to parallel circuit 2100. Series FET 2210 ON channel resistance is also lower (at least 10× lower for example) than any of the multiple resistance values of NV NT switch 2230 as explained further above with respect to series circuit 2000.

Multiple combinations of parallel circuit 2100 illustrated in FIG. 21 may be used in memory applications to form dense nanotube-based nonvolatile flash memories referred to as NFlash memories in this application and described further below. Multiple series and series/parallel combinations of parallel circuit 2100 and series/parallel circuit 2200 may be used to form nonvolatile programmable impedance networks such as resistance and capacitance analog networks, described further below.

Nonvolatile Nanotube Flash (NFlash) Memories Including Multilevel (Multiresistance) State Storage Flash NAND memory arrays with series nonvolatile FETs are used to enhance memory array density as illustrated in FIGS. 1.35, 1.36 and described in K. Itoh, "VLSI Memory Chip Design", Springer, 2001, pp. 41-44. Flash NAND memories store information as charges on floating gate (FG) FET transistors in series thereby controlling the threshold voltage of each of the series FG FET devices as described in the Itoh reference. Selection methods for these series FG FETs in NAND-conFigured memory arrays differ from random access NOR-conFigured Flash memory selection methods described in the Itoh reference, pages 38-41. NOR-flash selection methods are similar to those of NRAM memories described further above. When reading the state of a FG FET device in series with other FG FETs, for example, all series FG FETs are selected (turned ON) with a high word line voltage except the FG FET device to be read. The FG FET device to be read has a zero word line voltage applied to the gate. If the selected FG FET device has been programmed to be in an ON state, current will flow in the series circuit discharging the bit line. If the FG FET device has been programmed in an OFF state then no current will flow in the series circuit and the bit line will remain at a high voltage level.

Parallel circuit 2100 may be substituted for FG FET transistors illustrated in FIGS. 1.35 and 1.36 in the Itoh reference to form a nonvolatile nanotube Flash memory referred to as an NFlash memory in this application. Operation of the NFlash memory is also carried out by turning all series FETs in parallel circuit 2100-type NFlash memory array cells ON except for the FET in parallel with the NV NT switch to be programmed, erased, or read out which is in the OFF state. Then erase, program, or read operations similar to those described with respect to the NRAM memory described further above may be used.

Figure 23A:
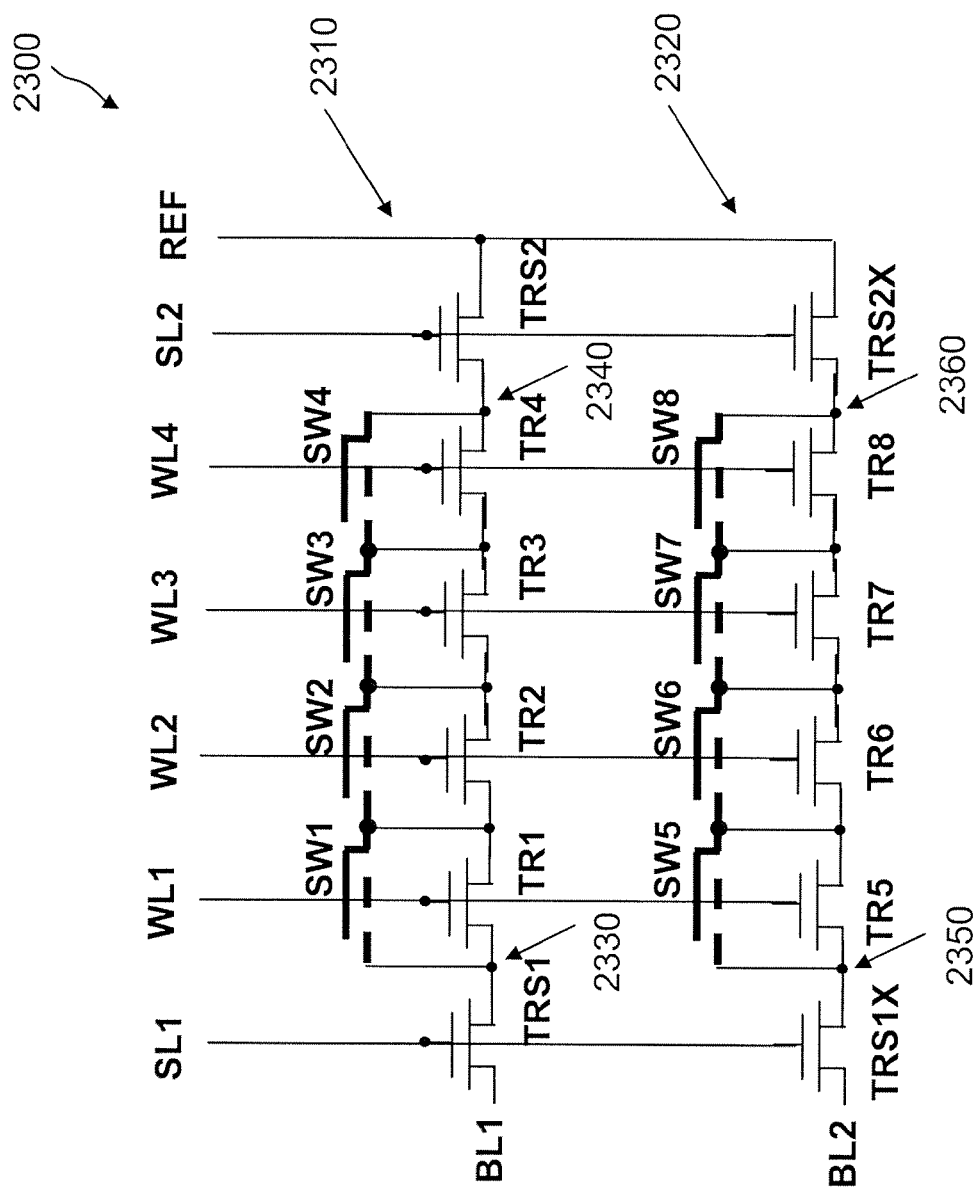
FIG. 23A illustrates a NFlash memory schematic, according to another embodiment of the invention.

FIG. 23A illustrates NFlash memory schematic 2300 with nanotube-type NAND sub-arrays 2310 and 2320. Each sub-array is formed using a series combination of NV NT switch-based cells formed using parallel circuit 2100 illustrated in FIG. 21. Four NV NT switch-based nonvolatile cells in series are shown in each of the sub-arrays 2310 and 2320. Sub-array 2310 includes NV NT switch SW1 and parallel FET TR1, NV NT switch SW2 and FET TR2, NV NT switch SW3 and FET TR3, and NV NT switch S4 and FET TR4. A first select FET TRS1 connects common node 2330 to bit line BL1 and a second select FET TRS2 connects common node 2340 to reference line REF. Sub-array 2320 includes NV NT switch SW5 and parallel FET TR5, NV NT switch SW6 and FET TR6, NV NT switch SW7 and FET TR7, and NV NT switch S8 and FET TR8. A first select FET TRS1X connects common node 2350 to bit line BL2 and a second select FET TRS2X connects common node 2360 to reference line REF. Select line SL1 is connected to the gates of FETs TRS1 and TRS1X, select line SL2 is connected to the gates of FETs TRS2 and TRS2X, word line WL1 is connected to the gates of FETs TR1 and TR5, word line WL2 is connected to the gates of FETs TR2 and TR6, word line WL3 is connected to the gates of FETs TR3 and TR7, and word line WL4 is connected to the gates of FETs TR4 and TR8 thereby forming NFlash memory schematic 2300. While NFlash memory schematic 2300 illustrates an 8 bit Flash memory, multiple resistance values may be stored on each NV NT switch to double, triple, etc. the number of bits stored to 16, 32, etc. Also, hundreds and even thousands of NV NT switch-based cells using parallel circuit 2100 may be formed with each cell able to store multiple resistance states and corresponding logic states.

Figure 23B:
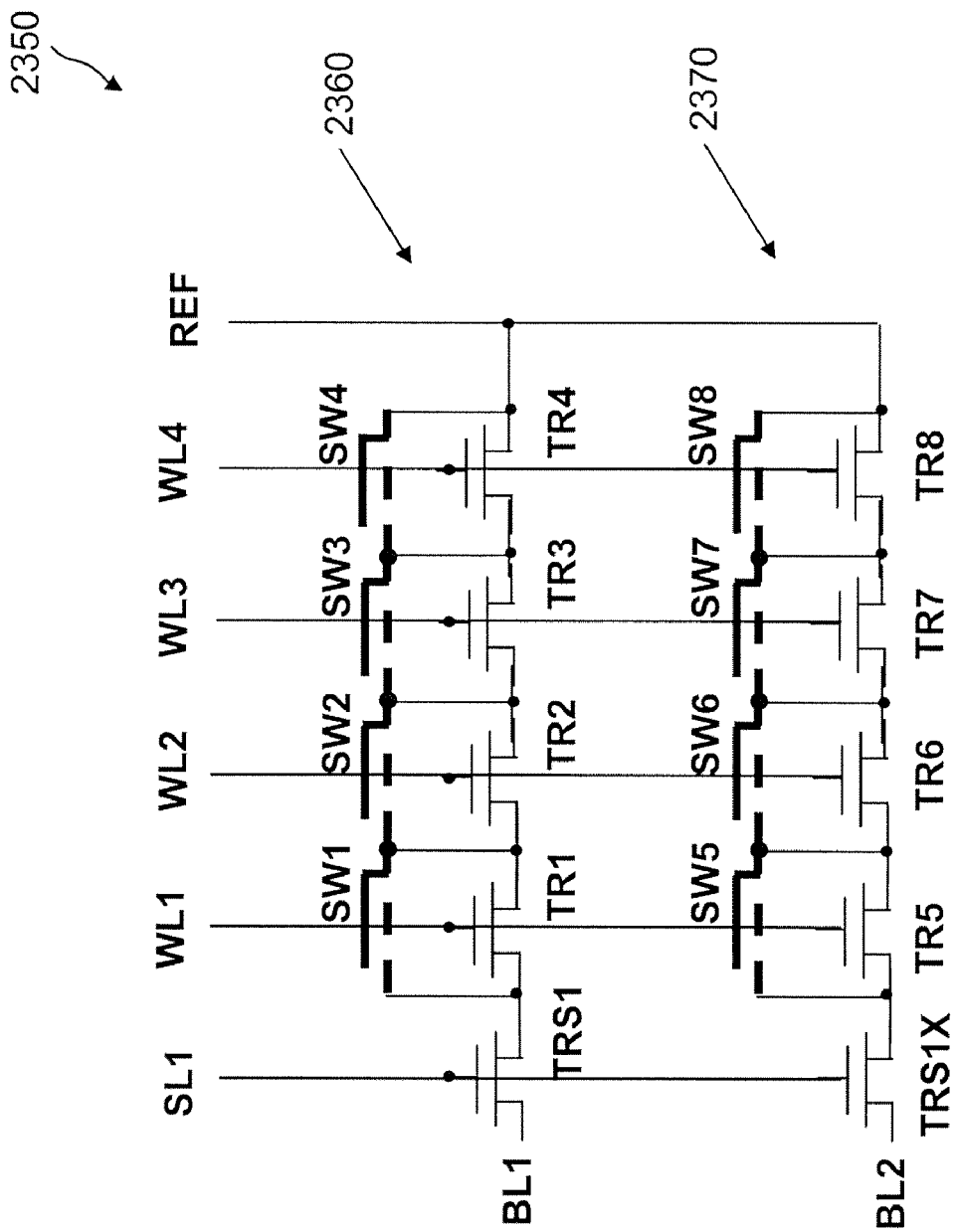
FIG. 23B illustrates a NFlash memory schematic, according to another embodiment of the invention.

Note that while NFlash memory schematic 2300 shows two select FETs in each NAND sub-array 2310 and 2320, one select FET is sufficient for NFlash memory operation. FIG. 23B illustrates NFlash memory schematic 2350 which is the same as NFlash memory schematic 2300 except that NAND sub-array 2360 uses only one select FET TRS1 and NAND sub-array 2370 uses only one select FET TRS1X. NFlash memories may be formed using NRAM memory schematic 2300 or 2350 or variations thereon.

In operation, any of the NV NT switch-based cells may be selected for read, erase, or program operation. By way of example referencing NFlash memory schematic 2300, if the state of representative switch SW3 is to be read, all series FET devices between bit line BL1 and reference line REF are turned ON except FET TR3 which remains in the OFF (unselected) state. Bit line BL1 is precharged to a voltage such as 1 volt. If SW3 is in the ON state, then BL1 is discharged. However, if SW3 is in the OFF state, then BL1 is not discharged. SW3 may be in various ON resistance states so multiple resistance states may be read. The read operation is similar to the read operation described further above with respect to multilevel NRAM memories that store multiple resistance states on each NV NT switch.

In operation, by way of example referencing NFlash memory schematic 2300, if the state of representative switch SW3 is to be programmed, all series FET devices between bit line BL1 and reference line REF are turned ON except FET TR3 which remains in the OFF (unselected) state. Bit line BL1 is pulsed at increasing voltage levels from 2.4 to 7 volts for example. If SW3 is in the OFF state and BL1 is pulsed then NV NT switch is programmed to one of a number of ON resistance $R_{ON}$ states so multiple resistance states may be stored on NV NT switch SW3. The program operation is similar to the program operation described further above with respect to multilevel NRAM memories that store multiple resistance states on each NV NT switch.

In operation, by way of example referencing NFlash memory schematic 2300, if the state of representative switch SW3 is to be erased, all series FET devices between bit line BL and reference line REF are turned ON except FET TR3 which remains in the OFF (unselected) state. Bit line BL1 is pulsed at increasing voltage levels as described further above with respect to NRAM memory arrays. If SW3 is in an ON state and BL1 is pulsed then NV NT switch is erase to a higher ON resistance $R_{ON}$ state value or to OFF state $R_{OFF}$. The erase operation is similar to the erase operation described further above with respect to multilevel NRAM memories that store multiple resistance states on each NV NT switch.

Figure 24:
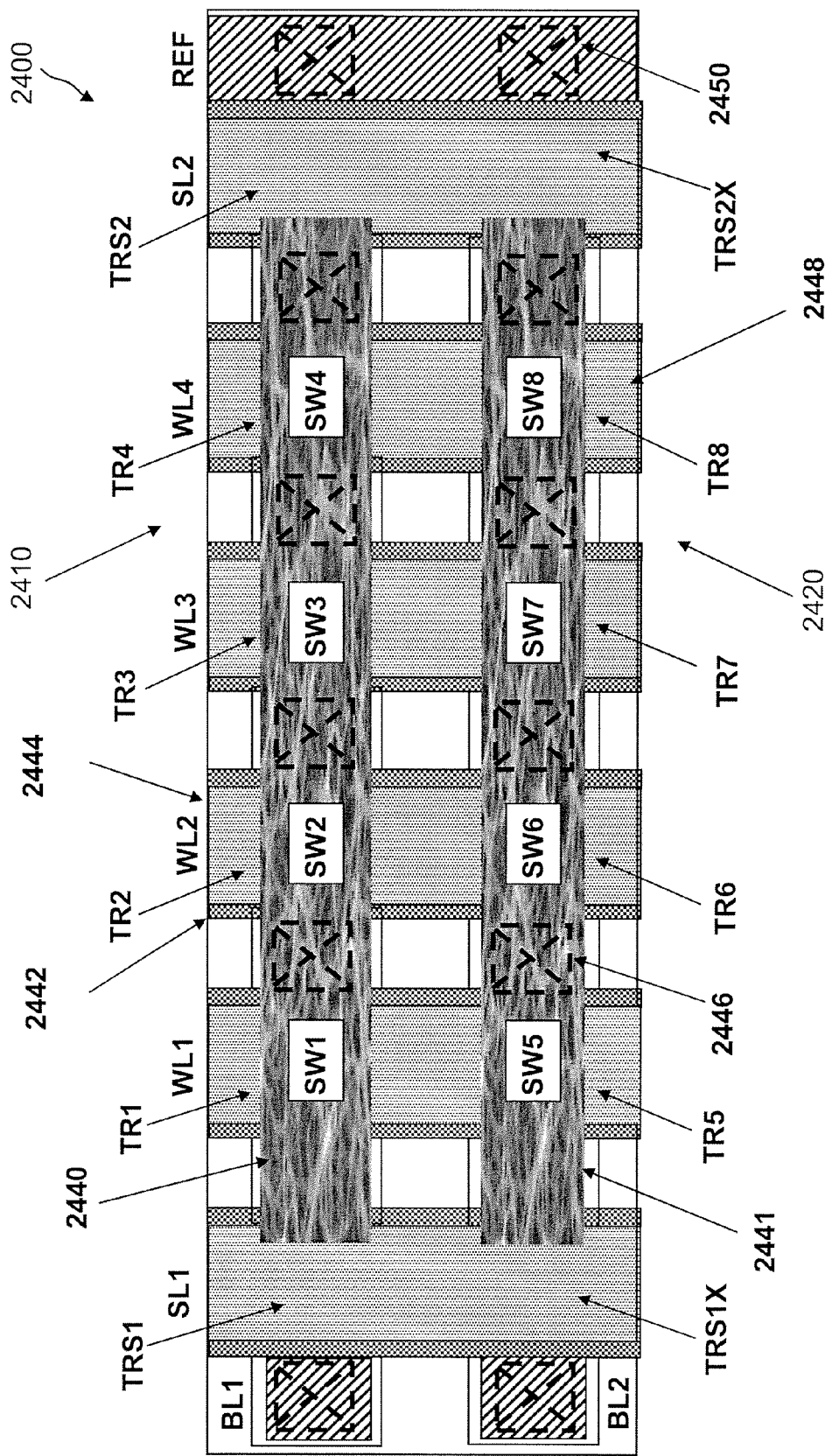
FIG. 24 illustrates a plan view corresponding to a NFlash memory, according to another embodiment of the invention.
Figure 25:
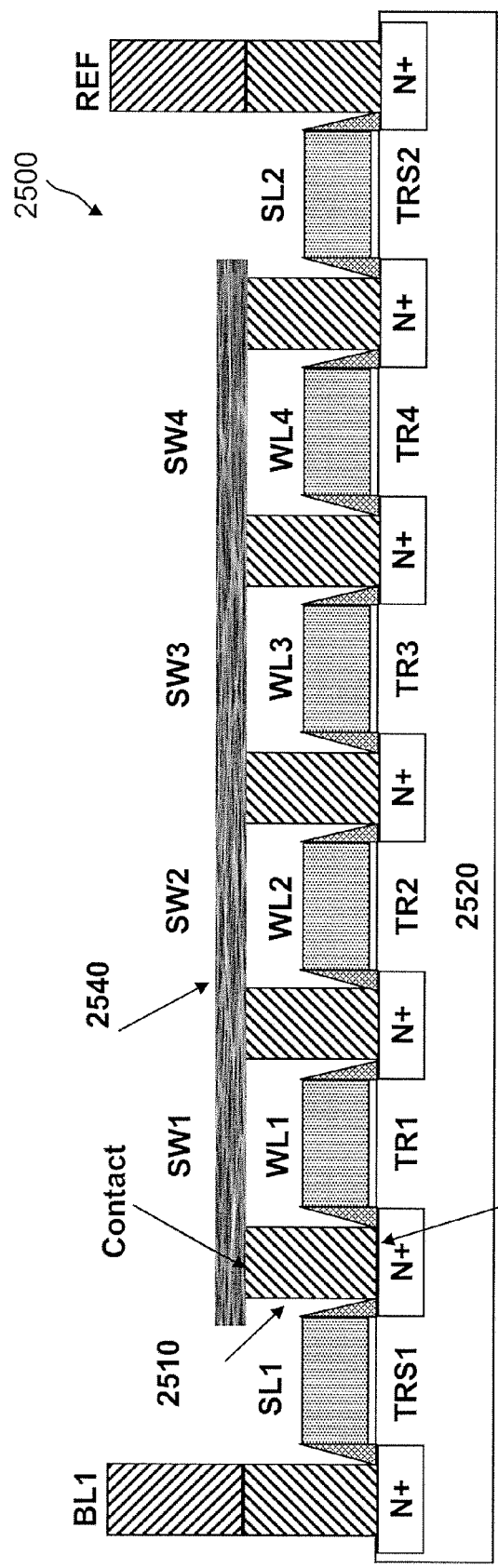
FIG. 25 illustrates a cross sectional view of a NAND sub-array, according to another embodiment of the invention.

FIG. 24 illustrates plan view 2400 corresponding to NFlash memory schematic 2300, with the plan view of NAND sub-array 2410 corresponding to the schematic representation of NAND sub-array 2310 and the plan view of NAND sub-array 2420 corresponding to the schematic representation of NAN sub-array 2320. FIG. 24 includes patterned nanofabric 1 2440, patterned nanofabric 2 2441, sidewall spacer 2442, polysilicon or metal WL and gate region 2444, contact 2446, polysillicon or metallic region 2448 and contact 2450. FIG. 25 illustrates cross section 2500 of NAND sub-array 2410. Patterned nanofabric 1 2540 and patterned nanofabric 2 2541 in combination with stud vias 2510 connect regions of each nanofabric to a corresponding FET diffusion and define NV NT switch length (width is defined by an etch operation). In certain embodiments the NAND subarray 2410 is disposed on a p substrate 2520. Various fabrication methods may be used to form NV NT switches above corresponding FETs.

By way of example, SW3 and TR3 in parallel form a representative NV NT switch-based cell that corresponds to parallel circuit 2100 illustrated in FIG. 21. A pair of stud vias 2510, shared by adjacent NV switch-based cells, define the NV NT switch length dimension and contact region for representative switch SW3 and form electrical connections to corresponding N+ diffusions of underlying FET TR3.

NFlash memories are erased, programmed, and read in operations that correspond to those of NRAM memories. Once all series transistors forming bit line-to-NV NT switch and NV NT switch-to-reference line paths are formed, and the FET in parallel with the selected NV NT switch is turned OFF, then erase, program, and read operations correspond to those used to program NV NT switches in NRAMs as described further above.

Nonvolatile Nanotube Programmable Impedance Networks Including Resistors and Capacitors Programmable nonvolatile multi-resistance state parallel circuit 2100 and programmable nonvolatile multi-resistance state series/parallel circuit 2200 illustrated in FIGS. 21 and 22, respectively, enable the formation of electronically controlled (tuned) analog networks of resistors and capacitors. Operationally, erasing, programming, and reading the state of individual NV NT switches used to form these electronically controlled (tuned) impedance networks are similar to those described further above with respect to FIGS. 23, 24, and 25 for NFlash memory operations.

FIG. 26A illustrates electronically controlled series resistance network 2600 in which nanotube series resistor network 2620 is programmed (or erased) using operations similar to those described further above with respect to NAND sub-array 2310 and NAND sub-array 2320 illustrated in FIG. 23A. Resistance values for NV NT switches SW1, SW2, SW3, and SW4 are set using program, erase, and read operational methods described further above with respect to FIG. 23 and controlled using resistor setting & operating mode controller 2610. During the NV NT switch resistance set operations, such as program and erase, FET TRS1A between terminal RT1 and common node 2630 is turned OFF so as not to disturb circuits that may be connected to terminal RT1. Similarly, FET TRS2A between terminal RT2 and common node 2640 is turned OFF so as not to disturb circuits that may be connected to terminal RT2. Next, FETs TRS1B and TRS2B are turned ON. FETs TRS1B and TRS2B correspond to FETs TRS1 and TRS2 in FIG. 23A, respectively. Resistor setting & operating mode controller 2610 then applied voltage pulses corresponding to bit line BL1 pulses and a reference line voltage REF described further above with respect to FIG. 23A operations. Individual NV NT switches, such as representative switch S3, are selected as described further above with respect to FIG. 23A operation. After the resistance state of each of NV NT switches SW1, SW2, SW3, and SW4 are set, then resistor setting & operating mode controller 2610 turns FETs TRS1B, TRS2B, TR1, TR2, TR3, and TR4 OFF and activates (turns-ON) FETs TRS1A and TRS1B electrically connecting terminals RT1 and RT2 to common nodes 2630 and 2640, respectively.

Electronically controlled series resistance network 2600 can be used to set nanotube series resistor equivalent circuit 2620 to optimize circuit function at the factory during or after fabrication, or in the field after shipment, or adjusted during the life of the electronic component. Also, function can be changes or modified at any time during the life-cycle of the electronic component.

FIG. 26B illustrates series resistor equivalent circuit 2650 comprising nanotube series resistor equivalent circuit 2620' corresponding to nanotube series resistor network 2620, and terminals 2630' and 2640' corresponding to common terminals 2630 and 2640, respectively. In operation, in this example, voltage across individual resistors should not exceed 2.5 volts to avoid program-disturb.

Figure 26:
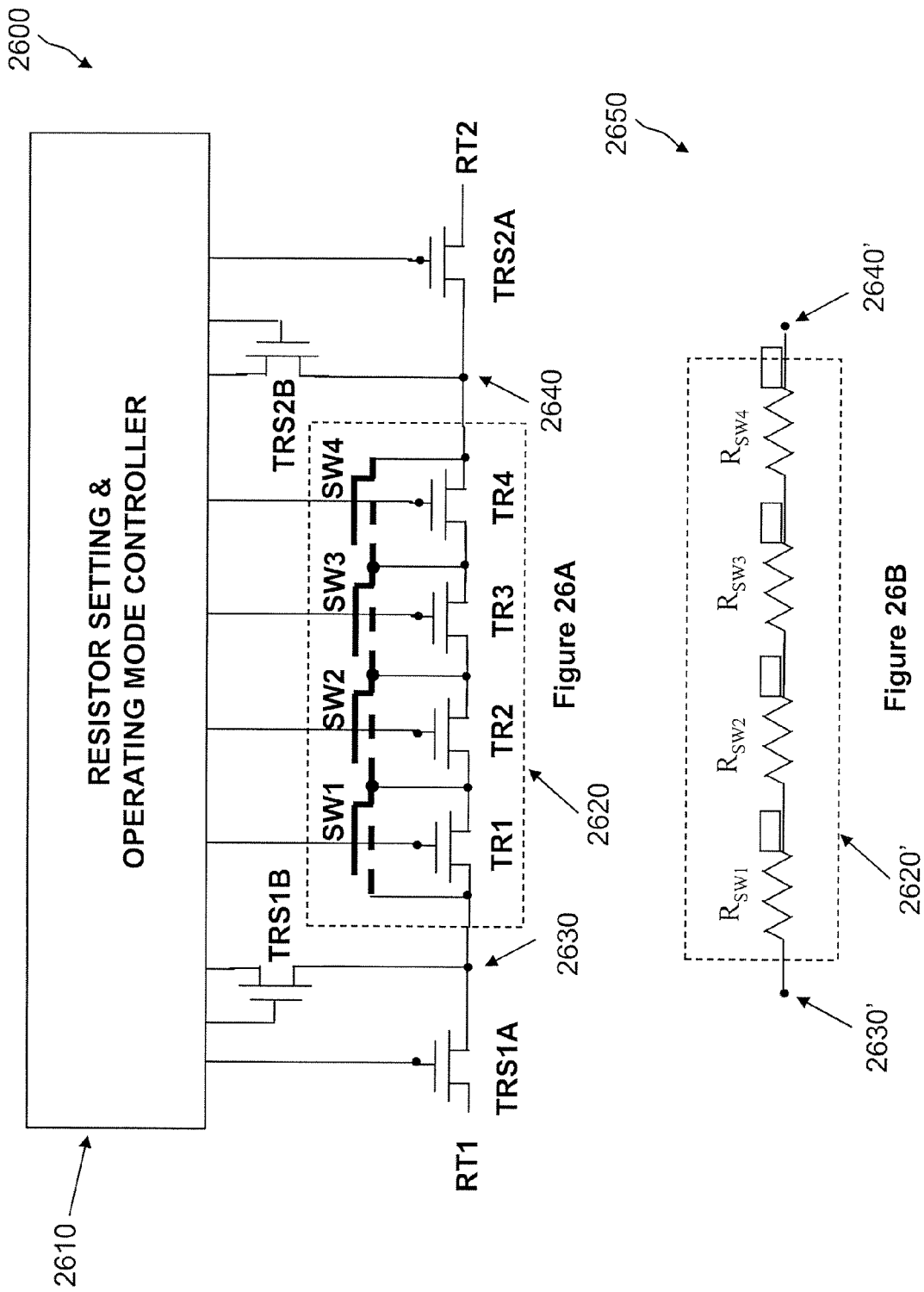
FIG. 26A illustrates an electronically controlled series resistance network in which a nanotube series resistor network is electronically formed and tuned using program or erase operations, according to another embodiment of the invention.
FIG. 26B illustrates a nanotube series resistor equivalent circuit, according to another embodiment of the invention.
Figure 27:
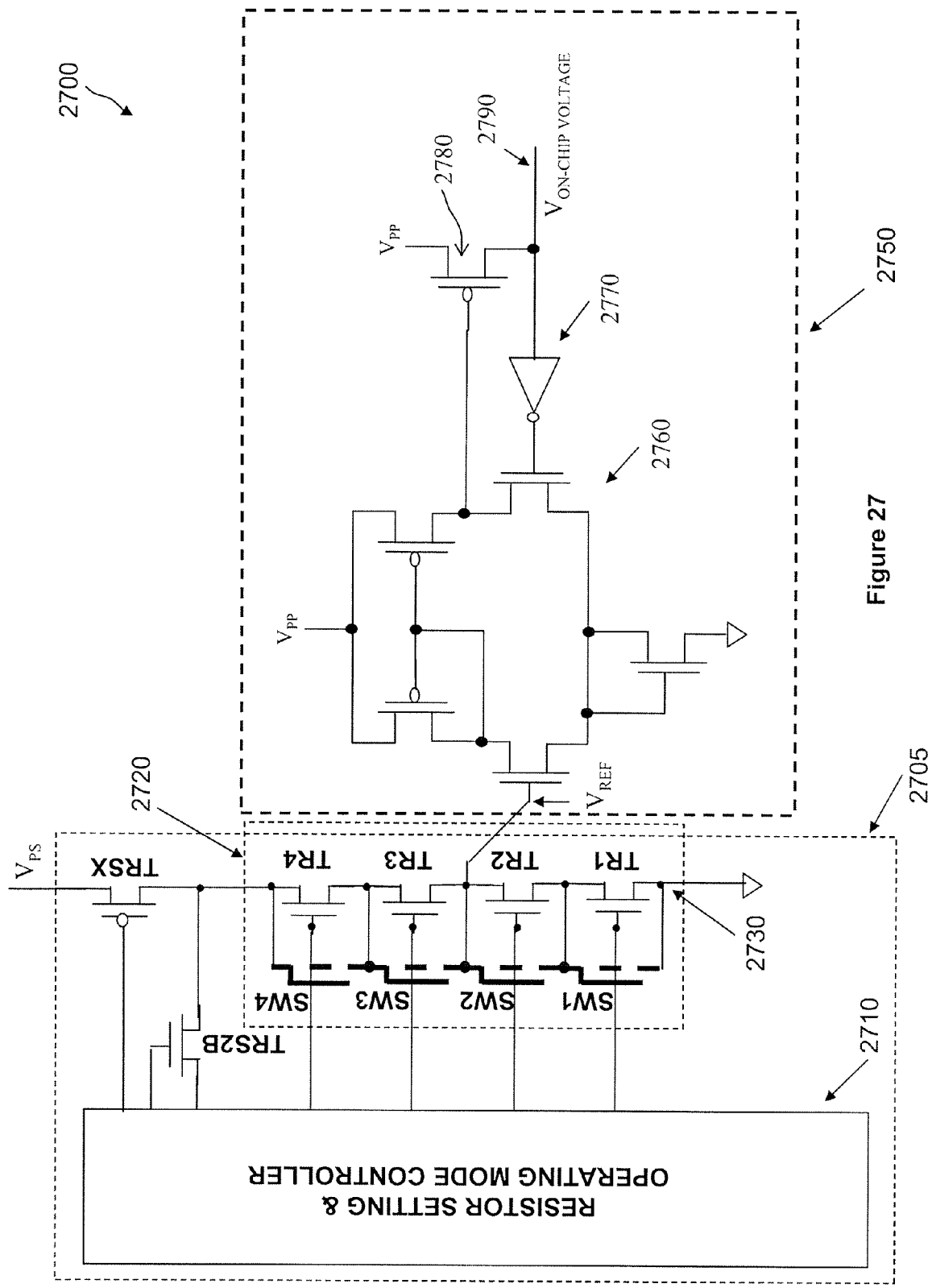
FIG. 27 illustrates a nanotube-based electronically tuned on-chip voltage regulator, according to another embodiment of the invention.

FIG. 27 is an illustration of nanotube-based electronically tuned on-chip voltage regulator 2700 formed using electronically controlled series resistance network 2705 to generate reference voltage $V_{REF}$ and on-chip voltage regulator 2750 to set and control $V_{ON\text{-}CHIP\ VOLTAGE}$ at node 2790 to be equal to $V_{REF}$. $V_{ON\text{-}CHIP\ VOLTAGE}$ is used as an on-chip power supply and distributed to multiple on-chip circuits. Output voltage $V_{REF}$ is generated by reducing power supply voltage $V_{PP}$ using a ratio of NV NT switch resistance values with $V_{REF} = [(R_{SW1}+R_{SW2})/(R_{SW1}+R_{SW2}+R_{SW3}+R_{SW4})]V_{PS}$ and can be adjusted over a wide range of voltages. Electronically tuned on-chip voltage regulator 2700 is similar in operation to electronically controlled series resistance network 2600 illustrated in FIG. 26A with nanotube series resistor network 2720 corresponding to nanotube series resistor network 2620 and common node 2730 corresponding to common node 2630. However, FET TRS1A and TRS1B have been eliminated; common node 2730 is connected directly to ground. Also, NFET TRS2A has been replaced by PFET TRSX to avoid a threshold voltage drop across the select transistor.

On-chip voltage regulator 2750 is similar to on-chip regulators in use in the semiconductor industry. Differential amplifier 2760 operation is described in the Baker et al. reference described further above. Large PFET 2780 controls the output voltage and current at node 2790, and feedback inverter 2770 provides the means for differential amplifier 2760 to control output voltage 2790 to be approximately equal to $V_{REF}$ as is well know in the industry.

FIG. 27 illustrates one reference voltage reference voltage VREF generated by nanotube series resistor network 2620. However, two additional reference voltages may be generated by also tapping shared nodes between FETs TR1 and TR2 and TR3 and TR4. Each of these two additional reference voltages may be coupled to other on-chip voltage regulators (not shown) similar to on-chip voltage regulator 2750 to generate a total of three different $V_{ON\text{-}CHIP\ VOLTAGE}$ values.

Figure 28A:
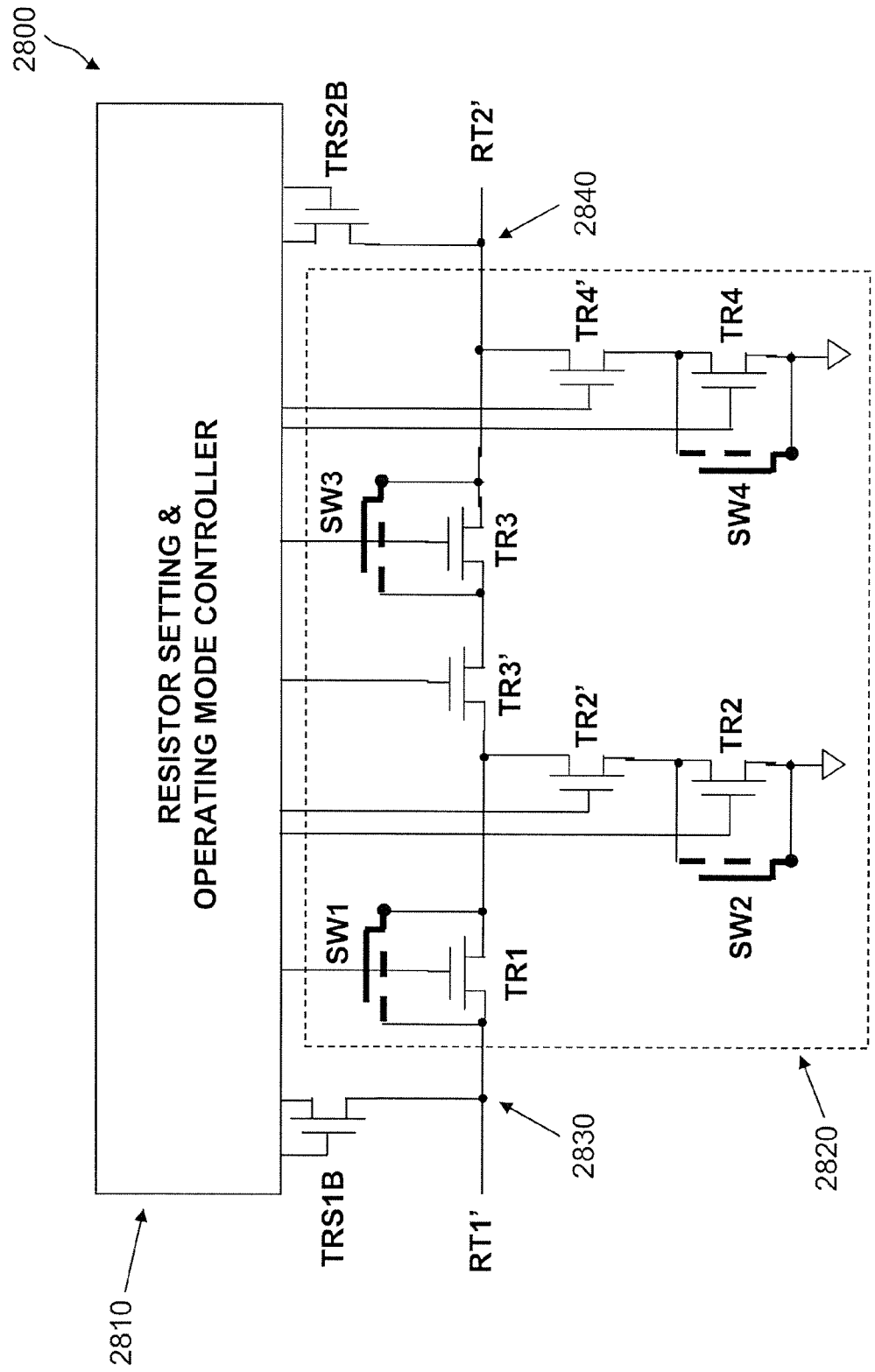
FIG. 28A illustrates an electronically formed and tuned combination series/parallel resistance network, according to another embodiment of the invention.

Electronically controlled series resistance network 2600 and its application to nanotube-based electronically tuned on-chip voltage regulator 2700, described above with respect to FIGS. 26 and 27, respectively, is one example of many useful analog networks based on multiple NV NT switches each having multi-resistance states. Other examples of networks based on multiple NV NT switches each having multi-resistance states are envisioned. FIG. 28A illustrates electronically controlled series/parallel resistance network 2800 formed by combinations of parallel circuit 2100 and series/parallel circuit 2200 illustrated in FIGS. 21 and 22, respectively. As illustrated in FIG. 28A, both series and parallel FETs are needed in a series/parallel networks to effectively isolate individual NV NT switches. Resistor setting & operating mode controller 2810 operates in a similar manner to resistor setting & operating mode controller 2610 except for additional outputs to turn series FETs ON and OFF during programming and erase operations. FETs TRS1B and TRS2B supply voltage pulses for erase, program, and read operations as described further above with respect to FIG. 26A. In this example, common node 2830 is coupled directly to terminal RT1' and common node 2840 is coupled directly to terminal RT2'. However, if other circuits may be impacted during programming, for example, then series decoupling FETs may be used, as illustrated in FIG. 26A.

Individual NV NT switches in nanotube series/parallel resistor network 2820 are erased, programmed, and read out using operating methods similar to those described further above with respect to FIG. 26A. By way of example, NV NT switch SW3 may be selected and tuned to one of numerous resistance states by turning FETs TR1, TR3' ON and FETs TR2', TR3, and TR4' OFF and applying voltage pulses between common nodes 2830 and 2840. By way of another example, NV NT switch SW2 may be selected and tuned to one of numerous resistance states by turning FETs TR1 and TR2' ON and TR2 and TR3' OFF and applying voltage pulses between common nodes 2830 and 2840. Voltage pulses used are similar to those described above with respect to FIGS. 26A, 23A, and 18.

After program or erase of individual switches is complete, then in operation, all series FETs are turned ON and all parallel FETs are turned OFF.

Figure 28B:
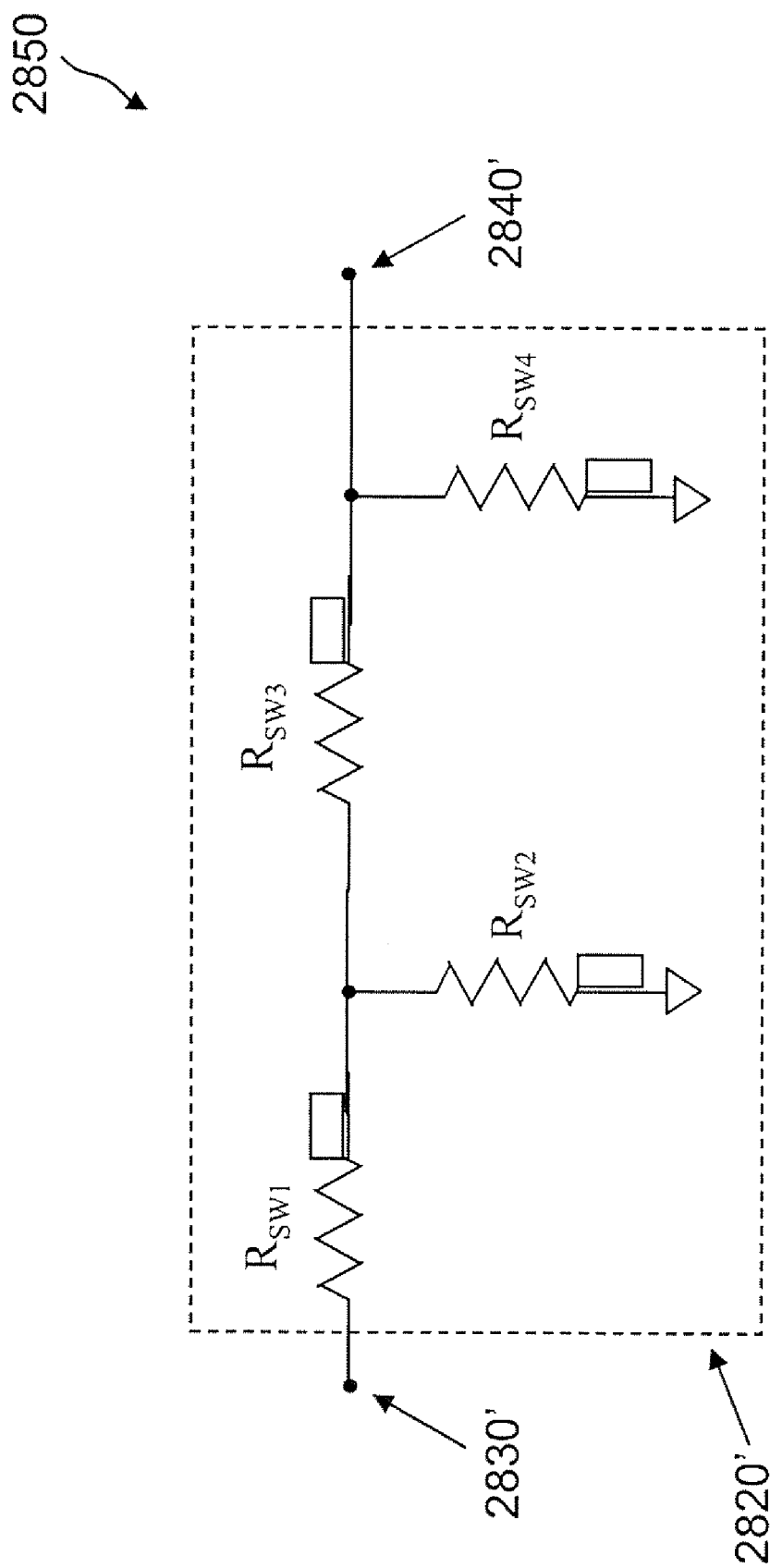
FIG. 28B illustrates a combination series/parallel resistor equivalent circuit, according to another embodiment of the invention.

FIG. 28B illustrates series/parallel resistor equivalent circuit 2850 comprising nanotube series/parallel resistor equivalent circuit 2820' corresponding to nanotube series/parallel resistor network 2820, and terminals 2830' and 2840' corresponding to common terminals 2830 and 2840, respectively. In operation, in this example, voltage across individual resistors should not exceed 2.5 volts to avoid program-disturb.

Electronically controlled series/parallel resistance network 2800 illustrated in FIG. 28A can be changed to electronically controlled resistance/capacitor network 2900 illustrated in FIG. 29A. As illustrated in FIG. 29A parallel circuit 2100 and series/parallel circuit 2200 illustrated in FIGS. 21 and 22, respectively, are used in series and capacitors are used in parallel. Resistor setting & operating mode controller 2910 operates in a similar manner to resistor setting & operating mode controller 2810. FETs TRS1B and TRS2B supply voltage pulses for erase, program, and read operations as described further above with respect to FIG. 28A. In this example, common node 2930 is coupled directly to terminal RCT1 and common node 2940 is coupled directly to terminal RCT2. However, if other circuits may be impacted during programming, for example, then series decoupling FETs may be used as illustrated in FIG. 26A.

Individual NV NT switches in nanotube series/parallel resistor/capacitor network 2920 are erased, programmed, and read out using operating methods similar to those described further above with respect to FIGS. 26A and 28A. By way of example, NV NT switch SW2 may be selected and tuned to one of numerous resistance states by turning FETs TR1 and TR2' ON and FET TR2 OFF and applying voltage pulses between common nodes 2830 and 2840. Voltage pulses used are similar to those described further above with respect to FIGS. 28A, 26A, 23A, and 18.

After program or erase of individual switches is complete, then in operation, all series FETs are turned ON and all parallel FETs are turned OFF.

FIG. 29B illustrates series/parallel resistor/capacitor equivalent circuit 2950 comprising nanotube series/parallel resistor/capacitor equivalent circuit 2920' corresponding to nanotube series/parallel resistor/capacitor network 2920, and terminals 2930' and 2940' corresponding to common terminals 2930 and 2940, respectively. In operation, in this example, voltage across individual resistors should not exceed 2.5 volts to avoid program-disturb.

Adjusting resistance values $R_{SW1}$ and $R_{SW2}$ results in tuning the RC time constant over a large range of values. Also, if RSW1 and RSW2 are programmed to be relatively low resistance values, then for waveforms with rise and fall times greater than the RC time constants, capacitors C1, C2, and C3 can appear a one capacitor C=C1+C2+C3. Other variations are possible.

Incorporated Patent References

The following commonly-owned patent references, referred to herein as "incorporated patent references," describe various techniques for creating nanotube elements (nanotube fabric articles and switches), e.g., creating and patterning nanotube fabrics, and are incorporated by reference in their entireties:

Electromechanical Memory Array Using Nanotube Ribbons and Method for Making Same (U.S. patent application Ser. No. 09/915,093, now U.S. Pat. No. 6,919,592), filed on Jul. 25, 2001;

Electromechanical Memory Having Cell Selection Circuitry Constructed With Nanotube Technology (U.S. patent application Ser. No. 09/915,173, now U.S. Pat. No. 6,643,165), filed on Jul. 25, 2001;

Hybrid Circuit Having Nanotube Electromechanical Memory (U.S. patent application Ser. No. 09/915,095, now U.S. Pat. No. 6,574,130), filed on Jul. 25, 2001;

Electromechanical Three-Trace Junction Devices (U.S. patent application Ser. No. 10/033,323, now U.S. Pat. No. 6,911,682), filed on Dec. 28, 2001;

Methods of Making Electromechanical Three-Trace Junction Devices (U.S. patent application Ser. No. 10/033,032, now U.S. Pat. No. 6,784,028), filed on Dec. 28, 2001;

Nanotube Films and Articles (U.S. patent application Ser. No. 10/128,118, now U.S. Pat. No. 6,706,402), filed on Apr. 23, 2002;

Methods of Nanotube Films and Articles (U.S. patent application Ser. No. 10/128,117, now U.S. Pat. No. 6,835,591), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Non-volatile Electromechanical Field Effect Devices and Circuits using Same and Methods of Forming Same (U.S. patent application Ser. No. 10/864,186, U.S. Patent Publication No. 2005/0062035), filed Jun. 9, 2004;

Devices Having Horizontally-Disposed Nanofabric Articles and Methods of Making the Same, (U.S. patent application Ser. No. 10/776,059, U.S. Patent Publication No. 2004/0181630), filed Feb. 11, 2004;

Devices Having Vertically-Disposed Nanofabric Articles and Methods of Making the Same (U.S. patent application Ser. No. 10/776,572, now U.S. Pat. No. 6,924,538), filed Feb. 11, 2004; and Patterned Nanoscopic Articles and Methods of Making the Same (U.S. patent application Ser. No. 10/936,119, U.S. Patent Publication No. 2005/0128788).

The invention may be embodied in other specific forms without departing from the spirit or essential characteristics thereof. The present embodiments are therefore to be considered in respects as illustrative and not restrictive.

We claim:

1. A non-volatile latch circuit comprising:
at least one input terminal capable of inputting a logic state;
an output terminal capable of outputting a logic state;
a volatile latch circuit including at least one semiconductive element in electrical communication with the at least one input terminal and the output terminal and capable of receiving and volatilely storing a logic state inputted to the at least one input terminal;
a two-terminal nanotube switching element comprising a nanotube fabric article and in electrical communication with the volatile latch circuit, wherein the nanotube switching element is capable of switching between a relatively low resistance state and a relatively high resistance state in response to electrical stimulus applied at the two terminals of the nanotube switching element, wherein the nanotube switching element is capable of nonvolatilely retaining the relatively low or the relatively high resistance state;
wherein when the nanotube switching element is in the relatively low resistance state, the volatile latch circuit retains a first logic state and outputs the first logic state at the output terminal and wherein when the nanotube switching element is in the relatively high resistance state, the volatile latch circuit retains a second logic state outputted at the output terminal.

2. The non-volatile latch circuit of claim 1, wherein the volatile latch circuit includes an inverter circuit comprising a plurality of field effect transistors.

3. The non-volatile latch circuit of claim 1, wherein the nanotube switching element is capable of switching between the relatively low resistance state and the relatively high resistance state multiple times.

4. The non-volatile latch circuit of claim 1, wherein the volatile latch circuit converts the relatively low resistance state of the nanotube switching element to a relatively high voltage level corresponding to the first logic state outputted at the output terminal and wherein the volatile latch circuit converts the relatively high resistance state of the nanotube switching element to a relatively low voltage level corresponding to the second logic state outputted at the output terminal.

5. The non-volatile latch circuit of claim 1, further in electrical communication with a memory cell, wherein when the non-volatile latch circuit outputs the first logic state the memory cell is active and wherein when the non-volatile latch circuit outputs the second logic state, the memory cell is inactive.

6. The non-volatile latch circuit of claim 5, wherein the non-volatile latch circuit comprises a redundancy circuit for the memory cell and is capable of bypassing the memory cell when the memory cell is inoperable.

7. The non-volatile latch circuit of claim 5, wherein bypassing the memory cell comprises correcting for an error.

8. The non-volatile latch circuit of claim 1, further in electrical communication with a memory cell capable of storing first and second memory states, wherein the first memory state is inputted to the input terminal as a first logic state and is non-volatilely retained and outputted by the non-volatile latch circuit as the first logic state and wherein the second memory state is inputted to the input terminal as a second logic state and is non-volatilely retained and outputted by the non-volatile latch circuit as a second logic state.

9. The non-volatile latch circuit of claim 8, wherein the non-volatile latch circuit comprises a redundancy circuit for the memory cell and is capable of non-volatilely retaining the first and the second logic state corresponding, respectively, to the first and the second memory state.

10. The non-volatile latch circuit of claim 9, wherein non-volatilely retaining one of the first and the second logic states comprises correcting for an error in the memory cell.

11. The non-volatile latch circuit of claim 8, wherein the memory cell comprises a cell in an NRAM array.

12. The non-volatile latch circuit of claim 1, further in electrical communication with a memory circuit, wherein the electrical stimulus inputted at the input terminal comprises a time-varying electrical stimulus, wherein the electrical stimulus outputted at the output terminal comprises a time-varying electrical stimulus and wherein the non-volatile latch circuit controls operation of the memory circuit by creating a controllable delay between the time-varying electrical stimulus at the input terminal and at the output terminal.

13. The non-volatile latch circuit of claim 12, wherein creating a controllable delay further comprises providing a substantially bi-modal signal with a substantially selected rise time and a substantially selected fall time.

14. The non-volatile latch circuit of claim 1, wherein the nanotube switching element comprises a one-time programmable fuse capable of switching from only the relatively low resistance state to the relatively high resistance state.

15. The non-volatile latch circuit of claim 14, wherein the one-time programmable fuse further comprises an insulator material disposed over the nanotube fabric article.

16. The non-volatile latch circuit of claim 15, wherein the nanotube fabric article is exposed in a portion defined by an opening in the insulator material and wherein the one-time programmable fuse is capable of switching from the relatively low resistance state to the relatively high resistance state by laser ablation.

17. The non-volatile latch circuit of claim 1, wherein the nanotube switching element comprises a one-time programmable anti-fuse capable of switching from an off state to an on state.

18. A non-volatile register file configuration circuit for configuring a plurality of non-volatile register files comprising:
an input voltage terminal;
selection circuitry;
a plurality of nanotube fuse elements in electrical communication with the input voltage terminal, each nanotube fuse element for electrical communication with one of the plurality of non-volatile register files, each nanotube fuse element in electrical communication with the selection circuitry;
wherein each of the nanotube fuse elements comprises:
a nanotube fabric article and two conductive contacts, the nanotube fabric article disposed between and in electrical communication with the two conductive contacts;
wherein the nanotube fuse element is capable of switching from an on state to an off state, the on state corresponding to a relatively low resistance between two conductive contacts and the off state corresponding to a relatively low resistance between the two conductive contacts in response to electrical stimulus;
wherein when in the on state the nanotube fuse element is configured for activating the corresponding non-volatile register file and for enabling the corresponding nonvolatile register file to be responsive to electrical stimulus at the input voltage terminal and wherein when in the off state the nanotube fuse element is configured for disabling the corresponding non-volatile register file and for disabling the corresponding non-volatile register file to be responsive to electrical stimulus at the input voltage terminal;
wherein the selection circuitry is configured to apply electrical stimulus to each of the selected nanotube fuse elements to selectively bypass the corresponding register file.

19. A non-volatile register file configuration circuit of claim 18, wherein the selection circuit selectively bypasses one of the plurality of register files in response to said register file being defective.

20. A non-volatile register file configuration circuit of claim 18, wherein when one of the plurality of nanotube fuse elements is in the on state, the corresponding non-volatile register file is capable of operating with a plurality of informational states in response to electrical stimuli at the input voltage terminal.

21. The non-volatile register file configuration circuit of claim 18, wherein the nanotube fuse element is one-time programmable.

22. The non-volatile register file configuration circuit of claim 18, wherein the nanotube fuse element is further capable of switching from the off state to the on state.

* * * * *